US012592714B2

(12) United States Patent
Kanemura et al.

(10) Patent No.: US 12,592,714 B2
(45) Date of Patent: Mar. 31, 2026

(54) APPARATUS COMPRISING ANALOG TO DIGITAL CONVERTER SEMICONDUCTOR DEVICE

(71) Applicant: Semiconductor Energy Laboratory Co., Ltd., Kanagawa-ken (JP)

(72) Inventors: Takuro Kanemura, Hokkai-do (JP); Yoshiyuki Kurokawa, Kanagawa (JP); Hiromichi Godo, Kanagawa (JP); Kazuki Tsuda, Kanagawa (JP); Satoru Ohshita, Hyogo (JP); Hidefumi Rikimaru, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 288 days.

(21) Appl. No.: 18/018,965

(22) PCT Filed: Jul. 26, 2021

(86) PCT No.: PCT/IB2021/056695
§ 371 (c)(1),
(2) Date: Jan. 31, 2023

(87) PCT Pub. No.: WO2022/029542
PCT Pub. Date: Feb. 10, 2022

(65) Prior Publication Data
US 2023/0353163 A1     Nov. 2, 2023

(30) Foreign Application Priority Data

Aug. 3, 2020   (JP) ................................. 2020-131717
Dec. 29, 2020   (JP) ................................. 2020-219739
(Continued)

(51) Int. Cl.
*H03M 1/46*        (2006.01)
*G09G 3/3233*      (2016.01)
(Continued)

(52) U.S. Cl.
CPC ............ *H03M 1/46* (2013.01); *G09G 3/3233* (2013.01); *G09G 2300/0842* (2013.01);
(Continued)

(58) Field of Classification Search
CPC .................. H03M 1/46; G09G 3/3233; G09G 2300/0842; H10D 86/471; H10D 86/60; H10D 86/481
See application file for complete search history.

(56) References Cited

U.S. PATENT DOCUMENTS 4,310,830 A      1/1982  Babini et al.
5,369,407 A  *  11/1994  Yung ..................... H03M 1/008
                                                        341/172
(Continued)

FOREIGN PATENT DOCUMENTS

DE       29 36 301  A1      3/1980
EP       3 503 407  A1      6/2019
(Continued)

OTHER PUBLICATIONS

International Search Report (Application No. PCT/IB2021/056695) Dated Oct. 26, 2021.
(Continued)

*Primary Examiner* — Nathan P Brittingham
(74) *Attorney, Agent, or Firm* — Husch Blackwell LLP

(57)             ABSTRACT

A novel semiconductor device is provided. An analog signal is converted into a digital signal using a comparison portion comparing two current values, a control portion, and a current output digital-analog conversion portion. The control portion has a function of generating a sign bit showing a magnitude relation between the two current values, a function of converting a difference between the two current values into a digital signal by successive approximation, and a function of outputting the sign bit and the digital signal.

16 Claims, 28 Drawing Sheets

(30) Foreign Application Priority Data

| | | |
|---|---|---|
| Feb. 5, 2021 | (JP) | 2021-017033 |
| Jun. 7, 2021 | (JP) | 2021-095086 |

(51) Int. Cl.

| | |
|---|---|
| H10D 86/40 | (2025.01) |
| H10D 86/60 | (2025.01) |

(52) U.S. Cl.

CPC ......... *H10D 86/471* (2025.01); *H10D 86/481* (2025.01); *H10D 86/60* (2025.01)

(56) References Cited

U.S. PATENT DOCUMENTS

| | | | | |
|---|---|---|---|---|
| 10,141,342 | B2 | 11/2018 | Takahashi | |
| 10,521,032 | B2 | 12/2019 | Takahashi et al. | |
| 10,630,304 | B1 * | 4/2020 | Trivedi | H03M 1/662 |
| 10,886,937 | B1 * | 1/2021 | Bandyopadhyay | H03M 3/464 |
| 11,018,682 | B1 * | 5/2021 | Gupta | H03M 1/1215 |
| 11,307,687 | B2 | 4/2022 | Takahashi et al. | |
| 2002/0027688 | A1 * | 3/2002 | Stephenson | H04B 10/07955 398/139 |
| 2018/0137819 | A1 * | 5/2018 | An | G09G 3/3233 |
| 2018/0183458 | A1 * | 6/2018 | Lee | H03M 1/447 |
| 2019/0190531 | A1 | 6/2019 | Martens et al. | |
| 2019/0207615 | A1 * | 7/2019 | Mitikiri | H03M 1/0881 |
| 2020/0136630 | A1 * | 4/2020 | Wang | H04N 25/673 |
| 2022/0236824 | A1 | 7/2022 | Takahashi et al. | |

FOREIGN PATENT DOCUMENTS

| | | | |
|---|---|---|---|
| GB | 2 036 481 | A | 6/1980 |
| JP | 59-020202 | B2 | 5/1984 |
| JP | 2016-072975 | A | 5/2016 |
| JP | 2016-109660 | A | 6/2016 |
| JP | 2019-186842 | A | 10/2019 |
| JP | 7713944 | | 7/2025 |

OTHER PUBLICATIONS

Written Opinion (Application No. PCT/IB2021/056695) Dated Oct. 26, 2021.

Mahmoodi, M. et al., "An Ultra-Low Energy Internally Analog, Externally Digital Vector-Matrix Multiplier Based on NOR Flash Memory Technology," DAC 2018 (55th ACM/ESDA/IEEE Design Automation Conference), Jun. 24, 2018, p. 6 pages.

Takahashi, K. et al., "13.3-inch 8k4k 664-ppi Foldable OLED Display Using Crystalline Oxide Semiconductor FETs," SID Digest '15: SID International Symposium Digest of Technical Papers, Jun. 2, 2015, pp. 250-253.

Mallik, A., "Analog Computing for Machine Learning—An Ideal Case for Co-Optimization of System and Device Technology," 2020 Symposia on VLSI Technology and Circuits, Jun. 15, 2020, p. 40 pages.

* cited by examiner

110

112

M11a   M11b     113     M11d   M11c

M12b     M12d

M12a     M12c 111a     111b

M13a   M13b

114

M14a   M14b

D   INVa     INVb   DB

115     M15a   M15b     116

M17a   M16a     M16b   M17b

117

Tw

113 ⎯⎯⎯ Sig1

114 ⎯⎯⎯ Sig2

115,116 ⎯⎯⎯ Sig3

FIG. 8A
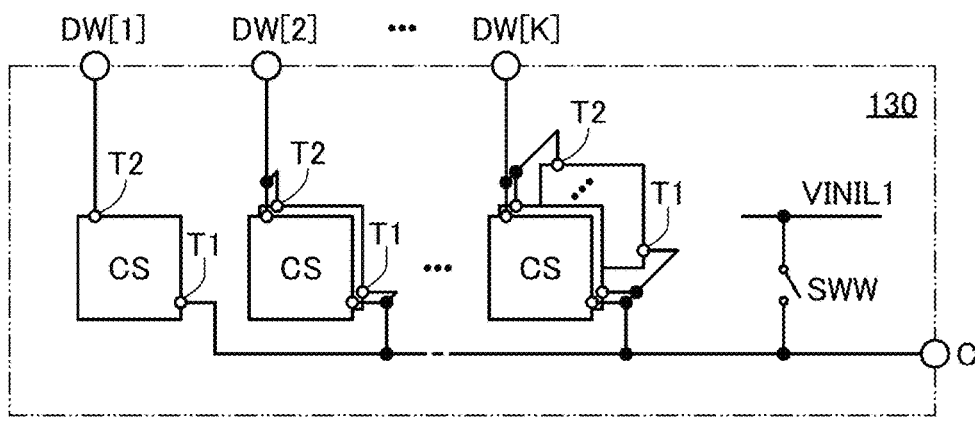
FIG. 8B
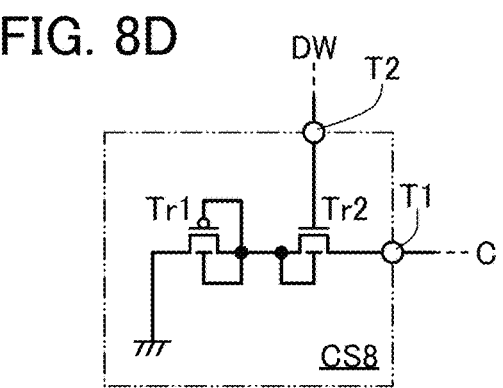
FIG. 8C
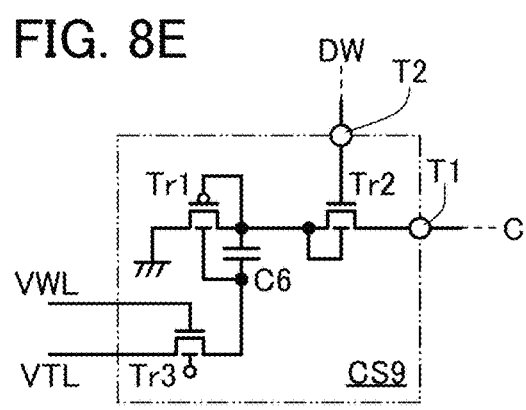
FIG. 8D
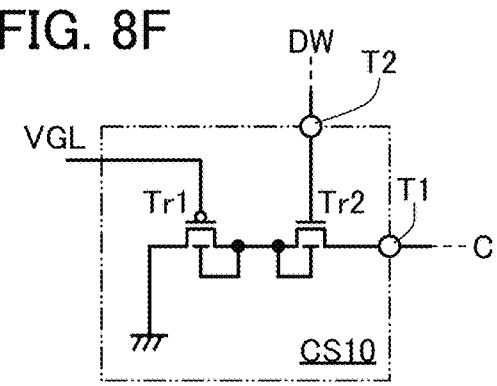
FIG. 8E
FIG. 8F

310

ILD

IL[1]  ILB[1]  IL[ j]  ILB[ j]  IL[n]  ILB[n]

WLS[1]                                    XLS[1]

MP[1,1]      · · ·   · · ·   · · ·      MP[1,n]      $z_1^{(k-1)}$

WLS[i]                                    XLS[i]

MP[i, j]

WLS[m]                                    XLS[m]

MP[m,1]      · · ·   · · ·   · · ·      MP[m,n]      $z_m^{(k-1)}$ $z_i^{(k-1)}$

WLD                                       ALP        XLD

OL[1]        OL[ j]        OL[n]
OLB[1]       OLB[ j]       OLB[n]

ACTF[1]   · · ·   ACTF[ j]   · · ·   ACTF[n]        AFP $z_1^{(k)}$        $z_j^{(k)}$        $z_n^{(k)}$

X1L[i]
X2L[i]

WL[i]

MP[i, j]

HC        HCr

MC        MCr

VE[ j]     IL[ j]   OL[ j]   OLB[ j]   ILB[ j]     VEr[ j]

$I_{TEST}$                                CMOUT[0:7]

SEL[1]

M1[1]    100[1]      262

$I_{MON}$ [1]

OUT_1[0:7]

SP

SEL[2]

SCLK

M1[2]    100[2]            SR $I_{MON}$ [2]

OUT_2[0:7]

SEL[N~1]

M1[N−1]    100[N−1]

$I_{MON}$[N−1]

OUT_N−1 [0:7]

SEL[N]

M1[N]    100[N]

$I_{MON}$ [N]

OUT_N[0:7]

224

FIG. 24A
Intermediate state
New crystalline phase
| Amorphous | Crystalline | Crystal |
|---|---|---|
| •completely amorphous | •CAAC <br> •nc <br> •CAC <br><br> excluding single crystal and poly crystal | •single crystal <br> •poly crystal |
FIG. 24B
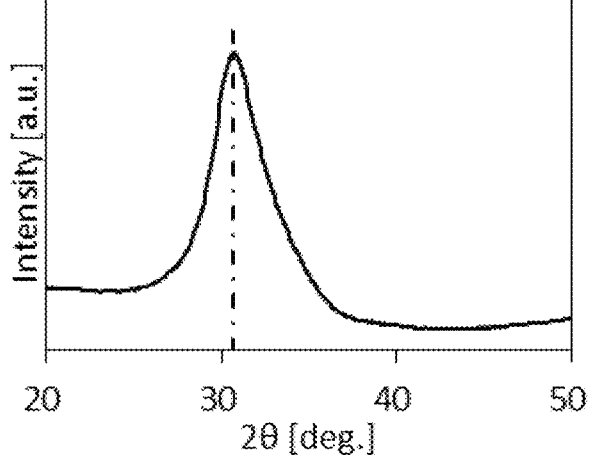
Intensity [a.u.]
20    30    40    50
2θ [deg.]
FIG. 24C
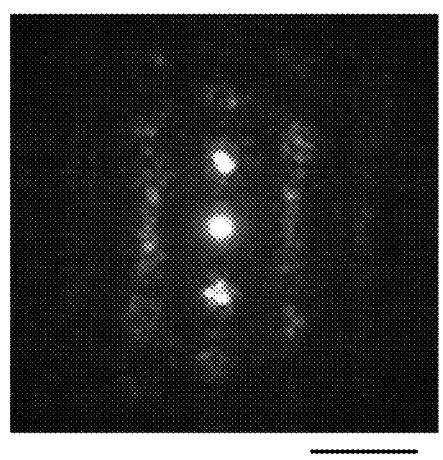
5nm⁻¹

(ST71) Completion of element substrate (ST72) Dicing (ST73) Die bonding (ST74) Wire bonding (ST75) Mold (ST76) Lead plating and processing (ST77) Marking (ST78) Inspection (ST79) Completion 7100    7102

7106    7104

7102

7104

7106

7106

7110

7104   7102

7004

7002

7110

7000

7001

APPARATUS COMPRISING ANALOG TO DIGITAL CONVERTER SEMICONDUCTOR DEVICE

This application is a 371 of international application PCT/IB2021/056695 filed on Jul. 26, 2021 which is incorporated herein by reference.

TECHNICAL FIELD

One embodiment of the present invention relates to a semiconductor device.

Note that one embodiment of the present invention is not limited to the above technical field. The technical field of the invention disclosed in this specification and the like relates to an object, a method, or a manufacturing method. One embodiment of the present invention relates to a process, a machine, manufacture, or a composition of matter.

Specific examples of the technical field of one embodiment of the present invention disclosed in this specification include a semiconductor device, a display apparatus, a liquid crystal display apparatus, a light-emitting apparatus, a power storage device, an imaging device, a memory device, a signal processing device, a processor, an electronic device, a system, a driving method thereof, a manufacturing method thereof, or a testing method thereof.

In this specification and the like, a semiconductor device generally means a device that can function by utilizing semiconductor characteristics. Thus, a semiconductor element such as a transistor or a diode and a circuit including a semiconductor element are semiconductor devices. A display apparatus, a light-emitting apparatus, a lighting device, an electro-optical device, a communication device, an electronic device, and the like may include a semiconductor element or a semiconductor circuit. Thus, a display apparatus, a light-emitting apparatus, a lighting device, an electro-optical device, an imaging device, a communication device, an electronic device, and the like are referred to as a semiconductor device in some cases.

BACKGROUND ART

An AD (Analog to Digital) converter that converts an analog signal into a digital signal is known. AD converters having a variety of converting methods, such as a delta-sigma type, a pipeline type, a flash type, and a successive approximation (SA) type, have been developed.

A successive approximation AD converter is capable of a resolution of 16 bits and has low power consumption and thus is used in an application having a sampling frequency less than or equal to 10 MHz in many cases. The successive approximation AD converter includes a comparison portion (comparator), a DA (Digital to Analog) conversion portion, and a successive approximation register (SAR). Patent Document 1 describes an AD converter that converts a potential difference between two analog signals into a digital signal.

REFERENCE

Patent Document

[Patent Document 1] Japanese Published Patent Application No. 2019-186842

SUMMARY OF THE INVENTION

Problems to be Solved by the Invention

The AD converter described in Patent Document 1 includes a capacitor array DA conversion portion; thus, a significant increase in occupation area is inevitable to increase resolution. In addition, in the case where an input signal is an analog current, a circuit that converts a current signal into a voltage signal needs to be added.

An object of one embodiment of the present invention is to provide a semiconductor device that occupies a small area. Another object of one embodiment of the present invention is to provide a semiconductor device with reduced power consumption. Another object of one embodiment of the present invention is to provide a semiconductor device with improved operation speed. Another object is to provide a novel semiconductor device.

Note that the objects of one embodiment of the present invention are not limited to the objects listed above. The objects listed above do not preclude the existence of other objects. Note that the other objects are objects that are not described in this section and will be described below. The objects that are not described in this section will be derived from the description of the specification, the drawings, and the like and can be extracted as appropriate from the description by those skilled in the art. Note that one embodiment of the present invention achieves at least one of the objects listed above and the other objects. Note that one embodiment of the present invention does not necessarily achieve all the objects listed above and the other objects.

Means for Solving the Problems

One embodiment of the present invention is a semiconductor device including a comparison portion comparing a current value of a first signal with a current value of a second signal, a first digital-analog conversion portion, a second digital-analog conversion portion, and a control portion; the comparison portion has a function of comparing the first signal with the second signal and generating an output signal; the control portion has a function of generating a sign bit in accordance with the output signal, a function of generating a digital signal, and a function of outputting the sign bit and the digital signal; the first digital-analog conversion portion has a function of adding a current with a current value in accordance with the digital signal to the first signal; and the second digital-analog conversion portion has a function of adding a current with the current value in accordance with the digital signal to the second signal.

A sign bit is determined in accordance with the magnitude relation between the first signal and the second signal. For example, in the case where the current value of the first signal is greater than the current value of the second signal, the sign bit is "0"; in the other case, the sign bit is "1". The digital signal generated by the control portion is determined in accordance with a differential current between the first signal and the second signal. The digital signal is a digital value with greater than or equal to eight bits and less than or equal to 16 bits, for example.

The comparison portion functions as a current comparison comparator. The semiconductor device of one embodiment of the present invention functions as a successive approximation AD converter. Furthermore, the semiconductor device of one embodiment of the present invention can function as a ReLu function.

Effect of the Invention

One embodiment of the present invention can provide a semiconductor device that occupies a small area. Alternatively, a semiconductor device with reduced power consumption can be provided. Alternatively, a semiconductor device with improved operation speed can be provided. Alternatively, a novel semiconductor device can be provided.

Note that the effects of one embodiment of the present invention are not limited to the effects listed above. The effects listed above do not preclude the existence of other effects. Note that the other effects are effects that are not described in this section and will be described below. The effects that are not described in this section will be derived from the description of the specification, the drawings, and the like and can be extracted as appropriate from the description by those skilled in the art. Note that one embodiment of the present invention has at least one of the effects listed above and the other effects. Accordingly, one embodiment of the present invention does not have the effects listed above in some cases.

BRIEF DESCRIPTION OF THE DRAWINGS

FIG. 8A is a diagram illustrating a DA conversion portion. FIG. 8B to FIG. 8F are diagrams illustrating circuits included in a DA conversion portion.

FIG. 24A is a diagram showing classifications of crystal structures, FIG. 24B is a diagram showing an XRD spectrum of crystalline IGZO, and FIG. 24C is a diagram showing a nanobeam electron diffraction pattern of the crystalline IGZO.

MODE FOR CARRYING OUT THE INVENTION

Figure 1:
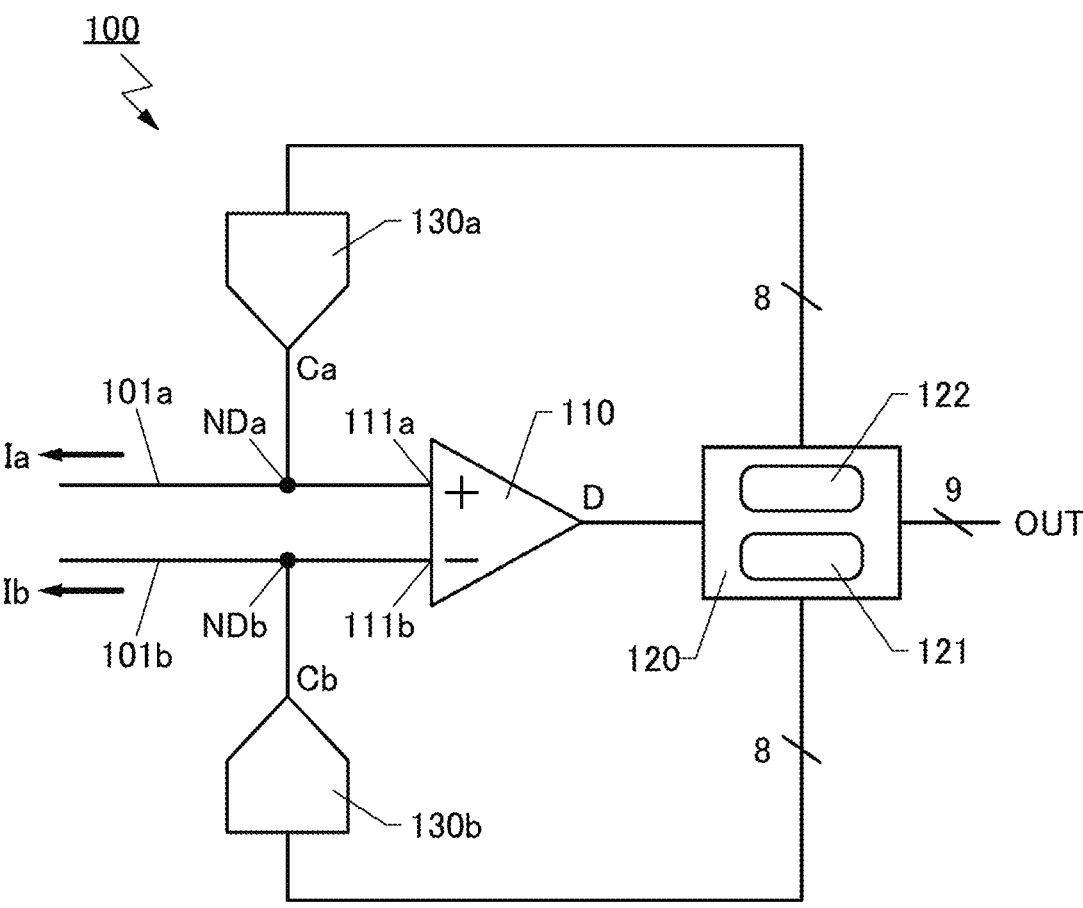
FIG. 1 is a diagram illustrating an AD converter.

Embodiments of the present invention will be described in detail with reference to the drawings. However, the present invention is not limited to the following description, and it is readily appreciated by those skilled in the art that modes and details can be modified in various ways without departing from the spirit and the scope of the present invention. Therefore, the present invention should not be construed as being limited to the description in the following embodiments. Note that in the structures of the invention described below, the same portions or portions having similar functions are denoted by the same reference numerals in different drawings, and description thereof is not repeated.

The position, size, range, and the like of each component illustrated in the drawings and the like are not accurately represented in some cases to facilitate understanding of the invention. Therefore, the disclosed invention is not necessarily limited to the position, size, range, or the like disclosed in the drawings and the like. For example, in the actual manufacturing process, a resist mask or the like might be unintentionally reduced in size by treatment such as etching, which is not illustrated in some cases for easy understanding.

In drawings and the like, some components might be omitted for easy understanding of the explanation.

In this specification and the like, the terms "electrode" and "wiring" do not functionally limit these components. For example, an "electrode" is used as part of a "wiring" in some cases, and vice versa. Furthermore, the term "electrode" or "wiring" also includes the case where a plurality of "electrodes" or "wirings" are formed in an integrated manner, for example.

In this specification and the like, a "terminal" in an electric circuit refers to a portion that inputs or outputs a current, inputs or outputs a voltage, or receives or transmits a signal. Accordingly, part of a wiring or an electrode functions as a terminal in some cases.

Note that the term "over" or "under" in this specification and the like does not necessarily mean that a component is placed directly over and in contact with or directly under and in contact with another component. For example, the expression "electrode B over insulating layer A" does not necessarily mean that the electrode B is formed over and in direct contact with the insulating layer A, and does not exclude the case where another component is provided between the insulating layer A and the electrode B.

In this specification and the like, the expression "electrically connected" includes the case where components are directly connected to each other and the case where components are connected through an "object having any electric function". There is no particular limitation on the "object having any electric function" as long as electric signals can be transmitted and received between components that are connected through the object. Thus, even when the expression "electrically connected" is used, there is a case where no physical connection is made and a wiring just extends in an actual circuit.

In this specification and the like, "parallel" indicates a state where two straight lines are placed at an angle of greater than or equal to −10° and less than or equal to 10°, for example. Accordingly, the case where the angle is greater than or equal to −5° and less than or equal to 5° is also included. Moreover, "perpendicular" and "orthogonal" indicate a state where two straight lines are placed at an angle of greater than or equal to 80° and less than or equal to 100°, for example. Accordingly, the case where the angle is greater than or equal to 85° and less than or equal to 95° is also included.

In this specification and the like, the terms "identical", "same", "equal", "uniform", and the like used in describing calculation values and measurement values or in describing objects, methods, events, and the like that can be converted into calculation values or measurement values allow for a margin of error of ±20% unless otherwise specified.

The term "adjacent" or "proximity" in this specification and the like does not necessarily mean that a component is directly in contact with another component. For example, the expression "electrode B adjacent to insulating layer A" does not necessarily mean that the electrode B is formed in direct contact with the insulating layer A and does not exclude the case where another component is provided between the insulating layer A and the electrode B.

Note that voltage refers to a potential difference between a given potential and a reference potential (e.g., a ground potential or a source potential) in many cases. Therefore, the terms "voltage" and "potential" can be replaced with each other in many cases. In this specification and the like, the terms "voltage" and "potential" can be replaced with each other unless otherwise specified.

Note that a "semiconductor" has characteristics of an "insulator" when the conductivity is sufficiently low, for example. Thus, a "semiconductor" and an "insulator" can be replaced with each other. In that case, a "semiconductor" and an "insulator" cannot be strictly distinguished from each other because a border therebetween is not clear. Accordingly, a "semiconductor" and an "insulator" in this specification can be replaced with each other in some cases.

Furthermore, a "semiconductor" has characteristics of a "conductor" when the conductivity is sufficiently high, for example. Thus, a "semiconductor" and a "conductor" can be replaced with each other. In that case, a "semiconductor" and a "conductor" cannot be strictly distinguished from each other because a border therebetween is not clear. Accordingly, a "semiconductor" and a "conductor" in this specification can be replaced with each other in some cases.

In this specification and the like, a "resistor" can be, for example, a circuit element or a wiring having a resistance value higher than $0\Omega$. Therefore, in this specification and the like, a "resistor" sometimes includes a wiring having a resistance value, a transistor in which current flows between its source and drain, a diode, and an inductor. Thus, the term "resistor" can be replaced with the terms "resistance", "load", "region having a resistance value", and the like;

conversely, the terms "resistance", "load", and "region having a resistance value" can be replaced with the term "resistor" and the like. The resistance value can be, for example, preferably greater than or equal to 1 mΩ and less than or equal to 10Ω, further preferably greater than or equal to 5 mΩ and less than or equal to 5Ω, still further preferably greater than or equal to 10 mΩ and less than or equal to 1Ω. As another example, the resistance value may be greater than or equal to 1Ω and less than or equal to $1\times10^9\Omega$.

In this specification and the like, a "capacitor" can be, for example, a circuit element having an electrostatic capacitance value higher than 0 F, a region of a wiring having an electrostatic capacitance value higher than 0 F, parasitic capacitance, or gate capacitance of a transistor. Therefore, in this specification and the like, a "capacitor" includes not only a circuit element that has a pair of electrodes and a dielectric between the electrodes, but also parasitic capacitance generated between wirings, gate capacitance generated between a gate and one of a source and a drain of a transistor, and the like. The terms "capacitor", "parasitic capacitance", "gate capacitance", and the like can be replaced with the term "capacitance" and the like; conversely, the term "capacitance" can be replaced with the terms "capacitor", "parasitic capacitance", "gate capacitance", and the like. The term "a pair of electrodes" of a "capacitor" can be replaced with "a pair of conductors", "a pair of conductive regions", "a pair of regions", and the like. Note that the electrostatic capacitance value can be greater than or equal to 0.05 fF and less than or equal to 10 pF, for example. For another example, the electrostatic capacitance value may be greater than or equal to 1 pF and less than or equal to 10 μF.

Even when independent components are electrically connected to each other in a circuit diagram, one component has functions of a plurality of components in some cases. For example, when part of a wiring also functions as an electrode, one conductive film has functions of both components: a function of the wiring and a function of the electrode. Thus, electrical connection in this specification includes, in its category, such a case where one conductive film has functions of a plurality of components.

In this specification and the like, a transistor includes three terminals called a gate, a source, and a drain. The gate is a control terminal for controlling the conduction state of the transistor. Two terminals functioning as the source and the drain are input/output terminals of the transistor. One of the two input/output terminals serves as the source and the other serves as the drain on the basis of the conductivity type (n-channel type or p-channel type) of the transistor and the levels of potentials applied to the three terminals of the transistor.

Accordingly, functions of a source and a drain are interchanged with each other depending on operation conditions, e.g., when a transistor of different polarity is employed or when the direction of current flow is changed in circuit operation; therefore, it is difficult to define which is the source or the drain. Thus, the terms "source" and "drain" can be interchanged with each other in this specification.

In this specification and the like, expressions "one of a source and a drain" (or a first electrode or a first terminal) and "the other of the source and the drain" (or a second electrode or a second terminal) are used to describe the connection relation of a transistor. Depending on the transistor structure, a transistor may include a back gate in addition to the above three terminals. In that case, in this specification and the like, one of the gate and the back gate of the transistor may be referred to as a first gate and the other of the gate and the back gate of the transistor may be referred to as a second gate. In some cases, the terms "gate" and "back gate" can be replaced with each other in one transistor. In the case where a transistor includes three or more gates, the gates may be referred to as a first gate, a second gate, and a third gate, for example, in this specification and the like.

In this specification and the like, a high power supply potential Vdd (hereinafter, also simply referred to as "Vdd", "potential H", or "H") is a power supply potential higher than a low power supply potential Vss (hereinafter, also simply referred to as "Vss", "potential L", or "L"). Vss refers to a power supply potential at a potential lower than Vdd. A ground potential (hereinafter, also simply referred to as "GND" or "GND potential") can be used as Vdd or Vss. For example, in the case where Vdd is a ground potential, Vss is a potential lower than the ground potential, and in the case where Vss is a ground potential, Vdd is a potential higher than the ground potential.

Unless otherwise specified, transistors described in this specification and the like are enhancement (normally-off) n-channel field-effect transistors. Thus, the threshold voltage (also referred to as "Vth") is higher than 0 V. Furthermore, unless otherwise specified, "an H potential is supplied to a gate of a transistor" means that "the transistor is brought into an on state" in some cases. Similarly, unless otherwise specified, "an L potential is supplied to a gate of a transistor" means that "the transistor is brought into an off state" in some cases.

In this specification and the like, a gate refers to part or the whole of a gate electrode and a gate wiring. A gate wiring refers to a wiring for electrically connecting at least one gate electrode of a transistor to another electrode or another wiring.

In this specification and the like, a source refers to part or the whole of a source region, a source electrode, and a source wiring. A source region refers to a region in a semiconductor layer where the resistivity is lower than or equal to a given value. A source electrode refers to part of a conductive layer which is connected to a source region. A source wiring refers to a wiring for electrically connecting at least one source electrode of a transistor to another electrode or another wiring.

Moreover, in this specification and the like, a drain refers to part or the whole of a drain region, a drain electrode, or a drain wiring. A drain region refers to a region in a semiconductor layer where the resistivity is lower than or equal to a given value. A drain electrode refers to part of a conductive layer which is connected to a drain region. A drain wiring refers to a wiring for electrically connecting at least one drain electrode of a transistor to another electrode or another wiring.

In the drawings and the like, for easy understanding of the potential of a wiring, an electrode, a conductor, or the like, "H" representing an H potential or "L" representing an L potential is sometimes written near the wiring, the electrode, the conductor, or the like. Furthermore, when part of circuits stops its function, a symbol "x" is sometimes written on the circuit.

In this specification and the like, when a plurality of components are denoted by the same reference numerals, and in particular need to be distinguished from each other, an identification sign such as "a", "A", "_1", "_2", or "[m, n]" is sometimes added to the reference numerals. For example, one of two wirings GL is referred to as a wiring GLa and the other is referred to as a wiring GLb in some cases.

Note that ordinal numbers such as "first" and "second" in this specification and the like are used in order to avoid confusion among components and do not denote the priority or the order such as the order of steps or the stacking order. A term without an ordinal number in this specification and the like might be provided with an ordinal number in the scope of claims in order to avoid confusion among components. Furthermore, a term with an ordinal number in this specification and the like might be provided with a different ordinal number in the scope of claims. Furthermore, even when a term is provided with an ordinal number in this specification and the like, the ordinal number might be omitted in the scope of claims and the like.

Furthermore, in the case where this specification and the like state that X and Y are connected, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or text, a connection relation other than that shown in the drawings or the text is regarded as being disclosed in the drawings or the text. Each of X and Y denotes an object (e.g., a device, an element, a circuit, a wiring, an electrode, a terminal, a conductive film, a layer, or the like).

For example, in the case where X and Y are electrically connected, one or more elements that allow electrical connection between X and Y (e.g., a switch, a transistor, a capacitor, an inductor, a resistor, a diode, a display device, a light-emitting device, a load, and the like) can be connected between X and Y. Note that a switch has a function of being controlled to be in an on state or an off state. That is, the switch has a function of being in a conduction state (on state) or a non-conduction state (off state) to control whether a current flows or not.

For example, in the case where X and Y are functionally connected, one or more circuits that allow functional connection between X and Y (e.g., a logic circuit (an inverter, a NAND circuit, a NOR circuit, or the like); a signal converter circuit (a digital-analog converter circuit, an analog-digital converter circuit, a gamma correction circuit, or the like); a potential level converter circuit (a power supply circuit (a step-up circuit, a step-down circuit, or the like), a level shifter circuit for changing the potential level of a signal, or the like); a voltage source; a current source; a switching circuit; an amplifier circuit (a circuit that can increase signal amplitude, the amount of current, or the like, an operational amplifier, a differential amplifier circuit, a source follower circuit, a buffer circuit, or the like); a signal generation circuit; a memory circuit; or a control circuit) can be connected between X and Y. Note that for example, even when another circuit is sandwiched between X and Y, X and Y are functionally connected when a signal output from X is transmitted to Y.

Note that an explicit description that X and Y are electrically connected includes the case where X and Y are electrically connected (i.e., the case where X and Y are connected with another element or another circuit sandwiched therebetween) and the case where X and Y are directly connected (i.e., the case where X and Y are connected without another element or another circuit sandwiched therebetween).

In addition, it can be expressed as, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in that order." Alternatively, it can be expressed as "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in that order." Alternatively, it can be expressed as "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order." When the connection order in a circuit structure is defined by an expression similar to the above examples, a source (or a first terminal or the like) and a drain (or a second terminal or the like) of a transistor can be distinguished from each other to specify the technical scope. Note that these expressions are just examples and expressions are not limited to these expressions. Here, each of X and Y denotes an object (e.g., a device, an element, a circuit, a wiring, an electrode, a terminal, a conductive film, a layer, or the like).

In addition, in this specification and the like, a transistor includes three terminals called a gate, a source, and a drain. The gate functions as a control terminal for controlling the conduction state of the transistor. Two terminals functioning as the source and the drain are input/output terminals of the transistor. One of the two input/output terminals serves as the source and the other serves as the drain depending on the conductivity type (n-channel type or p-channel type) of the transistor and the levels of potentials applied to the three terminals of the transistor. Thus, the terms "source" and "drain" can be replaced with each other in this specification and the like. Furthermore, in this specification and the like, expressions "one of a source and a drain" (or a first electrode or a first terminal) and "the other of the source and the drain" (or a second electrode or a second terminal) are used in the description of the connection relation of a transistor. Note that depending on the transistor structure, a transistor may include a back gate in addition to the above three terminals. In that case, in this specification and the like, one of the gate and the back gate of the transistor is sometimes referred to as a first gate, and the other of the gate and the back gate of the transistor is sometimes referred to as a second gate. Moreover, the terms "gate" and "back gate" can be replaced with each other in one transistor in some cases. In the case where a transistor includes three or more gates, the gates may be sometimes referred to as a first gate, a second gate, and a third gate, for example, in this specification and the like.

In this specification and the like, an "on state" of a transistor refers to a state in which a source and a drain of the transistor are regarded as being electrically short-circuited (also referred to as a "conduction state"). Furthermore, an "off state" of a transistor refers to a state in which a source and a drain of the transistor are regarded as being electrically disconnected (also referred to as a "non-conduction state").

In this specification and the like, in some cases, "on-state current" means a current that flows between a source and a drain when a transistor is in an on state. Furthermore, in some cases, "off-state current" means a current that flows between a source and a drain when a transistor is in an off state.

In addition, in this specification and the like, "node" can be referred to as a terminal, a wiring, an electrode, a conductive layer, a conductor, an impurity region, and the like depending on a circuit structure, a device structure, or the like. Furthermore, a terminal, a wiring, or the like can be referred to as node.

In addition, in this specification and the like, "voltage" and "potential" can be replaced with each other as appropriate. The "voltage" refers to a potential difference from a reference potential, and when the reference potential is a ground potential, for example, the "voltage" can be replaced with the "potential." Note that the ground potential does not necessarily mean 0 V. Moreover, potentials are relative values, and a potential applied to a wiring, a potential applied to a circuit and the like, and a potential output from a circuit and the like, for example, are changed with a change of the reference potential.

"Current" is an electric charge transfer phenomenon (electrical conduction); for example, the description "electrical conduction of positively charged particles occurs" can be rephrased as "electrical conduction of negatively charged particles occurs in an opposite direction." Therefore, unless otherwise specified, "current" in this specification and the like refers to an electric charge transfer phenomenon (electrical conduction) accompanied by carrier movement. Examples of a carrier here include an electron, a hole, an anion, a cation, a complex ion, and the like, and the carrier differs between current flow systems (e.g., a semiconductor, a metal, an electrolyte solution, a vacuum, and the like). In addition, the "direction of current" in a wiring or the like refers to the direction in which a positive carrier moves, and the amount of current is expressed as a positive value. In other words, the direction in which a negative carrier moves is opposite to the direction of a current, and the amount of current is expressed as a negative value. Thus, in the case where the polarity of a current (or the direction of a current) is not specified in this specification and the like, the description "current flows from element A to element B" can be rephrased as "current flows from element B to element A," for example. Furthermore, the description "current is input to element A" can be rephrased as "current is output from element A," for example.

In addition, ordinal numbers such as "first," "second," and "third" in this specification and the like are used to avoid confusion among components. Thus, the ordinal numbers do not limit the number of components. Furthermore, the ordinal numbers do not limit the order of components. For example, a "first" component in one embodiment in this specification and the like can be referred to as a "second" component in other embodiments, or the scope of claims. Furthermore, a "first" component in one embodiment in this specification and the like can be omitted in other embodiments, or the scope of claims.

The term "over" or "under" does not necessarily mean that a component is placed directly over and in contact with or directly under and in contact with another component. For example, the expression "electrode B over insulating layer A" does not necessarily mean that the electrode B is formed over and in direct contact with the insulating layer A, and does not exclude the case where another component is provided between the insulating layer A and the electrode B.

The positional relation between components changes as appropriate in accordance with the direction in which each component is described. Thus, the positional relation is not limited to that described with a term in this specification and the like and can be described with another term as appropriate depending on the situation. For example, in this specification and the like, terms for describing arrangement, such as "over" and "under", are sometimes used for convenience to describe the positional relation between components with reference to drawings. Accordingly, the expression "an insulator positioned over (on) a top surface of a conductor" can be replaced with the expression "an insulator positioned under (on) a bottom surface of a conductor" when the direction of a drawing showing these components is rotated by 180°. Moreover, the expression "an insulator positioned over (on) a top surface of a conductor" can be replaced with the expression "an insulator positioned on a left surface (or a right surface) of a conductor" when the direction of a drawing showing these components is rotated by 90°.

Similarly, the term "overlap", for example, in this specification and the like does not limit a state such as the stacking order of components. For example, the expression "electrode B overlapping with insulating layer A" does not necessarily mean the state where "electrode B is formed over insulating layer A", and does not exclude the state where "electrode B is formed under insulating layer A" and the state where "electrode B is formed on the right side (or the left side) of insulating layer A".

In addition, in this specification and the like, the terms "film," "layer," and the like can be interchanged with each other depending on the situation. For example, the term "conductive layer" can be changed into the term "conductive film" in some cases. As another example, the term "insulating film" can be changed into the term "insulating layer" in some cases. Alternatively, the term "film," "layer," or the like is not used and can be interchanged with another term depending on the case or the situation. For example, the term "conductive layer" or "conductive film" can be changed into the term "conductor" in some cases. Furthermore, for example, the term "insulating layer" or "insulating film" can be changed into the term "insulator" in some cases.

In addition, in this specification and the like, the term such as "electrode," "wiring," or "terminal" does not limit the function of a component. For example, an "electrode" is used as part of a "wiring" in some cases, and vice versa. Furthermore, the term "electrode" or "wiring" also includes the case where a plurality of "electrodes" or "wirings" are formed in an integrated manner, for example. For example, a "terminal" is used as part of a "wiring" or an "electrode" in some cases, and vice versa. Furthermore, the term "terminal" also includes the case where a plurality of "electrodes," "wirings," "terminals," or the like are formed in an integrated manner, for example. Therefore, for example, an "electrode" can be part of a "wiring" or a "terminal," and a "terminal" can be part of a "wiring" or an "electrode." Moreover, the term such as "electrode," "wiring," or "terminal" is sometimes replaced with the term such as "region."

In addition, in this specification and the like, the term such as "wiring," "signal line," or "power supply line" can be interchanged with each other depending on the case or the situation. For example, the term "wiring" can be changed into the term "signal line" in some cases. Furthermore, for example, the term "wiring" can be changed into the term such as "power source line" in some cases. Inversely, the term such as "signal line" or "power supply line" can be changed into the term "wiring" in some cases. The term such as "power source line" can be changed into the term such as "signal line" in some cases. Inversely, the term such as "signal line" can be changed into the term such as "power source line" in some cases. Moreover, the term "potential" that is applied to a wiring can be sometimes changed into the term such as "signal" depending on the case or the situation. Inversely, the term such as "signal" can be changed into the term "potential" in some cases.

In this specification and the like, an impurity in a semiconductor refers to a component other than a main component of a semiconductor, for example. For example, an element with a concentration of lower than 0.1 atomic % is an impurity. When an impurity is contained, for example, the density of defect states in a semiconductor is increased, carrier mobility is decreased, and/or crystallinity is decreased in some cases. In the case where the semiconductor is an oxide semiconductor, examples of an impurity that changes characteristics of the semiconductor include Group 1 elements, Group 2 elements, Group 13 elements, Group 14 elements, Group 15 elements, and transition metals other than the main components; specifically, there are hydrogen (contained also in water), lithium, sodium, silicon, boron, phosphorus, carbon, nitrogen, and the like, for example. Specifically, in the case where the semiconductor is silicon, examples of an impurity that changes characteristics of the semiconductor include oxygen, Group 1 elements except hydrogen, Group 2 elements, Group 13 elements, Group 15 elements, and the like.

In this specification and the like, a switch has a function of controlling whether a current flows or not by being in a conduction state (an on state) or a non-conduction state (an off state). Alternatively, a switch has a function of selecting and changing a current path. For example, an electrical switch, a mechanical switch, or the like can be used. That is, a switch can be any element capable of controlling a current, and is not limited to a certain element.

Examples of the electrical switch include a transistor (e.g., a bipolar transistor or a MOS transistor), a diode (e.g., a PN diode, a PIN diode, a Schottky diode, a MIM (Metal Insulator Metal) diode, a MIS (Metal Insulator Semiconductor) diode, or a diode-connected transistor), and a logic circuit in which such elements are combined. Note that in the case where a transistor is used as a switch, a "conduction state" of the transistor refers to a state where a source electrode and a drain electrode of the transistor can be regarded as being electrically short-circuited. Furthermore, a "non-conduction state" of the transistor refers to a state where the source electrode and the drain electrode of the transistor can be regarded as being electrically disconnected. Note that in the case where a transistor operates just as a switch, there is no particular limitation on the polarity (conductivity type) of the transistor.

An example of a mechanical switch is a switch formed using a MEMS (micro electro mechanical systems) technology. Such a switch includes an electrode that can be moved mechanically, and operates by controlling conduction and non-conduction with movement of the electrode.

In this specification, "parallel" indicates a state where two straight lines are placed at an angle greater than or equal to −10° and less than or equal to 10°. Accordingly, the case where the angle is greater than or equal to −5° and less than or equal to 5° is also included. In addition, "approximately parallel" or "substantially parallel" indicates a state where two straight lines are placed at an angle greater than or equal to −30° and less than or equal to 30°. In addition, "perpendicular" indicates a state where two straight lines are placed at an angle greater than or equal to 80° and less than or equal to 100°. Accordingly, the case where the angle is greater than or equal to 85° and less than or equal to 95° is also included. Furthermore, "approximately perpendicular" or "substantially perpendicular" indicates a state where two straight lines are placed at an angle greater than or equal to 60° and less than or equal to 120°.

In this specification and the like, the terms "identical", "same", "equal", "uniform", and the like used in describing calculation values and measurement values or in describing objects, methods, and the like that can be converted into calculation values or measurement values allow for a margin of error of ±20% unless otherwise specified.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in an active layer of a transistor, the metal oxide is referred to as an oxide semiconductor in some cases. That is, when a metal oxide can form a channel formation region of a transistor that has at least one of an amplifying function, a rectifying function, and a switching function, the metal oxide can be referred to as a metal oxide semiconductor. In the case where an "OS transistor" is mentioned, the "OS transistor" can also be referred to as a transistor including a metal oxide or an oxide semiconductor.

In addition, in this specification and the like, a metal oxide containing nitrogen is also collectively referred to as a metal oxide in some cases. Furthermore, a metal oxide containing nitrogen may be referred to as a metal oxynitride.

In addition, in this specification and the like, one embodiment of the present invention can be constituted by combining, as appropriate, the structure described in each embodiment with the structures described in the other embodiments. Furthermore, in the case where a plurality of structure examples are described in one embodiment, the structure examples can be combined with each other as appropriate.

Note that content (or may be part of the content) described in one embodiment can be applied to, combined with, or replaced with at least one of another content (or may be part of the content) in the embodiment and content (or may be part of the content) described in one or a plurality of different embodiments.

Note that in each embodiment (or Example), content described in the embodiment is content described using a variety of diagrams or content described with text described in the specification.

Note that by combining a drawing (or may be part thereof) described in one embodiment with at least one of another part of the drawing, a different drawing (or may be part thereof) described in the embodiment, and a drawing (or may be part thereof) described in one or a plurality of different embodiments, much more drawings can be constituted.

Embodiments described in this specification are described with reference to the drawings. Note that the embodiments can be implemented in many different modes, and it will be readily understood by those skilled in the art that the modes and details can be changed in various ways without departing from the spirit and scope thereof. Therefore, the present invention should not be construed as being limited to the description in the embodiments. Note that in the structures of the invention in the embodiments, the same reference numerals are used in common for the same portions or portions having similar functions in different drawings, and repeated description thereof is omitted in some cases. Moreover, some components are omitted in a perspective view, a top view, and the like for easy understanding of the diagrams in some cases.

In this specification and the like, components are classified on the basis of the functions and shown as independent blocks in block diagrams. However, in an actual circuit or the like, it is difficult to separate components on the basis of the functions, and there is such a case where one circuit is associated with a plurality of functions or a case where a plurality of circuits are associated with one function. Therefore, blocks in the block diagrams are not limited by the components described in the specification, and the description can be changed appropriately depending on the situation.

In addition, in the drawings and the like, the size, the layer thickness, or the region is exaggerated for clarity in some cases. Therefore, embodiments of the present invention are not limited to the size, aspect ratio, and the like shown in the drawings. Note that the drawings schematically show ideal examples, and embodiments of the present invention are not limited to shapes, values, and the like shown in the drawings. For example, variation in signal, voltage, or current due to noise or variation in signal, voltage, or current due to difference in timing can be included.

Embodiment 1

An AD converter (analog-digital converter) 100 of one embodiment of the present invention is described with reference to the drawings.

Structure Example of AD Converter 100

FIG. 1 illustrates a block diagram of the AD converter 100. The AD converter 100 includes a comparison portion 110, a control portion 120, a DA conversion portion (digital-analog conversion portion) 130*a*, and a DA conversion portion 130*b*. A wiring 101*a* is electrically connected to an input terminal 111*a* of the comparison portion 110 and a wiring 101*b* is electrically connected to an input terminal 111*b* of the comparison portion 110.

The comparison portion 110 has a function of comparing the value of a current flowing to the input terminal 111*a* with the value of a current flowing to the input terminal 111*b* to supply one of two potentials to an output terminal D. As an example, the case where a current Ia flows to the input terminal 111*a* through the wiring 101*a* and a current Ib flows to the input terminal 111*b* through the wiring 101*b* is considered. In the case where the current value of the current Ia exceeds the current value of the current Ib, the comparison portion 110 supplies a potential H to the output terminal D as an output. Furthermore, in the case where the current value of the current Ia is less than or equal to the current value of the current Ib, the comparison portion 110 supplies a potential L to the output terminal D as the output. The output of the comparison portion 110 is input to the control portion 120 through the output terminal D.

The control portion 120 includes a sign generation portion 121 and a digital signal generation portion 122. The sign generation portion 121 has a function of generating a 1-bit sign bit in accordance with the output of the comparison portion 110. For example, in the case where the output of the comparison portion 110 is the potential H, "0" is generated as a sign bit. In the case where the output of the comparison portion 110 is the potential L, "1" is generated as a sign bit. Note that the sign bit may be "1" in the case where the output of the comparison portion 110 is the potential H and may be "0" in the case where the output of the comparison portion 110 is the potential L.

The digital signal generation portion 122 has a function of generating a digital signal having a digital value and a resolution greater than or equal to eight bits and less than or equal to 16 bits. Lower resolution leads to lower AD conversion accuracy but leads to a higher AD conversion speed. Higher resolution leads to higher AD conversion accuracy but leads to a lower AD conversion speed. Note that the resolution of the digital signal generation portion 122 is not limited to greater than or equal to eight bits and less than or equal to 16 bits. The resolution of the digital signal generation portion 122 may be less than or equal to seven bits and may be greater than or equal to 17 bits. The resolution can be set as appropriate in accordance with the purpose and the intended use.

In this embodiment, the digital signal generation portion 122 generates a digital signal with a resolution of eight bits. Note that in this specification and the like, the digits of a digital signal represented in binary form are sometimes referred to as bits.

The control portion 120 has a function of supplying, to a DA conversion portion 130 (the DA conversion portion 130a and/or the DA conversion portion 130b), the digital signal generated by the digital signal generation portion 122. The control portion 120 has a function of outputting, to the outside (OUT), a signal obtained by adding a sign bit to a digital signal. When a digital signal has a resolution of eight bits, a 9-bit signed digital signal obtained by adding one bit of a sign bit can be output to the outside. The control portion 120 functions as a successive approximation register (SAR).

The DA conversion portion 130 functions as a current output DAC (Digital to Analog Converter). That is, the DA conversion portion 130 has a function of outputting, to an output terminal C (an output terminal Ca and/or an output terminal Cb), a current having a value corresponding to the digital signal supplied from the control portion 120.

In FIG. 1, the output terminal Ca of the DA conversion portion 130a is electrically connected to the input terminal 111a of the comparison portion 110 through a node NDa. Accordingly, an output current of the DA conversion portion 130a is added to the input terminal 111a of the comparison portion 110. That is, the current Ia and the output current of the DA conversion portion 130a flow to the input terminal 111a. In other words, the current Ia to which the output current of the DA conversion portion 130a has been added flows to the input terminal 111a.

In FIG. 1, the output terminal Cb of the DA conversion portion 130b is electrically connected to the input terminal 111b of the comparison portion 110 through a node NDb. Accordingly, an output current of the DA conversion portion 130b is added to the input terminal 111b of the comparison portion 110. That is, the current Ib and the output current of the DA conversion portion 130b flow to the input terminal 111b. In other words, the current Ib to which the output current of the DA conversion portion 130b has been added flows to the input terminal 111b.

Note that the node NDa is a node to which an output portion of the DA conversion portion 130a, the wiring 101a, and the input terminal 111a are electrically connected. The node NDb is a node to which an output portion of the DA conversion portion 130b, the wiring 101b, and the input terminal 111b are electrically connected.

Operation Example of AD Converter 100

Figure 2:
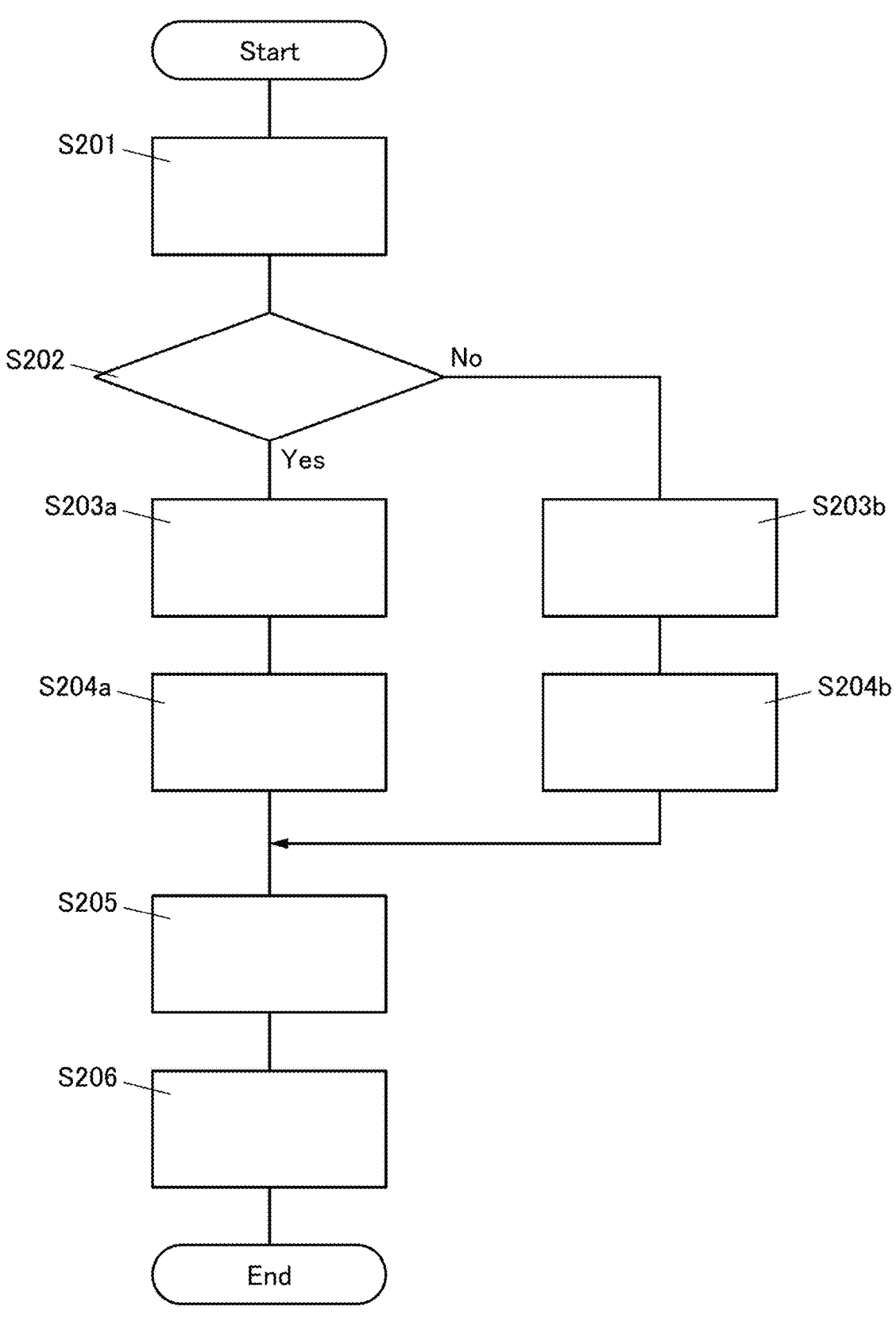
FIG. 2 is a flow chart for showing an AD converter.

FIG. 2 is a flow chart for showing an operation example of the AD converter 100. In this embodiment, the digital signal generated in the digital signal generation portion 122 has a resolution of eight bits, and the output current of the DA conversion portion 130 is in the steps of 1 nA. Here, an operation is described in which the difference value (also referred to as differential current) between the current Ia and the current Ib is converted into a digital signal with a sign bit.

[Step S201]

The control portion 120 is reset. Specifically, an 8-bit digital signal is set to $(00000000)_2$. The digital signal is supplied to the DA conversion portion 130a and the DA conversion portion 130b. Accordingly, the DA conversion portion 130a and the DA conversion portion 130b cease the output.

[Step S202]

The comparison portion 110 compares the current value of the current Ia with the current value of the current Ib. In this embodiment, when the current value of the current Ia is greater than the current value of the current Ib (Yes), the comparison portion 110 supplies the potential H to the output terminal D. Furthermore, the current value of the current Ia is less than or equal to the current value of the current Ib (No), the comparison portion 110 supplies the potential L to the output terminal D.

[Step S203a]

In the case where the comparison portion 110 outputs the potential H in Step S202, "0" is set as a sign bit.

[Step S204a]

In the case where the sign bit is "0", successive approximation (SA) is performed with the DA conversion portion 130b. During the SA, $(00000000)_2$ as a digital signal keeps being supplied to the DA conversion portion 130a. Alternatively, power supply to the DA conversion portion 130a may be stopped. Stopping the power supply to the DA conversion portion 130a can reduce power consumption. Note that the SA operation will be described later in detail.

[Step S203b]

In the case where the comparison portion 110 outputs the potential L in Step S202, "1" is set as a sign bit.

[Step S204b]

In the case where the sign bit is "1", SA is performed with the DA conversion portion 130a. During the SA, $(00000000)_2$ as a digital signal keeps being supplied to the DA conversion portion 130b. Alternatively, power supply to the DA conversion portion 130b may be stopped. Stopping the power supply to the DA conversion portion 130b can reduce power consumption.

[Step S205]

After Step S204a or Step S204b ends, the obtained digital signal and the sign bit are combined to generate a signed digital signal. The sign bit may be the most significant bit or the least significant bit of the signed digital signal.

For example, in the case where the sign bit is "1" and the digital signal obtained through SA is $(01001011)_2$, the signed digital signal may be $(101001011)_2$ with the sign bit being used as the most significant bit (MSB). Alternatively, the signed digital signal may be $(010010111)_2$ with the sign bit being used as the least significant bit (LSB).

[Step S206]

The generated signed digital signal is output to the outside. In the case where the sign bit "0" is positive and the sign bit "1" is negative, the AD converter 100 of one embodiment of the present invention can output a positive digital signal or a negative digital signal. Alternatively, the AD converter 100 of one embodiment of the present invention can output, as digital signals, the magnitude relation and the absolute value of a differential current between the current Ia and the current Ib.

Successive Approximation Operation Example

Figure 3:
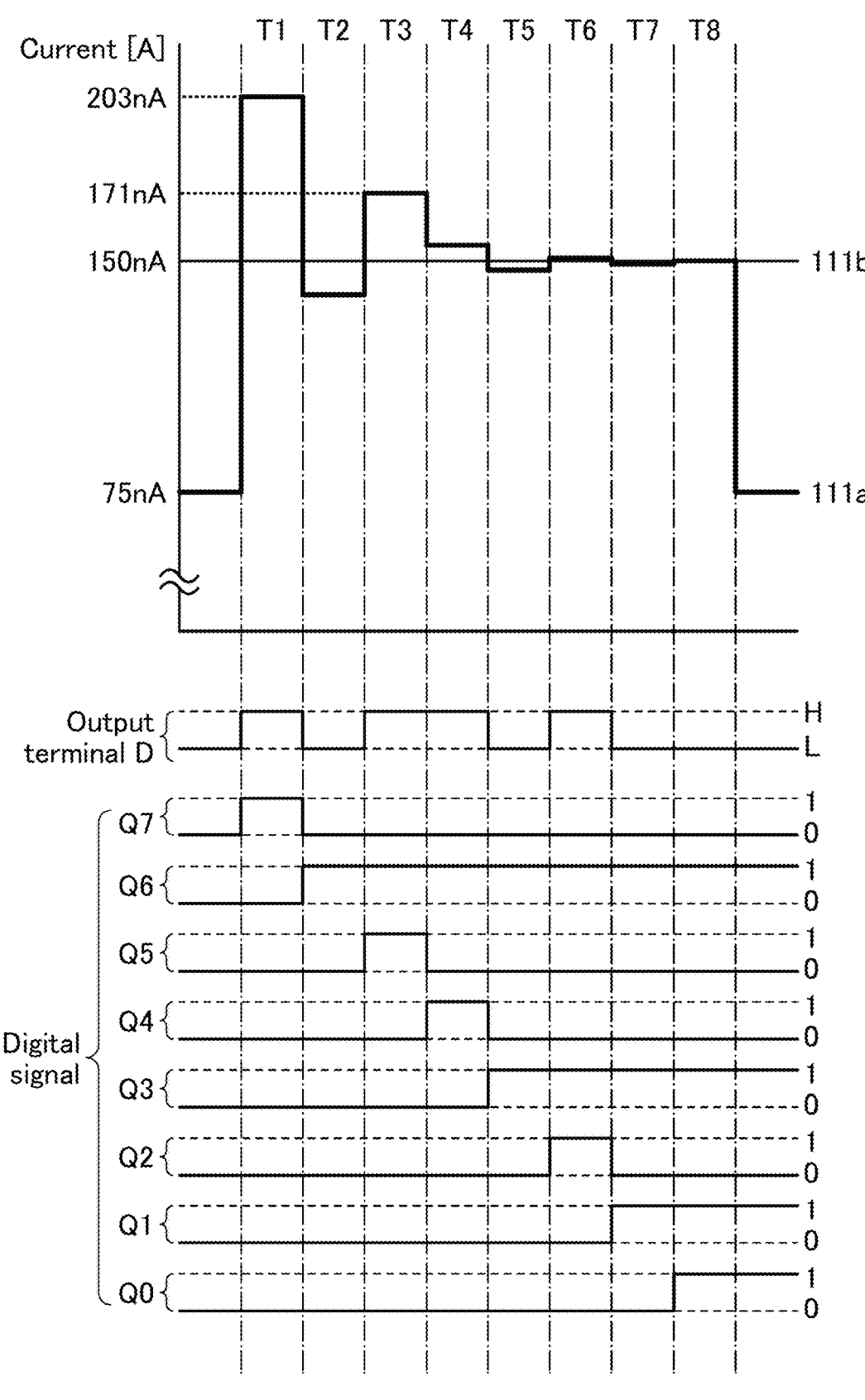
FIG. 3 is a diagram showing successive approximation operation.

A successive approximation operation corresponding to Step S204b is described with reference to FIG. 3. FIG. 3 shows the states of the current Ia, the current Ib, the output terminal D, and the digits of a digital signal (a Q0 bit to a Q7 bit) from Period T1 to Period T8. As already described above, the digital signal generated in the digital signal generation portion 122 has a resolution of eight bits, and the output current of the DA conversion portion 130 is in the steps of 1 nA. Here, the case where the current Ia is 75 nA and the current Ib is 150 nA is described. Note that the potential of the output terminal D is the potential L before the successive approximation operation (in the initial state). The digital signal in the initial state is $(00000000)_2$.

[Period T1]

In Period T1, the Q7 bit that is the MSB of the digital signal is set to "1". In other words, a digital signal $(10000000)_2$ is generated. The digital signal is input to the DA conversion portion 130a, and the DA conversion portion 130a outputs 128 nA. This output is supplied to the input terminal 111a through the node NDa. Thus, 203 nA (75+128 nA) flows to the input terminal 111a. Because 150 nA flows to the input terminal 111b, the potential of the output terminal D becomes the potential H.

In the case where the potential of the output terminal D changes in Period T1 from the potential in the initial state, the Q7 bit keeps being "0" after Period T1 until the control portion 120 is reset. In the case where the potential of the output terminal D does not change from the potential in the initial state, the Q7 bit keeps being "1" after Period T1 until the control portion 120 is reset. In this embodiment, the Q7 bit is "0" after Period T1.

[Period T2]

In Period T2, the Q6 bit, which is lower than the MSB of the digital signal by one bit, is set to "1". In other words, a digital signal $(01000000)_2$ is generated. The digital signal is input to the DA conversion portion 130a, and the DA conversion portion 130a outputs 64 nA. This output is supplied to the input terminal 111a through the node NDa. Accordingly, 139 nA (75+64 nA) flows to the input terminal 111a, and the potential of the output terminal D is the potential L as in the initial state.

In the case where the potential of the output terminal D changes in Period T2 from the potential in the initial state, the Q6 bit keeps being "0" after Period T2 until the control portion 120 is reset. In the case where the potential of the output terminal D does not change from the potential in the initial state, the Q6 bit keeps being "1" after Period T2 until the control portion 120 is reset. In this embodiment, the Q6 bit is "1" after Period T2.

[Period T3]

In Period T3, the Q5 bit, which is lower than the MSB of the digital signal by two bits, is set to "1". In other words, a digital signal $(01100000)_2$ is generated. The digital signal is input to the DA conversion portion 130a, and the DA conversion portion 130a outputs 96 nA (64+32 nA). This output is supplied to the input terminal 111a through the node NDa. Accordingly, 171 nA (75+64+32 nA) flows to the input terminal 111a, and the potential of the output terminal D becomes the potential H.

In the case where the potential of the output terminal D changes in Period T3 from the potential in the initial state, the Q5 bit keeps being "0" after Period T3 until the control portion 120 is reset. In the case where the potential of the output terminal D does not change from the potential in the initial state, the Q5 bit keeps being "1" after Period T3 until the control portion 120 is reset. In this embodiment, the Q5 bit is "0" after Period T3.

[Period T4]

In Period T4, the Q4 bit, which is lower than the MSB of the digital signal by three bits, is set to "1". In other words, a digital signal $(01010000)_2$ is generated. The digital signal is input to the DA conversion portion 130a, and the DA conversion portion 130a outputs 80 nA (64+16 nA). This output is supplied to the input terminal 111a through the node NDa. Accordingly, 155 nA (75+64+16 nA) flows to the input terminal 111a, and the potential of the output terminal D becomes the potential H.

In the case where the potential of the output terminal D changes in Period T4 from the potential in the initial state, the Q4 bit keeps being "0" after Period T4 until the control portion 120 is reset. In the case where the potential of the output terminal D does not change from the potential in the initial state, the Q4 bit keeps being "1" after Period T4 until the control portion 120 is reset. In this embodiment, the Q4 bit is "0" after Period T4.

[Period T5]

In Period T5, the Q3 bit, which is lower than the MSB of the digital signal by four bits, is set to "1". In other words, a digital signal $(01001000)_2$ is generated. The digital signal is input to the DA conversion portion 130a, and the DA conversion portion 130a outputs 72 nA (64+8 nA). This output is supplied to the input terminal 111a through the node NDa. Accordingly, 147 nA (75+64+8 nA) flows to the input terminal 111a, and the potential of the output terminal D becomes the potential L.

In the case where the potential of the output terminal D changes in Period T5 from the potential in the initial state, the Q3 bit keeps being "0" after Period T5 until the control portion 120 is reset. In the case where the potential of the output terminal D does not change from the potential in the initial state, the Q3 bit keeps being "1" after Period T5 until the control portion 120 is reset. In this embodiment, the Q3 bit is "1" after Period T5.

[Period T6]

In Period T6, the Q2 bit, which is lower than the MSB of the digital signal by five bits, is set to "1". In other words, a digital signal $(01001100)_2$ is generated. The digital signal is input to the DA conversion portion 130a, and the DA conversion portion 130a outputs 76 nA (64+8+4 nA). This output is supplied to the input terminal 111a through the node NDa. Accordingly, 151 nA (75+64+8+4 nA) flows to the input terminal 111a, and the potential of the output terminal D becomes the potential H.

In the case where the potential of the output terminal D changes in Period T6 from the potential in the initial state, the Q2 bit keeps being "0" after Period T6 until the control portion 120 is reset. In the case where the potential of the output terminal D does not change from the potential in the initial state, the Q2 bit keeps being "1" after Period T6 until the control portion 120 is reset. In this embodiment, the Q2 bit is "0" after Period T6.

[Period T7]

In Period T7, the Q1 bit, which is lower than the MSB of the digital signal by six bits, is set to "1". In other words, a digital signal $(01001010)_2$ is generated. The digital signal is input to the DA conversion portion 130a, and the DA conversion portion 130a outputs 74 nA (64+8+2 nA). This output is supplied to the input terminal 111a through the node NDa. Accordingly, 149 nA (75+64+8+2 nA) flows to the input terminal 111a, and the potential of the output terminal D becomes the potential L.

In the case where the potential of the output terminal D changes in Period T7 from the potential in the initial state, the Q1 bit keeps being "0" after Period T7 until the control portion 120 is reset. In the case where the potential of the output terminal D does not change from the potential in the initial state, the Q1 bit keeps being "1" after Period T7 until the control portion 120 is reset. In this embodiment, the Q1 bit is "1" after Period T7.

[Period T8]

In Period T8, the Q0 bit, which is the LSB of the digital signal, is set to "1". In other words, a digital signal $(01001011)_2$ is generated. The digital signal is input to the DA conversion portion 130a, and the DA conversion portion 130a outputs 75 nA (64+8+2+1 nA). This output is supplied to the input terminal 111a through the node NDa. Accordingly, 150 nA (75+64+8+2+1 nA) flows to the input terminal 111a, and the potential of the output terminal D becomes the potential L.

In the case where the potential of the output terminal D changes in Period T8 from the potential in the initial state, the Q0 bit keeps being "0" after Period T8 until the control portion 120 is reset. In the case where the potential of the output terminal D does not change from the potential in the initial state, the Q0 bit keeps being "1" after Period T8 until the control portion 120 is reset. In this embodiment, the Q0 bit is "1" after Period T8.

In this manner, comparison is sequentially performed from the MSB to the LSB, whereby a differential current between the current Ia and the current Ib of 75 nA can be converted into the digital signal $(01001011)_2$.

Note that the successive approximation operation corresponding to Step S204a can be understood when the potential H and the DA conversion portion 130a in the above description are respectively replaced with the potential L and the DA conversion portion 130b.

Since the output current of the DA conversion portion 130 is in the steps of 1 nA in this embodiment, a differential current of 255 nA at a maximum can be converted into a digital signal. When the step of the output current of the DA conversion portion 130 is made large, a higher differential current can be converted. For example, when the step of the output current of the DA conversion portion 130 is 2 nA, a differential current of 510 nA at a maximum can be converted into a digital signal.

More accurate AD conversion can be achieved by increasing the resolution of a digital signal and/or reducing the step of the output current of the DA conversion portion 130.

Figure 4:
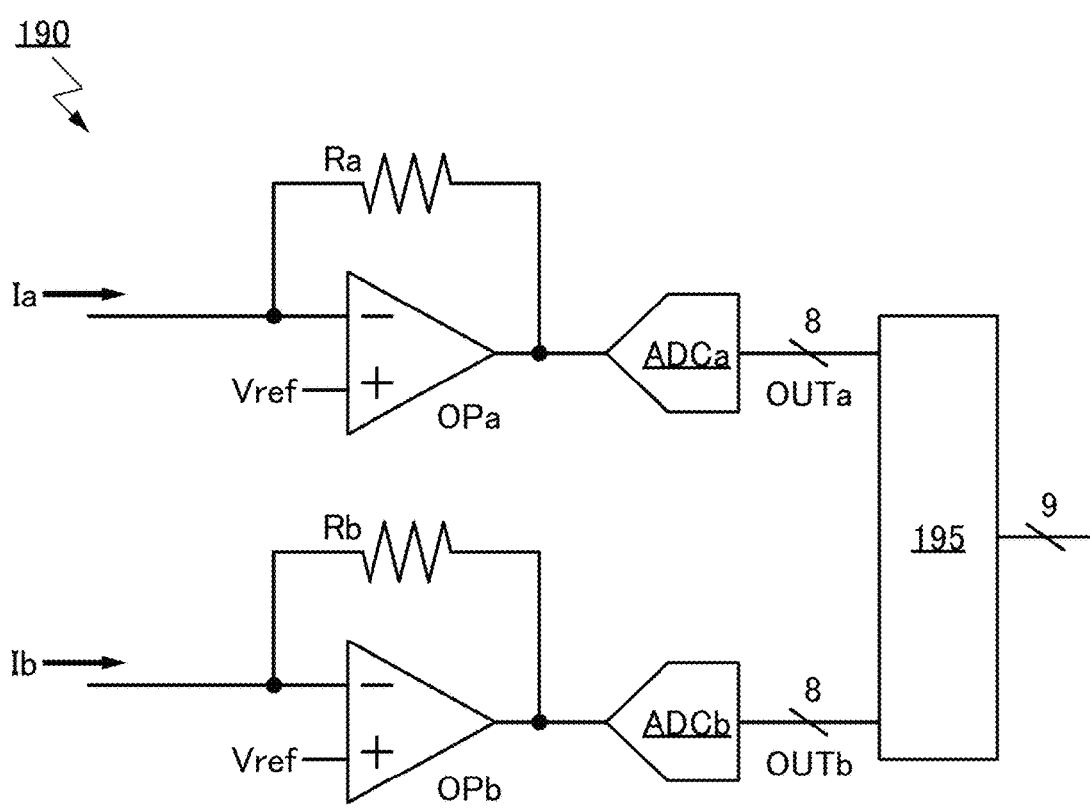
FIG. 4 is a diagram illustrating an AD converter.

Note that, for example, there is a method with which the differential current between the current Ia and the current Ib is converted into a digital signal using an AD converter 190 illustrated in FIG. 4. The AD converter 190 illustrated in FIG. 4 has a function of converting the current Ia into a voltage with an operational amplifier OPa and then converting the voltage into an output OUTa of a digital signal with an AD conversion portion ADCa, and a function of converting the current Ib into a voltage with an operational amplifier OPb and then converting the voltage into an output OUTb of a digital signal with the AD conversion portion ADCb. Arithmetic operation can be performed on the output OUTa and the output OUTb in an arithmetic portion 195, whereby their difference can be obtained.

The current Ia is supplied to an inverting input of the operational amplifier OPa, and a reference voltage Vref is supplied to a non-inverting input of the operational amplifier OPa. An output and the non-inverting input of the operational amplifier OPa are electrically connected to each other through a resistor Ra. Furthermore, the current Ib is supplied to an inverting input of the operational amplifier OPb, and the reference voltage Vref is supplied to a non-inverting input of the operational amplifier OPb. An output and the non-inverting input of the operational amplifier OPb are electrically connected to each other through a resistor Rb.

When both the AD conversion portion ADCa and the AD conversion portion ADCb that are included in the AD converter 190 have resolutions of eight bits and the current value per bit is 1 nA, both the output OUTa and the output OUTb of the current Ia and the current Ib greater than 255 nA become $(11111111)_2$. Therefore, for example, when the current Ia is 300 nA and the current Ib is 261 nA, the output of the AD converter 190 becomes 0.

The AD converter 100 and the AD converter 190 both have a function of converting the differential current into a digital signal. In particular, even when the current values of the current Ia and the current Ib are large, the AD converter 100 can convert their differential current into a digital signal with high accuracy.

Structure Example of Comparison Portion 110

Figures 5A, 5B:
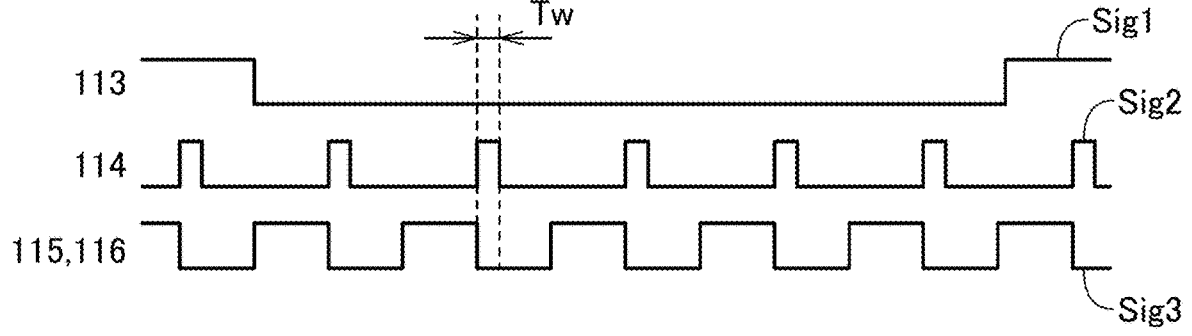
FIG. 5A and FIG. 5B are diagrams illustrating a comparison portion.

As described above, the comparison portion 110 has a function of comparing the current value supplied to the input terminal 111a with the current value supplied to the input terminal 111b to supply one of two potentials to the output terminal D. The comparison portion 110 functions as a current comparison comparator. FIG. 5A illustrates a circuit structure example that can be applied to the comparison portion 110.

The comparison portion 110 illustrated in FIG. 5A includes a transistor M11a, a transistor M11b, a transistor M11c, a transistor M11d, a transistor M12a, a transistor M12b, a transistor M12c, a transistor M12d, a transistor M13a, a transistor M13b, a transistor M14a, a transistor M14b, a transistor M15a, a transistor M15b, a transistor M16a, a transistor M16b, a transistor M17a, and a transistor M17b. The comparison portion 110 illustrated in FIG. 5A further includes an inverter INVa and an inverter INVb.

In addition, the comparison portion 110 illustrated in FIG. 5A includes an output terminal DB. The other of the two potentials is supplied to the output terminal DB. That is, when the potential H is supplied to the output terminal D, the potential L is supplied to the output terminal DB. Furthermore, the potential L is supplied to the output terminal D, the potential H is supplied to the output terminal DB.

At least one of the output terminal D and the output terminal DB needs to be included. For example, in the case where the output terminal DB is not needed, the output terminal DB is not necessarily provided. Alternatively, in the case where the output terminal DB is not needed, the output terminal DB and the inverter INVb are not necessarily provided.

The transistor M11a, the transistor M11b, the transistor M11c, the transistor M11d, the transistor M12a, the transistor M12b, the transistor M12c, the transistor M12d, the transistor M14a, and the transistor M14b are p-channel transistors. The transistor M13a, the transistor M13b, the transistor M15a, the transistor M15b, the transistor M16a, the transistor M16b, the transistor M17a, and the transistor M17b are n-channel transistors.

One of a source and a drain of the transistor M11a is electrically connected to a terminal 112, and the other is electrically connected to one of a source and a drain of the transistor M12a. The other of the source and the drain of the transistor M12a, a gate of the transistor M11a, and a gate of the transistor M11b are electrically connected to the input terminal 111a. A gate of the transistor M12a and a gate of the transistor M12b are electrically connected to a terminal 113.

One of a source and a drain of the transistor M11b is electrically connected to the terminal 112, and the other is electrically connected to one of a source and a drain of the transistor M12b. One of a source and a drain of the transistor M13a is electrically connected to the terminal 112, and the other is electrically connected to the other of the source and the drain of the transistor M12b.

A gate of the transistor M13a and a gate of the transistor M13b are electrically connected to a terminal 114.

One of a source and a drain of the transistor M11c is electrically connected to the terminal 112, and the other is electrically connected to one of a source and a drain of the transistor M12c. The other of the source and the drain of the transistor M12c, a gate of the transistor M11c, and a gate of the transistor M11d are electrically connected to the input terminal 111b. A gate of the transistor M12c and a gate of the transistor M12d are electrically connected to the terminal 113.

One of a source and a drain of the transistor M11d is electrically connected to the terminal 112, and the other is electrically connected to one of a source and a drain of the transistor M12d. One of a source and a drain of the transistor M13b is electrically connected to the terminal 112, and the other is electrically connected to the other of the source and the drain of the transistor M12d.

One of a source and a drain of a transistor M14a is electrically connected to the other of the source and the drain of the transistor M13a, and the other is electrically connected to one of a source and a drain of a transistor M15a. The other of the source and the drain of the transistor M15a is electrically connected to a terminal 117. A gate of the transistor M14a and a gate of the transistor M15a are electrically connected to one of a source and a drain of the transistor M16b and an input of the inverter INVb. An output of the inverter INVb is electrically connected to the output terminal DB. The other of the source and the drain of the transistor M16b is electrically connected to the terminal 117.

One of a source and a drain of the transistor M17b is electrically connected to one of a source and a drain of the transistor M14b, and the other is electrically connected to the terminal 117, for example. A gate of the transistor M16b and a gate of the transistor M17b are electrically connected to a terminal 116.

The one of the source and the drain of the transistor M14b is electrically connected to the other of the source and the drain of the transistor M13b, and the other is electrically connected to one of a source and a drain of the transistor M15b. The other of the source and the drain of the transistor M15b is electrically connected to the terminal 117. A gate of the transistor M14b and a gate of the transistor M15b are electrically connected to one of a source and a drain of the transistor M16a and an input of the inverter INVa. An output of the inverter INVa is electrically connected to the output terminal D. The other of the source and the drain of the transistor M16a is electrically connected to the terminal 117.

One of a source and a drain of the transistor M17a is electrically connected to the one of the source and the drain of the transistor M14a, and the other is electrically connected to the terminal 117. A gate of the transistor M16a and a gate of the transistor M17a are electrically connected to a terminal 115.

The terminal 112 is supplied with Vdd, and the terminal 117 is supplied with Vss. The potential of the terminal 117 may be GND.

A first control signal Sig1 is supplied to the terminal 113, a second control signal Sig2 is supplied to the terminal 114, and a third control signal Sig3 is supplied to the terminal 115 and the terminal 116. FIG. 5B shows the changes in the potentials of the terminal 113 to the terminal 116.

The comparison portion 110 illustrated in FIG. 5A compares the current values of the current Ia flowing to the input terminal 111a and the current Ib flowing to the input terminal 111b, and outputting the comparison result to the output terminal D and the output terminal DB in Period Tw when the first control signal Sig1 and the third control signal Sig3 have the potential L and the second control signal Sig2 has the potential H.

The comparison portion 110 illustrated in FIG. 5A is a comparator that operates when the first to the third control signals have the above combination, and thus power consumption can be reduced compared with that of a comparator operating all the time. Furthermore, since an input current can be converted into a digital signal without being converted into a voltage, reduction in power consumption and occupation area can be achieved. Therefore, the AD converter 100 with reduced power consumption can be achieved. The AD converter 100 with reduced occupation area can be achieved.

The transistor M13a and the transistor M13b may be p-channel transistors in the circuit structure of the comparison portion 110 illustrated in FIG. 5A. Note that the transistor M13a and the transistor M13b are preferably n-channel transistors.

For example, in the case where Vdd is 3.3 V and Vss is 0 V, when p-channel transistors are used as the transistor M13a and the transistor M13b, the potential H and the potential L supplied to the terminal 114 need to be 3.3 V (Vdd) and approximately 2.8 V, respectively. When n-channel transistors are used as the transistor M13a and the transistor M13b, the potential H and the potential L supplied to the terminal 114 can be 1.2 V and 0 V (Vss), respectively. Therefore, the use of n-channel transistors as the transistor M13a and the transistor M13b can reduce a potential necessary for circuit operation. Thus, the power consumption can be reduced.

In the case of using 2.8 V for the circuit operation, an additional power source is necessarily provided. On the other hand, 1.2 V is a common potential used as a power supply potential of a semiconductor device, and thus an additional power source is not necessarily provided, which is preferable.

Structure Example of DA Conversion Portion 130

Figure 6A:
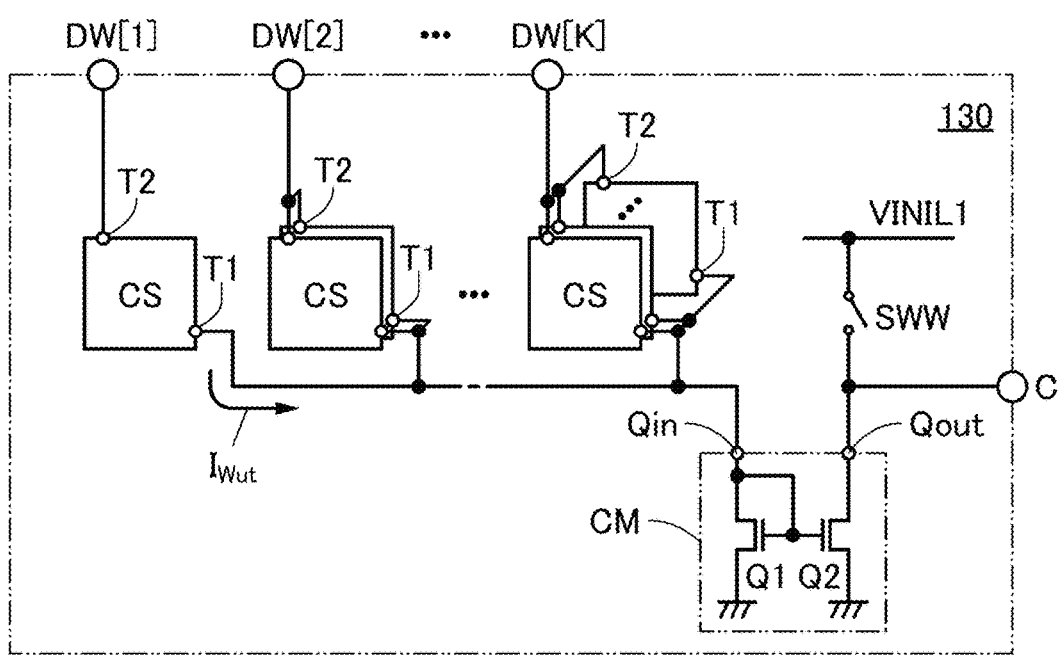
FIG. 6A and FIG. 6B are diagrams illustrating a DA conversion portion.

FIG. 6A is a block diagram illustrating a structure example of the DA conversion portion 130. The DA conversion portion 130 includes a switch SWW. A first terminal of the switch SWW is electrically connected to an output terminal C, and a second terminal of the switch SWW is electrically connected to a wiring VINIL1. The wiring VINIL1 functions as a wiring supplying an initialization potential to the output terminal C, and examples of the initialization potential can include GND, Vss, and Vdd. The switch SWW is turned on only when the initialization potential is supplied to the output terminal C; otherwise, the switch is in the off state.

As the switch SWW, an electrical switch such as an analog switch or a transistor or a mechanical switch such as MEMS can be used, for example.

Furthermore, the DA conversion portion 130 illustrated in FIG. 6A includes a current mirror circuit CM. The current mirror circuit CM includes a transistor Q1 and a transistor Q2. A first terminal of the transistor Q1 is electrically connected to a terminal Qin and a gate of the transistor Q1. A second terminal of the transistor Q1 is supplied with Vss or GND. A first terminal of the transistor Q2 is electrically connected to a terminal Qout. A second terminal of the transistor Q2 is supplied with Vss or GND. A gate of the transistor Q2 is electrically connected to the gate of the transistor Q1.

Furthermore, the DA conversion portion 130 illustrated in FIG. 6A includes a plurality of current sources CS. Specifically, the DA conversion portion 130 has a function of outputting K-bit first data ($2^K$ values) (K is an integer greater than or equal to 1) as a current, and the DA conversion portion 130 includes $2^K-1$ current sources CS at that time. The DA conversion portion 130 includes one current source CS that outputs information corresponding to the first bit value as a current, two current sources CS that output information corresponding to the second bit value as a current, and the $2^{K-1}$ current sources CS that output information corresponding to the K-th bit value as a current.

Each of the current sources CS in FIG. 6A includes a terminal T1 and a terminal T2. The terminals T1 of the current sources CS are each electrically connected to the terminal Qin of the current mirror circuit CM. The terminal Qout of the current mirror circuit CM is electrically connected to the output terminal C. The terminal T2 of the one current source CS is electrically connected to a terminal DW[1], the terminals T2 of the two current sources CS are electrically connected to a terminal DW[2], and the terminals T2 of the $2^{K-1}$ current sources CS are electrically connected to a terminal DW[K].

A digital signal output from the control portion 120 is input to the terminal DW. Specifically, information of the first bit of the digital signal is input to the terminal DW[1], information of the second bit is input to the terminal DW[2], and information of the K-th bit is input to the terminal DW[K].

The plurality of current sources CS that is included in the DA conversion portion 130 illustrated in FIG. 6A have a function of outputting the same constant currents $I_{Wut}$ from the terminals T1. Actually, at the manufacturing stage of the arithmetic circuit, the transistors included in the current sources CS may have different characteristics; this may yield errors. The errors in the constant currents $I_{Wut}$ output from the terminals T1 of the plurality of current sources CS are thus preferably within 10%, further preferably within 5%, still further preferably within 1%. In this embodiment, the description is made based on the assumption that there is no error in the constant currents $I_{Wut}$ output from the terminals T1 of the plurality of current sources CS included in the DA conversion portion 130.

The terminal DW[1] to the terminal DW[K] function as wirings for transmitting control signals to make the current sources CS, which are electrically connected to the terminal DW[1] to the terminal DW[K], output the constant currents $I_{Wut}$. Specifically, for example, when Vdd is supplied to the terminal DW[1], the current source CS electrically connected to the terminal DW[1] supplies the constant current $I_{Wut}$ to the terminal T1, and when Vss is supplied to the terminal DW[1], the current source CS electrically connected to the terminal DW[1] does not output the constant current $I_{Wut}$. For example, when Vdd is supplied to the terminal DW[2], the two current sources CS electrically connected to the terminal DW[2] supply the sum of constant currents $2I_{Wut}$ to the terminal T1, and when Vss is supplied to the terminal DW[2], the current sources CS electrically connected to the terminal DW[2] do not output the sum of constant currents $2I_{Wut}$. For example, when Vdd is supplied to the terminal DW[K], the $2^{K-1}$ current sources CS electrically connected to the terminal DW[K] supply the sum of constant currents $2^{K-1}I_{Wut}$ to the terminal T1, and when Vss is supplied to the terminal DW[K], the current sources CS electrically connected to the terminal DW[K] do not output the sum of constant currents $2^{K-1}I_{Wut}$.

The current flowing from the one current source CS electrically connected to the terminal DW[1] corresponds to the value of the first bit, the current flowing from the two current sources CS electrically connected to the terminal DW[2] corresponds to the value of the second bit, and the current flowing from the $2^{K-1}$ current sources CS electrically connected to the terminal DW[K] corresponds to the value of the K-th bit. Here, the DA conversion portion 130 with K of 2 is considered.

For example, when the value of the first bit is "1" and the value of the second bit is "0", Vdd is supplied to the terminal DW[1], and Vss is supplied to the terminal DW[2]. At this time, $I_{Wut}$ flows to the terminal Qin of the current mirror circuit CM as a reference current.

For example, when the value of the first bit is "0" and the value of the second bit is "1", Vss is supplied to the terminal DW[1], and Vdd is supplied to the terminal DW[2]. At this time, $2I_{Wut}$ flows to the terminal Qin of the current mirror circuit CM as a reference current.

For example, when the value of the first bit is "1" and the value of the second bit is "1", Vdd is supplied to the terminal DW[1] and the terminal DW[2]. At this time, $3I_{Wut}$ flows to the terminal Qin of the current mirror circuit CM as a reference current.

A current corresponding to the reference current flows to the terminal Qout. Therefore, the current corresponding to the reference current flows also to the output terminal C. When the transistor characteristics of the transistor Q1 and the transistor Q2 are the same, the current values of a current flowing to the terminal Qin and the current flowing to the terminal Qout are equal. Thus, the current values of the current flowing to the terminal Qin and the current flowing to the output terminal C are equal.

For example, when the value of the first bit is "0" and the value of the second bit is "0", Vss is supplied to the terminal DW[1] and the terminal DW[2]. In this case, a current does not flow to the terminal Qin. Therefore, a current does not flow to the output terminal.

FIG. 6A illustrates a structure example of the DA conversion portion 130 when K is an integer greater than or equal to 3; when K is 1, the current sources CS electrically connected to the terminal DW[2] to the terminal DW[K] in FIG. 6A are not provided. Similarly, when K is 2, the current sources CS electrically connected to the terminal DW[3] (not illustrated) to the terminal DW[K] in FIG. 6A are not provided.

Next, a specific structure example of the current source CS is described.

Figure 7A:
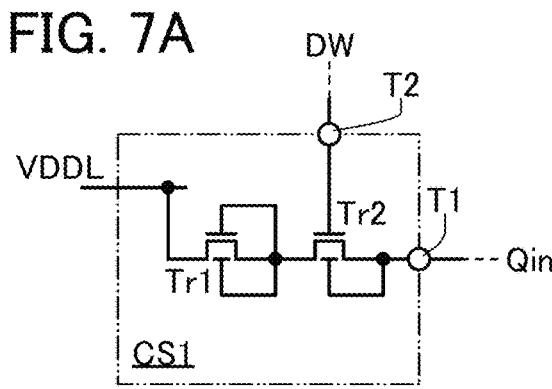
FIG. 7A to FIG. 7E are diagrams illustrating circuits included in a DA conversion portion.

A current source CS1 illustrated in FIG. 7A is a circuit that can be used as the current source CS included in the DA conversion portion 130 in FIG. 6A, and the current source CS1 includes a transistor Tr1 and a transistor Tr2.

A first terminal of the transistor Tr1 is electrically connected to a wiring VDDL, and a second terminal of the transistor Tr1 is electrically connected to a gate of the transistor Tr1, a back gate of the transistor Tr1, and a first terminal of the transistor Tr2. A second terminal of the transistor Tr2 is electrically connected to the terminal T1, and a gate of the transistor Tr2 is electrically connected to the terminal T2. The terminal T2 is electrically connected to the terminal DW. The terminal DW is any one of the terminal DW[1] to the terminal DW[K] in FIG. 6A.

The wiring VDDL functions as a wiring for supplying a constant voltage. The constant voltage can be Vdd, for example.

When a constant voltage supplied from the wiring VDDL is set at Vdd, Vdd is input to the first terminal of the transistor Tr1. The potential of the second terminal of the transistor Tr1 is lower than Vdd. At this time, the first terminal of the transistor Tr1 functions as a drain, and the second terminal of the transistor Tr1 functions as a source.

Since the gate of the transistor Tr1 is electrically connected to the second terminal of the transistor Tr1, the gate-source voltage of the transistor Tr1 is 0 V. Therefore, when the threshold voltage of the transistor Tr1 is within an appropriate range, a current in the subthreshold region (drain current) flows between the first terminal and the second terminal of the transistor Tr1. For example, the current is further preferably within a range where the current exponentially increases with respect to the gate-source voltage. That is, the transistor Tr1 functions as a current source for supplying a current in the subthreshold region.

Note that in this specification and the like, a subthreshold region refers to a region where the absolute value of gate voltage is less than the absolute value of the threshold voltage in a graph of gate voltage (Vg)-drain current (Id) characteristics of a transistor. Alternatively, the subthreshold region refers to a region where a current flows due to carrier diffusion, which is out of gradual channel approximation (a model in which only a drift current is considered). Alternatively, the subthreshold region refers to a region where a drain current increases exponentially with respect to an increase in gate voltage. Alternatively, the subthreshold region includes a region that can be regarded as any region of the above description.

A drain current when a transistor operates in the subthreshold region is referred to as a subthreshold current. The subthreshold current increases exponentially with respect to a gate voltage, regardless of a drain voltage. The circuit operation using the subthreshold current can reduce the influence of a variation in the drain voltage.

The transistor Tr2 functions as a switching element. When the potential of the first terminal of the transistor Tr2 is higher than the potential of the second terminal of the transistor Tr2, the first terminal of the transistor Tr2 functions as a drain and the second terminal of the transistor Tr2 functions as a source. Since a back gate of the transistor Tr2 and the second terminal of the transistor Tr2 are electrically connected to each other, a back gate-source voltage becomes 0 V. Thus, when the threshold voltage of the transistor Tr2 is within an appropriate range and Vdd is input to the gate of the transistor Tr2, the transistor Tr2 is turned on; when Vss is input to the gate of the transistor Tr2, the transistor Tr2 is turned off. Specifically, when the transistor Tr2 is in the on state, a current in the subthreshold region flows from the second terminal of the transistor Tr1 to the terminal T1, and when the transistor Tr2 is in the off state, the current does not flow from the second terminal of the transistor Tr1 to the terminal T1.

Figure 7B:
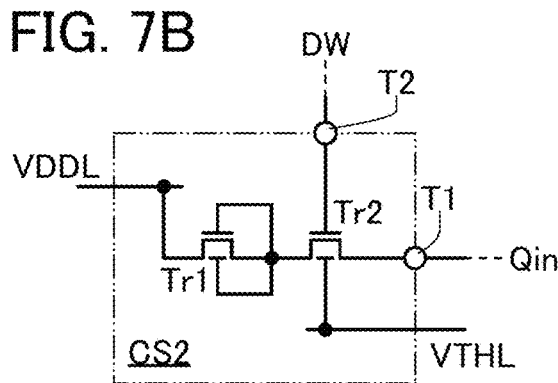

The circuit that can be used for the current source CS included in the DA conversion portion 130 in FIG. 6A is not limited to the current source CS1 in FIG. 7A. For example, the current source CS1 has a structure in which the back gate of the transistor Tr2 and the second terminal of the transistor Tr2 are electrically connected to each other; however, the back gate of the transistor Tr2 may be electrically connected to another wiring. Such a structure example is illustrated in FIG. 7B. In a current source CS2 illustrated in FIG. 7B, the back gate of the transistor Tr2 is electrically connected to a wiring VTHL. When the wiring VTHL of the current source CS2 is electrically connected to an external circuit or the like, the back gate of the transistor Tr2 can be supplied with the predetermined potential from the external circuit or the like through the wiring VTHL. This can change the threshold voltage of the transistor Tr2. In particular, the off-state current of the transistor Tr2 can be reduced by an increase in the threshold voltage of the transistor Tr2.

Figure 7C:
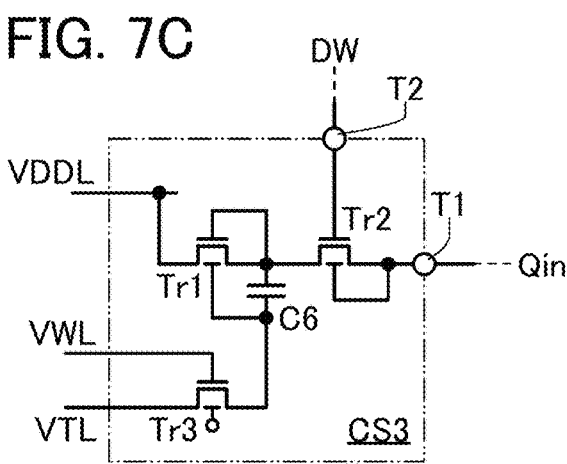

The current source CS1 has a structure in which the back gate of the transistor Tr1 and the second terminal of the transistor Tr1 are electrically connected to each other; however, the voltage between the back gate of the transistor Tr1 and the second terminal of the transistor Tr1 may be held with a capacitor. Such a structure example is illustrated in FIG. 7C. A current source CS3 illustrated in FIG. 7C includes a transistor Tr3 and a capacitor C6 in addition to the transistor Tr1 and the transistor Tr2.

The current source CS3 is different from the current source CS1 in that the second terminal of the transistor Tr1 and the back gate of the transistor Tr1 are electrically connected to each other through the capacitor C6, and the back gate of the transistor Tr1 and a first terminal of the transistor Tr3 are electrically connected to each other.

The current source CS3 in which a second terminal of the transistor Tr3 is electrically connected to a wiring VTL and a gate of the transistor Tr3 is electrically connected to a wiring VWL can make a conduction state between the wiring VTL and the back gate of the transistor Tr1 by supplying Vdd to the wiring VWL and turning on the transistor Tr3. Therefore, a predetermined potential can be input to the back gate of the transistor Tr1 from the wiring VTL. When the transistor Tr3 is turned off, the voltage between the second terminal of the transistor Tr1 and the back gate of the transistor Tr1 can be held with the capacitor C6. The threshold voltage of the transistor Tr1 can be changed when the voltage supplied to the back gate of the transistor Tr1 through the wiring VTL is controlled, and the threshold voltage of the transistor Tr1 can be fixed with the transistor Tr3 and the capacitor C6. Controlling the potential of the wiring VTL can control the current value per bit flowing to the terminal T1.

Figure 7D:
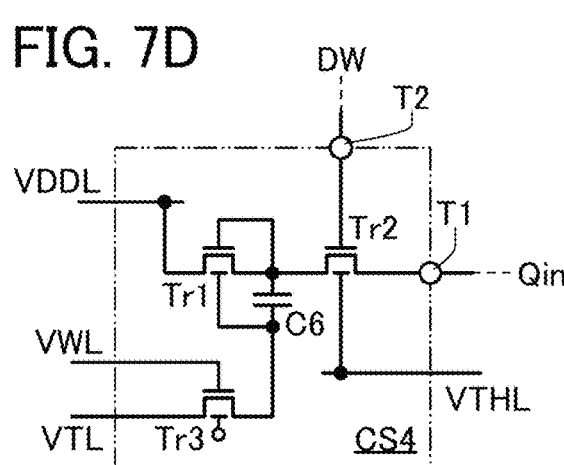

For example, as the circuit that can be used as the current source CS included in the DA conversion portion 130 in FIG. 6A, a current source CS4 illustrated in FIG. 7D may be used. The current source CS4 is different from the current source CS3 in FIG. 7C in that the back gate of the transistor Tr2 is electrically connected not to the second terminal of the transistor Tr2 but to the wiring VTHL. That is, like the current source CS2 in FIG. 7B, the current source CS4 can change the threshold voltage of the transistor Tr2 by controlling the potential supplied to the back gate of the transistor Tr2 through the wiring VTHL.

When a high current flows between the first terminal and the second terminal of the transistor Tr1 in the current source CS4, the on-state current of the transistor Tr2 needs to be increased to supply the current from the terminal T1 to the outside of the current source CS4. In this case, in the current source CS4, the wiring VTHL is supplied with Vdd to decrease the threshold voltage of the transistor Tr2 and increase the on-state current of the transistor Tr2, whereby a high current flowing between the first terminal and the second terminal of the transistor Tr1 can be supplied from the terminal T1 to the outside of the current source CS4.

Furthermore, in order to reduce the current flowing between the first terminal and the second terminal of the transistor Tr1, the potential supplied to the wiring VTHL is reduced. Alternatively, negative voltage may be supplied to the wiring VTHL.

Figure 7E:
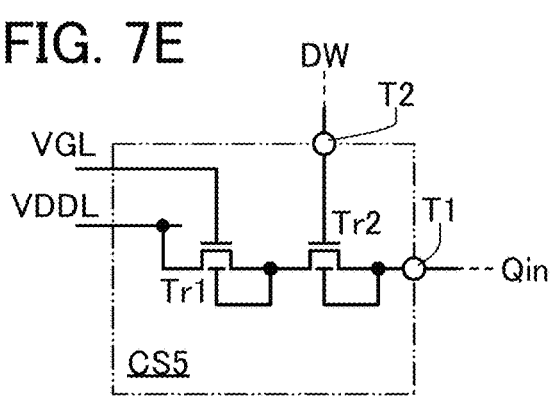

As a circuit that can be used as the current source CS included in the DA conversion portion 130 in FIG. 6A, a current source CS5 illustrated in FIG. 7E may be used. The current source CS5, which is a modification example of the current source CS1, is different from the current source CS1 in that the gate of the transistor Tr1 is electrically connected not to the second terminal of the transistor Tr1 but to a wiring VGL. For example, the wiring VGL is supplied with a potential that enables the transistor Tr1 to operate in the subthreshold region. Controlling the potential of the wiring VGL can control the current value per bit flowing to the terminal T1.

The use of the current source CS1 to the current source CS5 illustrated in FIG. 7A to FIG. 7E as the current sources CS included in the DA conversion portion 130 in FIG. 6A enables the DA conversion portion 130 to output a current corresponding to the K-bit first data.

Figure 6B:
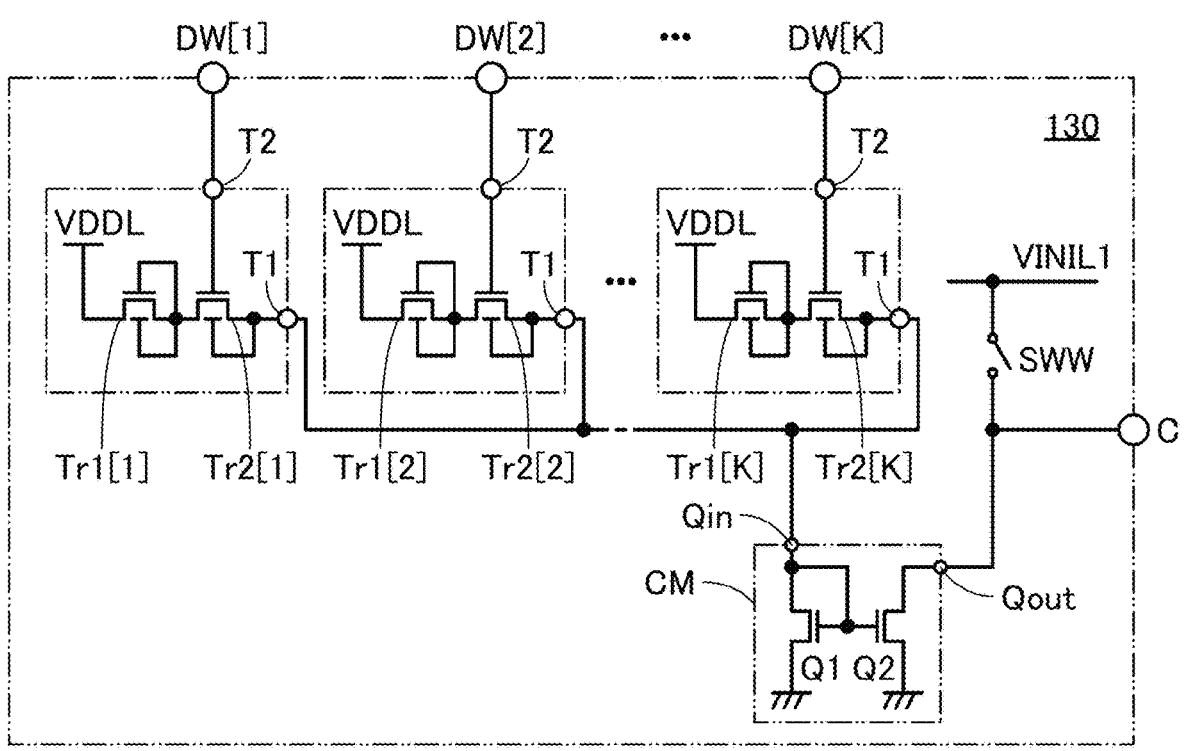

As the DA conversion portion 130, a circuit illustrated in FIG. 6B may be used. In the DA conversion portion 130 in FIG. 6B, one current source CS1 in FIG. 7A is connected to each of the terminal DW[1] to terminal DW[K].

When the channel lengths of a transistor Tr1[1] to a transistor Tr1[K] are the same, the channel width of the transistor Tr1[1] is w[1], the channel width of the transistor Tr1[2] is w[2], and the channel width of the transistor Tr1[K] is w[K], the ratio between the channel widths is w[1]:w[2]: w[K]=1:2:2$^{K-1}$. Since a current flowing between a source and a drain of a transistor that operates in the subthreshold region is proportional to the channel width, the DA conversion portion 130 illustrated in FIG. 6B can output a current corresponding to the K-bit first data like the DA conversion portion 130 in FIG. 6A.

Note that as the transistor Tr1 (including the transistor Tr1[1] to the transistor Tr1[K]), the transistor Tr2 (including a transistor Tr2[1] to a transistor Tr2[K]), and the transistor Tr3, OS transistors are preferably used.

In an OS transistor, an extremely low current can flow as a drain current per micrometer of channel width of lower than $1\times10^{-20}$ A, lower than $1\times10^{-22}$ A, or lower than $1\times10^{-24}$ A when the gate voltage is lower than the threshold voltage of the transistor. In addition, in an OS transistor, a drain current per micrometer of channel width of lower than or equal to $1.0\times10^{-8}$ A, lower than or equal to $1.0\times10^{-12}$ A, or lower than or equal to $1.0\times10^{-15}$ A can flow when the gate voltage is the threshold voltage of the transistor. For example, in an OS transistor, a drain current per micrometer of channel width within a range of $1\times10^{-24}$ A to $1.0\times10^{-8}$ A, inclusive, can flow in the subthreshold region.

In an OS transistor, a subthreshold current with different magnitude can flow within a range of a gate voltage in which the transistor operates in the subthreshold region. That is, an OS transistor can have a large range of the gate voltage in which the transistor operates in the subthreshold region. Specifically, when the threshold voltage of an OS transistor is $V_{th}$, a circuit operation using the gate voltage in the voltage range of ($V_{th}$-1.0 V) to $V_{th}$, inclusive, or ($V_{th}$-0.5 V) to $V_{th}$, inclusive, is possible in the subthreshold region.

Meanwhile, a Si transistor has a high off-state current and a narrow range of the gate voltage in which the transistor operates in the subthreshold region. In the case of utilizing a subthreshold current, an OS transistor can perform a circuit operation in a wider range of the gate voltage than a Si transistor.

Therefore, as a transistor operating in the subthreshold region, an OS transistor is preferably used. Note that as a transistor operating in the subthreshold region, a transistor other than an OS transistor may be used depending on the purpose or the usage. An OS transistor and a transistor other than an OS transistor may be used in combination.

A modification example of the DA conversion portion 130 illustrated in FIG. 6A is illustrated in FIG. 8A. The DA conversion portion 130 illustrated in FIG. 8A is different from the DA conversion portion 130 illustrated in FIG. 6A in not including the current mirror circuit CM.

FIG. 8B illustrates a structure example of a current source CS6 that can be used as the current source CS in the DA conversion portion 130 illustrated in FIG. 8A.

The current source CS6 illustrated in FIG. 8B includes the transistor Tr1 and the transistor Tr2. The first terminal of the transistor Tr1 is supplied with Vss or GND. The second terminal of the transistor Tr1 is electrically connected to the first terminal of the transistor Tr2. The second terminal of the transistor Tr2 is electrically connected to the terminal T1.

The gate of the transistor Tr1 is electrically connected to the wiring VGL. For example, the wiring VGL is supplied with a potential that enables the transistor Tr1 to operate in the subthreshold region. Controlling the potential of the wiring VGL can control the current value per bit flowing to the terminal T1.

The gate of the transistor Tr2 is electrically connected to the terminal T2. The back gate of the transistor Tr1 and the back gate of the transistor Tr2 are electrically connected to the first terminal of the transistor Tr1.

FIG. 8C illustrates a structure example of a current source CS7 that is a modification example of the current source CS6. In the current source CS7, the gate and the back gate of the transistor Tr1 are electrically connected to each other, and the gate and the back gate of the transistor Tr2 are electrically connected to each other. When the gate and the back gate are electrically connected to each other, the on-state current of the transistor can be increased.

Furthermore, as the current source CS in the DA conversion portion 130 illustrated in FIG. 8A, the current source CS8 illustrated in FIG. 8D can be used. In the current source CS8, a p-channel transistor is used as the transistor Tr1, an n-channel transistor is used as the transistor Tr2.

In the current source CS8, the first terminal of the transistor Tr1 is supplied with Vss or GND. The second terminal of the transistor Tr1 is electrically connected to the first terminal of the transistor Tr2. The second terminal of the transistor Tr2 is electrically connected to the terminal T1. The gate and the back gate of the transistor Tr1 are electrically connected to the second terminal of the transistor Tr1. The back gate of the transistor Tr2 is electrically connected to the first terminal of the transistor Tr2. Note that although there is a difference in the direction of a current flowing to the terminal T1, the current source CS8 can operate in a manner similar to that of the current source CS1.

Furthermore, as the current source CS in the DA conversion portion 130 illustrated in FIG. 8A, a current source CS9 illustrated in FIG. 8E may be used.

The current source CS9 is different from the current source CS8 in that the second terminal of the transistor Tr1 and the back gate of the transistor Tr1 are electrically connected to each other through the capacitor C6, and the back gate of the transistor Tr1 and the first terminal of the transistor Tr3 are electrically connected to each other.

In the current source CS9, the second terminal of the transistor Tr3 is electrically connected to the wiring VTL, and the gate of the transistor Tr3 is electrically connected to the wiring VWL. In the current source CS9, the wiring VWL is supplied with Vdd to turn on the transistor Tr3, so that a conduction state can be made between the wiring VTL and the back gate of the transistor Tr1. Therefore, a predetermined potential can be input to the back gate of the transistor Tr1 from the wiring VTL through the transistor Tr3. When the transistor Tr3 is turned off, voltage between the second terminal of the transistor Tr1 and the back gate of the transistor Tr1 can be held with the capacitor C6. The threshold voltage of the transistor Tr1 can be changed when the voltage supplied to the back gate of the transistor Tr1 through the wiring VTL is controlled, and the threshold voltage of the transistor Tr1 can be fixed with the transistor Tr3 and the capacitor C6.

Although there is a difference in the direction of a current flowing to the terminal T1, the current source CS9 can operate in a manner similar to that of the current source CS3.

Furthermore, as the current source CS in the DA conversion portion 130 illustrated in FIG. 8A, a current source CS10 illustrated in FIG. 8F may be used. The current source CS10, which is a modification example of the current source CS8, is different from the current source CS8 in that the gate of the transistor Tr1 is electrically connected not to the second terminal of the transistor Tr1 but to the wiring VGL. For example, the wiring VGL is supplied with a potential that enables the transistor Tr1 to operate in the subthreshold region. Controlling the potential of the wiring VGL can control the current value per bit flowing to the terminal T1.

In the current source CS8 to the current source CS10, the back gate of the transistor Tr2 may be electrically connected not to the first terminal of the transistor Tr2 but to the wiring VTHL as in the current source CS2 and the current source CS4. The threshold voltage of the transistor Tr2 can be changed by controlling the potential supplied to the back gate of the transistor Tr2 through the wiring VTHL.

The DA conversion portion 130 illustrated in FIG. 8A can have a structure similar to that of the DA conversion portion 130 illustrated in FIG. 6B.

This embodiment can be combined with the other embodiments described in this specification and the like as appropriate.

Embodiment 2

The semiconductor device of one embodiment of the present invention can be used for an arithmetic circuit that performs arithmetic operation of a neural network. In this embodiment, the arithmetic circuit performing arithmetic operation of a neural network is described.

<Hierarchical Neural Network>

Figure 9A:
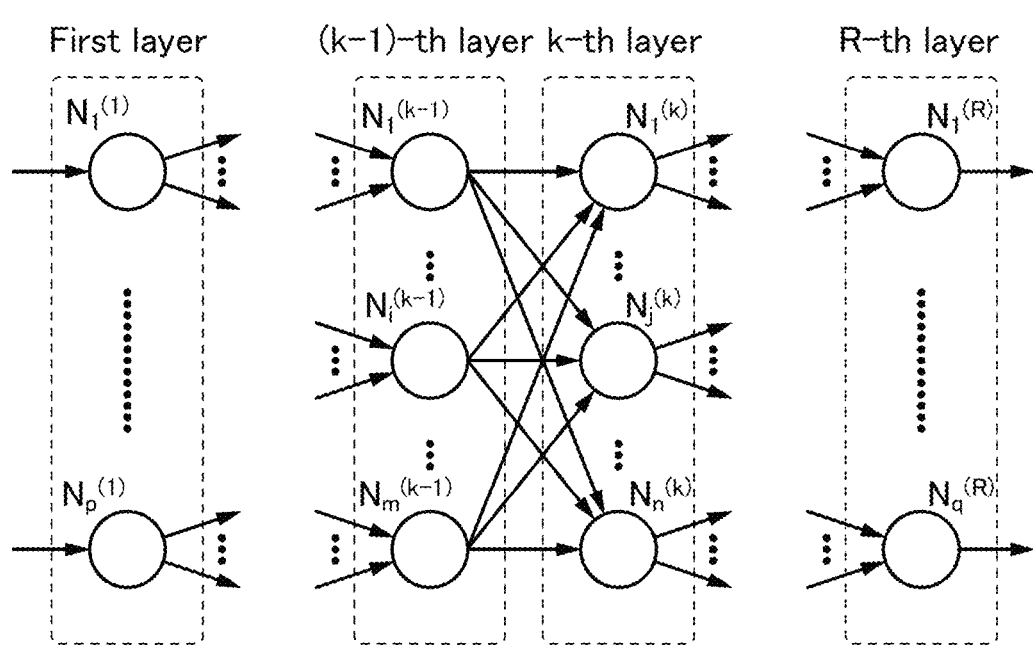
FIG. 9A and FIG. 9B are diagrams illustrating hierarchical neural networks.

First, a hierarchical neural network is described. A hierarchical neural network includes one input layer, one or a plurality of intermediate layers (hidden layers), and one output layer, for example, and is configured with a total of at least three layers. A hierarchical neural network 300 illustrated in FIG. 9A shows one example, and the neural network 300 includes a first layer to an R-th layer (here, R can be an integer greater than or equal to 4). Specifically, the first layer corresponds to the input layer, the R-th layer corresponds to the output layer, and the other layers correspond to the intermediate layers. Note that FIG. 9A illustrates the (k−1)-th layer and the k-th layer (here, k is an integer greater than or equal to 3 and less than or equal to R−1) as the intermediate layers, and does not illustrate the other intermediate layers.

Each of the layers of the neural network 300 includes one or a plurality of neurons. In FIG. 9A, the first layer includes a neuron $$N_1^{(1)}$$

to a neuron $$N_p^{(1)}$$

(p is an integer greater than or equal to 1); the (k−1)-th layer includes a neuron $$N_1^{(k-1)}$$

to a neuron $$N_m^{(k-1)}$$

(m is an integer greater than or equal to 1); the k-th layer includes a neuron $$N_1^{(k)}$$

to a neuron $$N_n^{(k)}$$

(n is an integer greater than or equal to 1); and the R-th layer includes a neuron $$N_1^{(R)}$$

to a neuron $$N_q^{(R)}$$

(q is an integer greater than or equal to 1).

Note that FIG. 9A illustrates a neuron $$N_i^{(k-1)}$$

US 12,592,714 B2

31                                                      32

(i is an integer greater than or equal to 1 and less than or equal to m) in the (k−1)-th layer and a neuron $$N_j^{(k)}$$

(j is an integer greater than or equal to 1 and less than or equal to n) in the k-th layer, in addition to the neuron $$N_1^{(1)},$$

the neuron $$N_p^{(1)},$$

the neuron $$N_1^{(k-1)},$$

the neuron $$N_m^{(k-1)},$$

the neuron $$N_1^{(k)},$$

the neuron $$N_n^{(k)},$$

the neuron $$N_1^{(R)},$$

and the neuron $$N_q^{(R)};$$

the other neurons are not illustrated.

Next, signal transmission from a neuron in one layer to a neuron in the subsequent layer and signals input to and output from the neurons are described. Note that description here is made focusing on the neuron $$N_j^{(k)}$$

in the k-th layer.

Figure 9B:
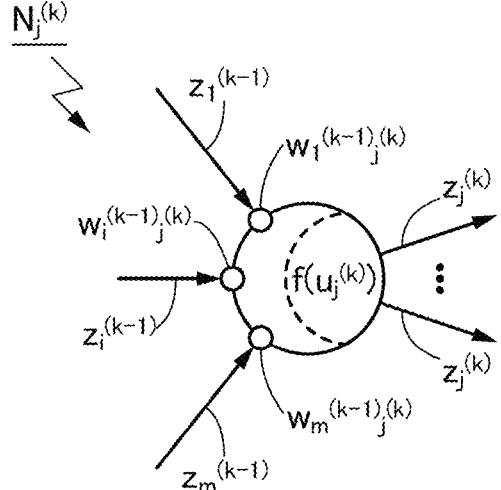

FIG. 9B illustrates the neuron $$N_j^{(k)}$$

in the k-th layer, signals input to the neuron $$N_j^{(k)},$$

and a signal output from the neuron $$N_j^{(k)}.$$

Specifically, $$z_1^{(k-1)} \text{ to } z_m^{(k-1)}$$

that are output signals from the neuron $$N_1^{(k-1)}$$

to the neuron $$N_m^{(k-1)}$$

in the (k−1)-th layer are output to the neuron $$N_j^{(k)}.$$

Then, the neuron $$N_j^{(k)}$$

generates $$z_j^{(k)}$$

in accordance with $$Z_1^{(k-1)} \text{ to } z_m^{(k-1)},$$

and outputs $$z_j^{(k)}$$

as the output signal to the neurons in the (k+1)-th layer (not illustrated).

The efficiency of transmitting a signal input from a neuron in one layer to a neuron in the subsequent layer depends on the connection strength (hereinafter, referred to as weight coefficient) of the synapse that connects the neurons to each other. In the neural network 300, a signal output from a neuron in one layer is multiplied by a corresponding weight coefficient and then is input to a neuron in the subsequent layer. When i is an integer greater than or equal to 1 and less than or equal to m and the weight coefficient of the synapse between the neuron $$N_i^{(k-1)}$$

in the (k−1)-th layer and the neuron $$N_j^{(k)}$$

in the k-th layer is $$w_i^{(k-1)(k)}{}_j,$$

a signal input to the neuron $$N_j^{(k)}$$

in the k-th layer can be expressed by Formula (1.1).

[Formula 1]

$$w_i^{(k-1)(k)}{}_j \cdot z_i^{(k-1)} \qquad (1.1)$$

That is, when the signals are transmitted from the neuron $$N_1^{(k-1)}$$

to the neuron $$N_m^{(k-1)}$$

in the (k−1)-th layer to the neuron $$N_j^{(k)}$$

in the k-th layer, the signals $$Z_1^{(k-1)} \text{ to } z_m^{(k-1)}$$

are multiplied by the corresponding weight coefficients $$\left( w_1^{(k-1)(k)}{}_j \text{ to } w_m^{(k-1)(k)}{}_j \right).$$

Then, $$w_1^{(k-1)(k)}{}_j \cdot z_1^{(k-1)}$$

to $$w_m^{(k-1)(k)}{}_j \cdot z_m^{(k-1)}$$

are input to the neuron $$N_j^{(k)}$$

in the k-th layer. At this time, the total sum $$u_j^{(k)}$$

of the signals input to the neuron $$N_j^{(k)}$$

in the k-th layer is expressed by Formula (1.2).

[Formula 2]

$$u_j^{(k)} = \sum_{i=1}^{m} w_i^{(k-1)(k)}{}_k \cdot z_i^{(k-1)} \qquad (1.2)$$

In addition, a bias may be applied to the product-sum result of the weight coefficients $$w_1^{(k-1)(k)}{}_j \text{ to } w_m^{(k-1)(k)}{}_j$$

and the signals $$z_1^{(k-1)} \text{ to } z_m^{(k-1)}$$

of the neurons. When the bias is denoted by b, Formula (1.2) can be rewritten as the following Formula (1.3).

[Formula 3]

$$u_j^{(k)} = \sum_{i=1}^{m} w_i^{(k-1)(k)}{}_j \cdot z_i^{(k-1)} + b \qquad (1.3)$$

The neuron $$N_j^{(k)}$$

generates the output signal $$z_j^{(k)}$$

in accordance with $$u_j^{(k)}.$$

Here, the output signal $$z_j^{(k)}$$

from the neuron $$N_j^{(k)}$$

is defined by the following Formula (1.4).

[Formula 4]

$$z_j^{(k)} = f\!\left(u_j^{(k)}\right) \qquad\qquad (1.4)$$

A function $$f\!\left(u_j^{(k)}\right)$$

is an activation function in a hierarchical neural network, and a step function, a linear ramp function, a sigmoid function, or the like can be used. Note that the activation function may be the same or different among all neurons. In addition, the neuron activation function may be the same or different between the layers.

The signal output from the neuron in each layer, the weight coefficient w, and the bias b may be each an analog value, a binary or higher-level discrete value, or a digital value. The digital value has one or more bits. For example, in the case where the signal output from the neuron in each layer is an analog value, a linear ramp function or a sigmoid function is used as the activation function. Furthermore, in the case where the signal output from the neuron in each layer is a digital value with one bit (binary value), for example, a step function converting the output into −1 or 1 or a step function converting the output into 0 or 1 is used.

Furthermore, in the case where the signal output from the neuron in each layer is a ternary value, for example, a step function converting the output into −1, 0, or 1 or a step function converting the output into 0, 1, or 2 is used as the activation function. Moreover, in the case where the signal output from the neuron in each layer is a quinary value, for example, a step function converting the output into −2, −1, 0, 1, or 2 may be used as the activation function.

Note that by using a digital value as at least one of the signal output from the neuron in each layer, the weight coefficient w, and the bias b, a reduction in the circuit scale, a reduction in power consumption, or an increase in arithmetic operation speed can be achieved, for example. Moreover, using an analog value as at least one of the signal output from the neuron in each layer, the weight coefficient w, and the bias b enables an increase of the arithmetic operation accuracy.

The neural network 300 performs operation in which by input of an input signal to the first layer (the input layer), output signals are sequentially generated in the layers from the first layer (the input layer) to the last layer (the output layer) according to Formula (1.1), Formula (1.2) (or Formula (1.3)), and Formula (1.4) on the basis of the signals input from the previous layers, and the output signals are output to the subsequent layers. The signal output from the last layer (the output layer) corresponds to the calculation results of the neural network 300.

Structure Example of Arithmetic Operation Circuit

Described here is an example of an arithmetic circuit that is capable of performing the arithmetic operation of Formula (1.2) (or Formula (1.3)) and Formula (1.4) in the above-described neural network 300. Note that in the arithmetic circuit, for example, a weight coefficient of a synapse circuit of the neural network 300 has two levels (e.g., a combination of "−1" and "+1" or a combination of "0" and "+1"), three levels (e.g., a combination of "−1", "0", and "1"), or multi levels of four or more levels (e.g., in the case of five levels, a combination of "−2", "−1", "0", "1", and "2"), and a neuron activation function is a function that outputs two levels (e.g., a combination of "−1" and "+1" or a combination of "0" and "+1"), three levels (e.g., a combination of "−1", "0", and "1"), or multi levels of four or more levels (e.g., in the case of four levels, a combination of "0", "1", "2", and "3"). Note that the weight coefficient of the synapse circuit of the neural network 300 and the value of a signal input from a neuron in one layer to a neuron in the subsequent layer are not limited to digital values, and an analog value can be used as at least one of them.

Figures 10A, 10B:
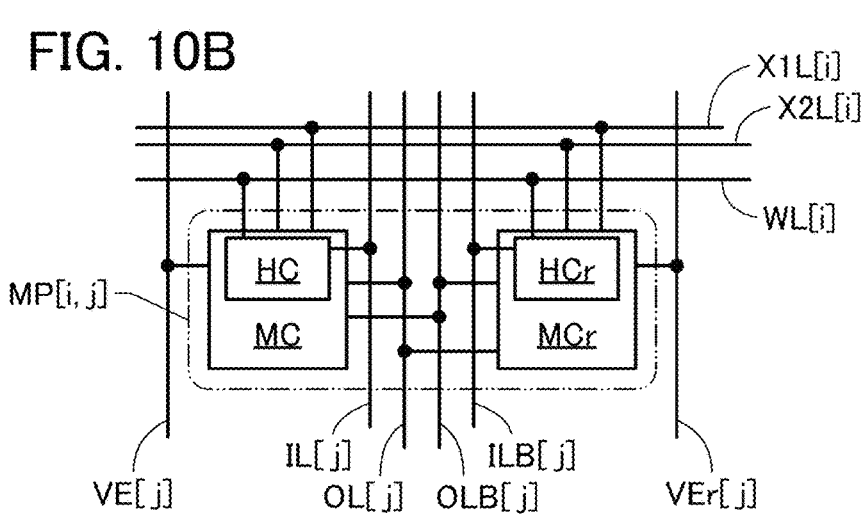
FIG. 10A and FIG. 10B are diagrams illustrating a semiconductor device.

An arithmetic circuit 310 illustrated in FIG. 10A is a semiconductor device including an array portion ALP, a circuit ILD, a circuit WLD, a circuit XLD, and a circuit AFP, for example. The arithmetic circuit 310 is a circuit that processes the signals $$z_1^{(k-1)} \text{ to } z_m^{(k-1)}$$

input to the neuron $$N_1^{(k)}$$

to the neuron $$N_n^{(k)}$$

in the k-th layer in FIG. 9A and FIG. 9B and generates signals $$z_1^{(k)} \text{ to } z_n^{(k)}$$

respectively output from the neuron $$N_1^{(k)}$$

to the neuron $$N_n^{(k)}.$$

Note that the whole or part of the arithmetic circuit 310 may be used for applications other than a neural network and AI. For example, in the case where product-sum operation processing or matrix operation processing is performed in calculation for graphics, scientific calculation, or the like, the processing may be performed using the whole or part of the arithmetic circuit 310. In other words, the whole or part of the arithmetic circuit 310 may be used for not only calculation for AI but also general calculation.

The circuit ILD is electrically connected to a wiring IL[1] to a wiring IL[n] and a wiring ILB[1] to a wiring ILB[n], for example. The circuit WLD is electrically connected to a wiring WLS[1] to a wiring WLS[m], for example. The circuit XLD is electrically connected to a wiring XLS[1] to a wiring XLS[m], for example. The circuit AFP is electrically connected to a wiring OL[1] to a wiring OL[n] and a wiring OLB[1] to a wiring OLB[n], for example.

<<Array Portion ALP>>

The arithmetic circuit 310 illustrated in FIG. 10A includes the array portion ALP in which circuits MP are arranged in a matrix of m×n. Note that in FIG. 10A, the circuit MP positioned in the i-th row and the j-th column (here, i is an integer greater than or equal to 1 and less than or equal to m, and j is an integer greater than or equal to 1 and less than or equal to n) is denoted by a circuit MP[i,j]. Note that FIG. 10A illustrates only the circuit MP[1,1], the circuit MP[m,1], the circuit MP[i,j], the circuit MP[1,*n*], and the circuit MP[m,n] and does not illustrate the other circuits MP.

The circuit MP[i,j] is electrically connected to a wiring IL[j], a wiring ILB[j], a wiring WLS[i], a wiring XLS[i], a wiring OL[j], and a wiring OLB[j], for example.

The circuit MP[i,j] has a function of holding a weight coefficient (also referred to as first data) between the neuron $$N_i^{(k-1)}$$

and the neuron $$N_j^{(k)},$$

for example. Specifically, the circuit MP[i,j] holds information (e.g., a potential, a resistance value, or a current value) corresponding to a weight coefficient input from the wiring IL[j] and the wiring ILB[j]. In addition, the circuit MP[i,j] has a function of outputting the product of the first data and $$z_i^{(k-1)}$$

(also referred to as second data) that is a signal output from the neuron $$N_i^{(k-1)}.$$

As a specific example, when the second data is input from the wiring XLS[i], the circuit MP[i,j] outputs, to the wiring OL[j] and the wiring OLB[j], a current corresponding to the product of the first data and the second data. Note that although an example of the case where the wiring IL[j] and the wiring ILB[j] are provided is illustrated in FIG. 10A, one embodiment of the present invention is not limited thereto. Only one of the wiring IL[j] and the wiring ILB[j] may be provided.

<<Circuit ILD>>

The circuit ILD has a function of inputting, to the circuit MP[1,1] to the circuit MP[m,n], information (e.g., a potential, a resistance value, or a current value) corresponding to first data $$w_1^{(k-1)(k)}{}_1$$

to first data $$w_m^{(k-1)(k)}{}_n$$

that are weight coefficients, through the wiring IL[1] to the wiring IL[n] and the wiring ILB[1] to the wiring ILB[n], for example. As a specific example, the circuit ILD supplies, to the circuit MP[i,j], information (e.g., a potential, a resistance value, or a current value) corresponding to the first data $$w_i^{(k-1)(k)}{}_j$$

that is a weight coefficient, through the wiring IL[j] and the wiring ILB[j].

<<Circuit XLD>>

The circuit XLD has a function of supplying, to the circuit MP[1,1] to the circuit MP[m,n], the second data $$z_1^{(k-1)}.$$

to the second data $$z_m^{(k-1)}$$

output from the neuron $$N_1^{(k-1)}$$

to a neuron $$N_m^{(k)},$$

through the wiring XLS[1] to the wiring XLS[m], for example. Specifically, the circuit XLD supplies, to the circuit MP[i,1] to the circuit MP[i,n], information (e.g., a potential or a current value) corresponding to the second data $$z_i^{(k-1)}$$

output from the neuron $$N_i^{(k-1)},$$

through the wiring XLS[i].
<<Circuit WLD>>
The circuit WLD has a function of selecting the circuit MP to which information (e.g., a potential, a resistance value, or a current value) corresponding to the first data input from the circuit ILD is to be written, for example. In the case where information (e.g., a potential, a resistance value, or a current value) is written to the circuit MP[i,1] to the circuit MP[i,n] positioned in the i-th row of the array portion ALP, for example, the circuit WLD supplies, to the wiring WLS[i], a signal for bringing writing switching elements included in the circuit MP[i,1] to the circuit MP[i,n] into an on state or an off state, and supplies, to the other wirings WLS, a potential for bringing writing switching elements included in the circuits MP in rows other than the i-th row into an off state, for example. Although an example of the case where the wiring WLS[i] is provided is described, one embodiment of the present invention is not limited thereto. For example, in addition to the wiring WLS[i], a wiring transmitting an inverted signal of a signal input to the wiring WLS[i] may be additionally provided.
<<Circuit AFP>>
The circuit AFP includes a circuit ACTF[1] to a circuit ACTF[n], for example. The circuit ACTF[j] is electrically connected to the wiring OL[j] and the wiring OLB[j], for example. The circuit ACTF[j] generates, for example, a signal corresponding to information (e.g., a potential or a current value) input from the wiring OL[j] and the wiring OLB[j]. The signal corresponds to the signal $$z_j^{(k)}$$

output from the neuron $$N_j^{(k)}.$$

For example, the circuit ACTF[1] to the circuit ACTF[n] may have a function of converting an analog signal into a digital signal. Therefore, the AD converter 100 can be used for each of the circuit ACTF[1] to the circuit ACTF[n].
Alternatively, for example, the circuit ACTF[1] to the circuit ACTF[n] may have a function of amplifying an analog signal and outputting the amplified signal, i.e., a function of converting output impedance. Alternatively, for example, the circuit ACTF[1] to the circuit ACTF[n] may have a function of converting a current or a charge into a voltage. Alternatively, the circuit ACTF[1] to the circuit ACTF[n] may have functions of initializing the potentials of the wirings OL and the wirings OLB electrically connected to the circuit ACTF[1] to the circuit ACTF[n].
<<Circuit MP>>
FIG. 10B illustrates a structure example of the circuit MP[i,j]. The circuit MP[i,j] includes a circuit MC and a circuit MCr. The circuit MC and the circuit MCr are circuits that calculate the product of a weight coefficient and an input signal from a neuron (an arithmetic value) in the circuit MP. The circuit MC can have a structure similar to that of the circuit MCr or a structure different from that of the circuit MCr. Thus, "r" is added to the reference numeral to differentiate the circuit MCr from the circuit MC. In addition, "r" is added to the reference signs of circuit elements included in the circuit MCr and described below.
The circuit MC includes a holding portion HC and the circuit MCr includes a holding portion HCr. The holding portion HC and the holding portion HCr each have a function of holding information (e.g., a potential, a resistance value, or a current value). The first data $$w_i^{(k-1)} j^{(k)}$$

set to the circuit MP[i,j] is determined in accordance with information held in the holding portion HC and the holding portion HCr. Therefore, the holding portion HC and the holding portion HCr are respectively electrically connected to the wiring IL[j] and the wiring ILB[j] that supply information corresponding to the first data $$w_i^{(k-1)} j^{(k)}.$$

In FIG. 10B, the circuit MP[i,j] is electrically connected to a wiring VE[j] and a wiring VEr[j]. The wiring VE[j] and the wiring VEr[j] each function as a wiring for supplying a constant voltage. In addition, the wiring VE[j] also functions as a wiring for releasing a current supplied from the wiring OL through the circuit MC. In addition, the wiring VEr[j] also functions as a wiring for releasing a current supplied from the wiring OLB through the circuit MCr.
A wiring WL[i] illustrated in FIG. 10B corresponds to the wiring WLS[i] in FIG. 10A. The wiring WL[i] is electrically connected to each of the holding portion HC and the holding portion HCr. To write information (e.g., a potential, a resistance value, or a current value) corresponding to the first data $$w_i^{(k-1)} j^{(k)}$$

to the holding portion HC and the holding portion HCr included in the circuit MP[i,j], a predetermined potential is supplied to the wiring WL[i] so that electrical continuity is established between the wiring IL[j] and the holding portion HC and electrical continuity is established between the wiring ILB[j] and the holding portion HCr. Then, the potential or the like corresponding to the first data $$w_i^{(k-1)} j^{(k)}$$

is supplied to each of the wirings IL[j] and ILB[j], whereby the potential or the like can be input to each of the holding portion HC and the holding portion HCr. After that, a predetermined potential is supplied to the wiring WL[i], so that electrical continuity is not established between the wiring IL[j] and the holding portion HC and electrical continuity is not established between the wiring ILB[j] and the holding portion HCr. Thus, the potential or the like corresponding to the first data $$w_i^{(k-1)} f^{(k)}$$

is held in each of the holding portion HC and the holding portion HCr.

The case where the first data $$w_i^{(k-1)} f^{(k)}$$

has any one of three values "−1", "0", and "1" is considered, for example. In the case where the first data $$w_i^{(k-1)} f^{(k)}$$

is "1", for example, a predetermined potential is held in the holding portion HC so that a current corresponding to "1" flows from the wiring OL[j] to the wiring VE[j] through the circuit MC, and a potential $V_0$ is held in the holding portion HCr so that a current does not flow from the wiring OLB[j] to the wiring VEr[j] through the circuit MCr. In the case where the first data $$w_i^{(k-1)} f^{(k)}$$

is "−1", for example, the potential $V_0$ is held in the holding portion HC so that a current does not flow from the wiring OL[j] to the wiring VE[j] through the circuit MC, and a predetermined potential is held in the holding portion HCr so that a current corresponding to "−1" flows from the wiring OLB[j] to the wiring VEr[j] through the circuit MCr. In the case where the first data $$w_i^{(k-1)} f^{(k)}$$

is "0", for example, the potential $V_0$ is held in the holding portion HC so that a current does not flow from the wiring OL[j] to the wiring VE[j] through the circuit MC, and the potential $V_0$ is held in the holding portion HCr so that a current does not flow from the wiring OLB[j] to the wiring VEr[j] through the circuit MC. Note that the potential $V_0$ can be Vss, for example.

As another example, the case where the first data $$w_i^{(k-1)} f^{(k)}$$

is an analog value, specifically, a "negative analog value", "0", or a "positive analog value" is considered. In the case where the first data $$w_i^{(k-1)} f^{(k)}$$

is a "positive analog value", a predetermined potential is held in the holding portion HC so that an analog current corresponding to the "positive analog value" flows from the wiring OL[j] to the wiring VE[j] through the circuit MC, and the potential $V_0$ is held in the holding portion HCr so that a current does not flow from the wiring OLB[j] to the wiring VEr[j] through the circuit MCr. In the case where the first data $$w_i^{(k-1)} f^{(k)}$$

is a "negative analog value", the potential $V_0$ is held in the holding portion HC so that a current does not flow from the wiring OL[j] to the wiring VE[j] through the circuit MC, and a predetermined potential is held in the holding portion HCr so that an analog current corresponding to the "negative analog value" flows from the wiring OLB[j] to the wiring VEr[j] through the circuit MCr. In the case where the first data $$w_i^{(k-1)} f^{(k)}$$

is "0", the potential $V_0$ is held in the holding portion HC so that a current does not flow from the wiring OL[j] to the wiring VE[j] through the circuit MC, and the potential $V_0$ is held in the holding portion HCr so that a current does not flow from the wiring OLB[j] to the wiring VEr[j] through the circuit MC.

The circuit MC has a function of outputting a current or the like corresponding to information held in the holding portion HC to one of the wiring OL[j] and the wiring OLB[j], and the circuit MCr has a function of outputting a current or the like corresponding to information held in the holding portion HCr to the other of the wiring OL[j] and the wiring OLB[j]. For example, in the case where a first potential is held in the holding portion HC, the circuit MC supplies a current having a first current value from the wiring OL[j] or the wiring OLB[j] to the wiring VE, and in the case where a second potential is held in the holding portion HC, the circuit MC supplies a current having a second current value from the wiring OL[j] or the wiring OLB[j] to the wiring VE. Similarly, in the case where the first potential is held in the holding portion HCr, the circuit MCr supplies a current having the first current value from the wiring OL[j] or the wiring OLB[j] to the wiring VEr, and in the case where the second potential is held in the holding portion HCr, the circuit MCr supplies a current having the second current value from the wiring OL[j] or the wiring OLB[j] to the wiring VE. Note that the levels of the first current value and the second current value are each determined in accordance with the value of the first data $$w_i^{(k-1)} f^{(k)}.$$

Therefore, the first current value may be larger than or smaller than the second current value. In addition, one of the first current value and the second current value may be a zero current; that is, the current value may be 0. Moreover, the direction in which a current flows may be different between a current having the first current value and a current having the second current value.

In particular, in the case where the first data $$w_i^{(k-1)} j^{(k)}$$

has any one of three levels "−1", "0", and "1", the circuits MC and MCr are preferably configured so that one of the first current value and the second current value is 0. Note that in the case where the first data $$w_i^{(k-1)} j^{(k)}$$

is an analog value, e.g., a "negative analog value", "0", or a "positive analog value", the first current value or the second current value can be an analog value, for example.

In the case where a current flowing from the wiring OL[j] or the wiring OLB[j] to the wiring VE through the circuit MC and a current flowing from the wiring OL[j] or the wiring OLB[j] to the wiring VEr through the circuit MCr are equal to each other, a potential held in the circuit MC and a potential held in the circuit MCr might not be equal to each other because transistors therein sometimes have variations in their characteristics caused in a fabrication process or the like of the transistors. In the semiconductor device of one embodiment of the present invention, the amount of current flowing from the wiring OL[j] or the wiring OLB[j] to the wiring VE through the circuit MC can be almost equal to the amount of current flowing from the wiring OL[j] or the wiring OLB[j] to the wiring VEr through the circuit MCr, even when there are variations in characteristics of the transistors.

Note that in this specification and the like, a current, a voltage, or the like corresponding to information held in the holding portion HC and the holding portion HCr may be a positive current, a positive voltage, or the like, may be a negative current, a negative voltage, or the like, may be a zero current, a zero voltage, or the like; alternatively, a positive one, a negative one, and 0 may be mixed. That is, for example, the above description "the circuit MC has a function of outputting a current, a voltage, or the like corresponding to information held in the holding portion HC to one of the wiring OL[j] and the wiring OLB[j], and the circuit MCr has a function of outputting a current, a voltage, or the like corresponding to information held in the holding portion HCr to the other of the wiring OL[j] and the wiring OLB[j]" can be rephrased as a description "the circuit MC has a function of releasing a current, a voltage, or the like corresponding to information held in the holding portion HC from one of the wiring OL[j] and the wiring OLB[j], and the circuit MCr has a function of releasing a current, a voltage, or the like corresponding to information held in the holding portion HCr from the other of the wiring OL[j] and the wiring OLB[j]".

Wirings X1L[i] and X2L[i] illustrated in FIG. 10B correspond to the wiring XLS[i] in FIG. 10A. Note that, for example, the second data $$z_i^{(k-1)}$$

input to the circuit MP[i,j] is determined in accordance with the potentials, currents, or the like of the wirings X1L[i] and X2L[i]. Thus, potentials corresponding to the second data $$z_i^{(k-1)}$$

are input to the circuits MC and MCr through the wiring X1L[i] and the wiring X2L[i], for example.

The circuit MC is electrically connected to the wiring OL[j] and the wiring OLB[j], and the circuit MCr is electrically connected to the wiring OL[j] and the wiring OLB [j]. The circuit MC and the circuit MCr have functions of outputting currents, potentials, or the like corresponding to the product of the first data $$w_i^{(k-1)} j^{(k)}$$

and the second data $$z_i^{(k-1)}$$

to the wiring OL[j] and the wiring OLB[j] in accordance with the potentials, currents, or the like input to the wiring X1L[i] and the wiring X2L[i], for example. As a specific example, the destinations of the currents output from the circuits MC and MCr are determined in accordance with the potentials of the wiring X1L[i] and the wiring X2L[i]. For example, the circuit MC and the circuit MCr have a circuit structure in which a current output from the circuit MC flows to one of the wiring OL[j] and the wiring OLB[j], and a current output from the circuit MCr flows to the other of the wiring OL[j] and the wiring OLB[j]. That is, the currents output from the circuit MC and the circuit MCr flow to not the same wiring but different wirings. Note that for example, the currents from the circuit MC and the circuit MCr flow to neither the wiring OL[j] nor the wiring OLB[j] in some cases.

The case where the second data $$z_i^{(k-1)}$$

has any one of three values "−1", "0", and "1" is considered, for example. In the case where the second data $$z_i^{(k-1)}$$

is "1", for example, the circuit MP establishes a conduction state between the circuit MC and the wiring OL[j] and establishes a conduction state between the circuit MCr and the wiring OLB[j]. In the case where the second data $$z_i^{(k-1)}$$

is "−1", the circuit MP establishes a conduction state between the circuit MC and the wiring OLB[j] and establishes a conduction state between the circuit MCr and the wiring OL[j]. In the case where the second data $$z_i^{(k-1)}$$

is "0", the circuit MP breaks electrical continuity between the circuit MC and the wiring OL[j] and between the circuit MC and the wiring OLB[j] and breaks electrical continuity between the circuit MCr and the wiring OL[j] and between the circuit MC and the wiring OLB[j] so that currents output from the circuits MC and MCr flow to neither the wiring OL[j] nor the wiring OLB[j].

An example in which the above-described operations are combined is shown. In the case where the first data $$w_i^{(k-1)} j^{(k)}$$

is "1", a current flows from the wiring OL[j] or the wiring OLB[j] to the wiring VE[j] through the circuit MC in some cases, and a current does not flow from the wiring OL[j] or the wiring OLB[j] to the wiring VEr[j] through the circuit MCr. In the case where the first data $$w_i^{(k-1)} j^{(k)}$$

is "−1", a current does not flow from the wiring OL[j] or the wiring OLB[j] to the wiring VE[j] through the circuit MC, and a current flows from the wiring OL[j] or the wiring OLB[j] to the wiring VEr[j] through the circuit MCr in some cases. In the case where the second data $$z_i^{(k-1)}$$

is "1", electrical continuity is established between the circuit MC and the wiring OL[j] and between the circuit MCr and the wiring OLB[j]. In the case where the second data $$z_i^{(k-1)}$$

is "−1", electrical continuity is established between the circuit MC and the wiring OLB[j] and between the circuit MCr and the wiring OL[j]. From the above, in the case where the product of the first data $$w_i^{(k-1)} j^{(k)}$$

46 and the second data $$z_i^{(k-1)}$$

is a positive value, a current flows from the wiring OL[j] to the wiring VE[j] through the circuit MC or a current flows from the wiring OL[j] to the wiring VEr[j] through the circuit MCr. In the case where the product of the first data $$w_i^{(k-1)} j^{(k)}$$

and the second data $$z_i^{(k-1)}$$

is a negative value, a current flows from the wiring OLB[j] to the wiring VEr[j] through the circuit MCr or a current flows from the wiring OLB[j] to the wiring VE[j] through the circuit MC. In the case where the product of the first data $$w_i^{(k-1)} j^{(k)}$$

and the second data $$z_i^{(k-1)}$$

is a value of 0, a current does not flow from the wiring OL[j] or the wiring OLB[j] to the wiring VE[j] and a current does not flow from the wiring OL[j] or the wiring OLB[j] to the wiring VEr[j].

A specific example of the above-described example is as follows: in the case where the first data $$w_i^{(k-1)} j^{(k)}$$

is "1" and the second data $$z_i^{(k-1)}$$

is "1", a current $I1[i,j]$ having the first current value flows from the circuit MC to the wiring OL[j] and a current $I2[i,j]$ having the second current value flows from the circuit MCr to the wiring OLB[j], for example. Here the second current value is zero, for example. In the case where the first data $$w_i^{(k-1)} j^{(k)}$$

is "−1" and the second data $$z_i^{(k-1)}$$

is "1", the current $I1[i,j]$ having the second current value flows from the circuit MC to the wiring OL[j] and the current $I2[i,j]$ having the first current value flows from the circuit MCr to the wiring OLB[j], for example. Here, the second current value is zero, for example. In the case where the first data $$w_i^{(k-1)} j^{(k)}$$

is "0" and the second data $$z_i^{(k-1)}$$

is "1", the current $I1[i,j]$ having the second current value flows from the circuit MC to the wiring OL[j] and the current $I2[i,j]$ having the second current value flows from the circuit MCr to the wiring OLB[j]. Here, the second current value is zero, for example.

In the case where the first data $$w_i^{(k-1)} j^{(k)}$$

is "1" and the second data $$z_i^{(k-1)}$$

is "−1", the current $I1[i,j]$ having the first current value flows from the circuit MC to the wiring OLB[j] and the current $I2[i,j]$ having the second current value flows from the circuit MCr to the wiring OL[j]. Here, the second current value is zero, for example. In the case where the first data $w_i^{(k-1)} j^{(k)}$ is "−1" and the second data $$z_i^{(k-1)}$$

is "−1", the current $I1[i,j]$ having the second current value flows from the circuit MC to the wiring OLB[j] and the current $I2[i,j]$ having the first current value flows from the circuit MCr to the wiring OL[j]. Here, the second current value is zero, for example. In the case where the first data $$w_i^{(k-1)} j^{(k)}$$

is "0" and the second data $$z_i^{(k-1)}$$

is "−1", the current $I1[i,j]$ having the second current value flows from the circuit MC to the wiring OLB[j] and the current $I2[i,j]$ having the second current value flows from the circuit MCr to the wiring OL[j]. Here, the second current value is zero, for example.

In the case where the second data $$z_i^{(k-1)}$$

is "0", electrical continuity is not established between the circuit MC and the wiring OL[j] and between the circuit MC and the wiring OLB[j]. Similarly, electrical continuity is not established between the circuit MCr and the wiring OL[j] and between the circuit MCr and the wiring OLB[j]. Therefore, regardless of the value of the first data $$w_i^{(k-1)(k)} {}_j,$$

a current is not output from the circuit MC and the circuit MCr to the wiring OL[j] and the wiring OLB[j].

As described above, in the case where the product value of the first data $$w_i^{(k-1)(k)} {}_j$$

and the second data $$z_i^{(k-1)}$$

is a positive value, a current flows from the circuit MC or the circuit MCr to the wiring OL[j]. Specifically, in the case where the first data $$w_i^{(k-1)(k)} {}_j$$

is a positive value, a current flows from the circuit MC to the wiring OL[j], and in the case where the first data $$w_i^{(k-1)(k)} {}_j$$

is a negative value, a current flows from the circuit MCr to the wiring OL[j].

By contrast, in the case where the product value of the first data $$w_i^{(k-1)(k)} {}_j$$

and the second data $$z_i^{(k-1)}$$

is a negative value, a current flows from the circuit MC or the circuit MCr to the wiring OLB[j]. Specifically, in the case where the first data $$w_i^{(k-1)}{}_j^{(k)}$$

is a positive value, a current flows from the circuit MC to the wiring OLB[j], and in the case where the first data $$w_i^{(k-1)}{}_j^{(k)}$$

is a negative value, a current flows from the circuit MCr to the wiring OLB[j].

Accordingly, the total amount of currents output from a plurality of circuits MC or a plurality of circuits MCr connected to the wiring OL[j] flows to the wiring OL[j]. That is, a current corresponding to the sum of positive values flows to the wiring OL[j]. By contrast, the total amount of currents output from a plurality of circuits MC or a plurality of circuits MCr connected to the wiring OLB[j] flows to the wiring OLB[j]. That is, a current corresponding to the sum of negative values flows to the wiring OLB[j].

As a result of the above operation, a current corresponding to the sum of positive values flows to the wiring OL[j], and a current corresponding to the sum of negative values flows to the wiring OLB[j]. The difference between the current flowing to the wiring OL[j] and the current flowing to the wiring OLB[j] is obtained, whereby the product-sum operation processing is completed.

In this case, in the case where the value of the current flowing to the wiring OL[j] is larger than the value of the current flowing to the wiring OLB[j], it can be determined that the product-sum operation result has a positive value. In the case where the value of the current flowing to the wiring OL[j] is smaller than the value of the current flowing to the wiring OLB[j], it can be determined that the product-sum operation result has a negative value. In the case where the value of the current flowing to the wiring OL[j] and the value of the current flowing to the wiring OLB[j] are the same or the substantially same, it can be determined that the product-sum operation result is zero.

When the AD converter 100 of one embodiment of the present invention is used for the circuit ACTF[j] to which the wiring OL[j] and the wiring OLB[j] are electrically connected, the product-sum operation result can be efficiently converted into a positive or negative signed digital signal.

Note that even in the case where the second data $$z_i^{(k-1)}$$

has any two values among "−1", "0", and "1", for example, two values "−1" and "1" or two values "0" and "1", operation can be performed in a similar manner. Similarly, even in the case where the first data $$w_i^{(k-1)}{}_j^{(k)}$$

has any two values among "−1", "0", and "1", for example, two values "−1" and "1" or two values "0" and "1", operation can be performed in a similar manner.

Note that the first data $$w_i^{(k-1)}{}_j^{(k)}$$

may be an analog value or a multi-bit (multilevel) digital value. For example, "−1" can be replaced with a "negative analog value", and "1" can be replaced with a "positive analog value". In this case, the amount of current flowing from the circuit MC or the circuit MCr is an analog value corresponding to the absolute value of the value of the first data $$w_i^{(k-1)}{}_j^{(k)}.$$

FIG. 11A illustrates a circuit structure example that can be used for the circuit MP. The circuit MP includes the circuit MC and the circuit MCr. The circuit MC includes transistors M1 to M5 and a capacitor C1. The transistor M2, the transistor M5, and the capacitor C1 form the holding portion HC.

The circuit MCr has substantially the same circuit structure as the circuit MC. Thus, "r" is added to the reference numerals of the circuit elements and the like included in the circuit MCr to differentiate them from the circuit elements and the like included in the circuit MC.

In FIG. 11A, the transistors M1 to M5 are illustrated as n-channel transistors with multi gate structures including back gates. Therefore, each of the transistors M1 to M5 illustrated in FIG. 11A includes a first gate and a second gate. Furthermore, the sizes such as the channel lengths and the channel widths of the transistor M3 and the transistor M4 are preferably equal to each other.

Although the back gates are illustrated in the transistors M1 to M5 illustrated in FIG. 11A, the connection structures of the back gates are not illustrated. Portions to which the back gates are electrically connected can be determined at the design stage. For example, in a transistor including a back gate, a gate and the back gate may be electrically connected to each other to increase the on-state current of the transistor. In other words, the gate and the back gate of the transistor M2 may be electrically connected to each other, for example.

In the transistor including the back gate, a given potential may be supplied to the back gate in order to change the threshold voltage of the transistor or in order to reduce the off-state current of the transistor. Note that the transistors M1 to M5 may be transistors without back gates. That is, transistors with a single gate structure may be used. It is also possible that some transistors have a structure including a back gate and the other transistors have a structure not including a back gate. Note that the description applies to a transistor described in other parts of the specification and a transistor illustrated in other drawings, not only to the transistors illustrated in FIG. 11A.

As a transistor of one embodiment of the present invention, transistors with a variety of structures can be used. Thus, there is no limitation on the type of transistors used. Examples of transistors include a transistor including single crystal silicon and a transistor including a non-single-crystal semiconductor film typified by amorphous silicon, polycrystalline silicon, microcrystalline (also referred to as microcrystal, nanocrystal, or semi-amorphous) silicon, or the like. Alternatively, a thin film transistor (TFT) including a thin film of any of these semiconductors can be used, for example. The use of the TFT has various advantages. For example, since the TFT can be manufactured at a lower temperature than the case of using single crystal silicon, manufacturing costs can be reduced or a larger manufacturing apparatus can be used. Since a larger manufacturing apparatus can be used, TFTs can be manufactured over a large substrate. This enables a large number of display apparatuses to be manufactured at a time, resulting in low cost manufacturing. Alternatively, a low manufacturing temperature allows the use of a low heat-resistance substrate. Thus, transistors can be manufactured over a light-transmitting substrate. Transmission of light in a display element can be controlled using the transistor over a light-transmitting substrate. Alternatively, some of the films included in the transistor can transmit light because the transistor is thin. Accordingly, the aperture ratio can be improved.

For example, a semiconductor in which a channel of a transistor is formed is not limited to a single semiconductor whose main component is a single element, and a compound semiconductor (e.g., SiGe or GaAs) or an oxide semiconductor (e.g., Zn—O, In—Ga—Zn—O, In—Zn—O, In—Sn—O (ITO), Sn—O, Ti—O, Al—Zn—Sn—O (AZTO), or In—Sn—Zn—O) can be used. Note that these semiconductor materials can be used not only for a semiconductor in which a channel of a transistor is formed, but also for another usage. For example, the semiconductor materials can be used for a resistor, an electrode having a light-transmitting property, or the like. Since such components can be deposited or formed at the same time as the transistor, the manufacturing cost can be reduced.

Note that as a semiconductor material, an organic semiconductor, a carbon nanotube, or the like can be used. Thus, a transistor can be formed over a bendable substrate. A device using a transistor containing an organic semiconductor or a carbon nanotube can be highly resistant to impact.

Note that as the transistor of one embodiment of the present invention, a transistor with any of a variety of structures can be used. For example, a transistor can have a variety of structures such as a planar type, a FIN-type, a TRI-GATE type, a top-gate type, a bottom-gate type, and a double-gate type (with gates placed above and below a channel). A MOS transistor, a junction transistor, a bipolar transistor, or the like can be used as the transistor of one embodiment of the present invention. By using a MOS transistor as the transistor, the occupation area of the transistor can be reduced. Thus, a large number of transistors can be mounted. By using a bipolar transistor as the transistor, a large amount of current can flow therethrough. Thus, a circuit can operate at high speed. Note that a MOS transistor and a bipolar transistor may be formed over one substrate. Thus, a reduction in power consumption, a reduction in size, high-speed operation, and the like can be achieved.

Figure 11A:
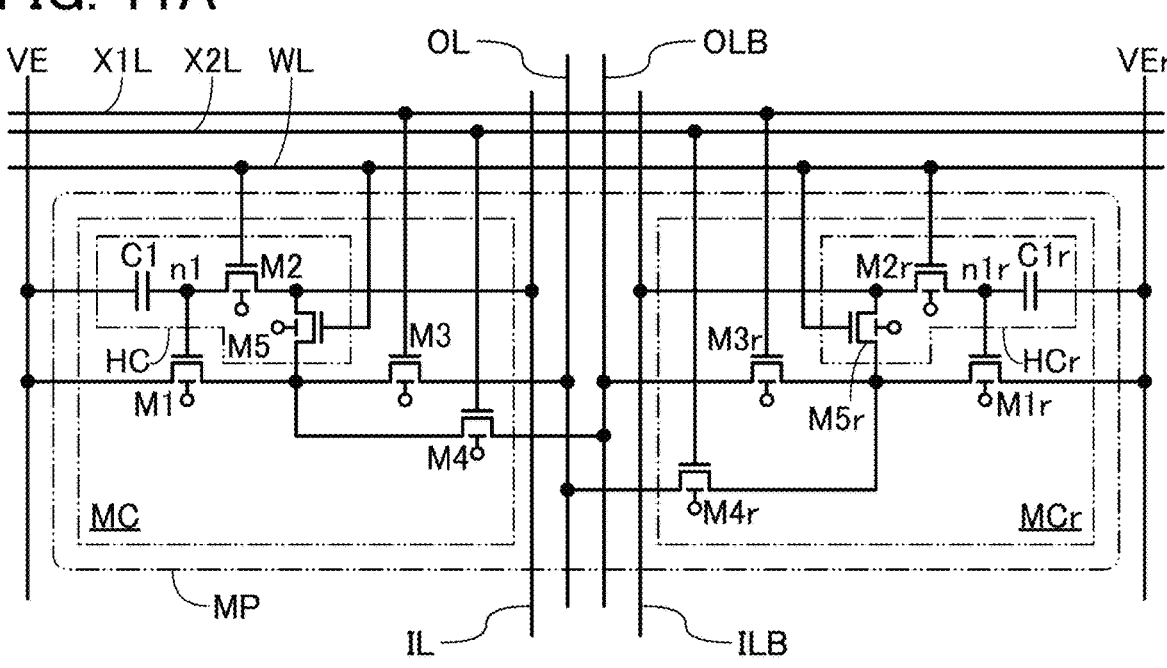
FIG. 11A and FIG. 11B are diagrams illustrating a semiconductor device.

In the circuit MC in FIG. 11A, a first terminal (one of a source and a drain) of the transistor M1 is electrically connected to the wiring VE. A second terminal (the other of the source and the drain) of the transistor M1 is electrically connected to a first terminal of the transistor M3 and a first terminal of the transistor M4. A gate of the transistor M1 is electrically connected to a first terminal (one of a pair of electrodes included in the capacitor) of the capacitor C1 and a first terminal of the transistor M2. A second terminal (the other of the pair of electrodes included in the capacitor) of the capacitor C1 is electrically connected to the wiring VE. A second terminal of the transistor M2 is electrically connected to the wiring IL and a first terminal of the transistor M5. A gate of the transistor M2 is electrically connected to the wiring WL. A second terminal of the transistor M3 is electrically connected to the wiring OL and a gate of the transistor M3 is electrically connected to the wiring X1L. A second terminal of the transistor M4 is electrically connected to the wiring OLB and a gate of the transistor M4 is electrically connected to the wiring X2L. A second terminal of the transistor M5 is electrically connected to the second terminal of the transistor M1, the first terminal of the transistor M3, and the first terminal of the transistor M4. A gate of the transistor M5 is electrically connected to the wiring WL.

The connection structure of the circuit MCr different from that of the circuit MC is described. A second terminal of a transistor M3r is electrically connected to not the wiring OL but the wiring OLB, and a second terminal of a transistor M4r is electrically connected to not the wiring OLB but the wiring OL. A first terminal of a transistor M1r and a first terminal of a capacitor C1r are electrically connected to the wiring VEr.

The sizes such as the channel lengths and the channel widths of the transistors M1, M2, M3, M4, and M5 are preferably equal to the sizes of the respective transistors M1r, M2r, M3r, M4r, and M5r. Such a structure might enable efficient layout.

Note that in the holding portion HC illustrated in FIG. 11A, an electrical connection point of the gate of the transistor M1, the first terminal of the capacitor C1, and the first terminal of the transistor M2 is a node n1. Furthermore, in the holding portion HCr, an electrical connection point of a gate of the transistor M1r, a second terminal of the capacitor C1r, and a first terminal of the transistor M2r is a node n1r.

The holding portion HC has a function of holding a potential corresponding to the first data. The potential is written to the holding portion HC in the following manner: the transistor M2 is turned on and the transistor M5 is turned off, and the potential corresponding to the first data is supplied from the wiring IL to the node n1. After that, the transistor M2 is turned off, whereby the potential corresponding to the first data is held in the node n1.

The holding portion HCr has a function of holding the potential corresponding to the first data, like the holding portion HC. The potential is written to the holding portion HCr in the following manner: the transistor M2r is turned on and the transistor M5r is turned off, and the potential corresponding to the first data is supplied from the wiring ILB to the node n1r. After that, the transistor M2r is turned off, whereby the potential corresponding to the first data is held in the node n1r.

As the transistor M2, a transistor with a low off-state current is preferably used for a long-term holding of the potential of the node n1. As the transistor with a low off-state current, an OS transistor can be used, for example. Alternatively, a transistor including a back gate may be used as the transistor M2, and an off-state current may be reduced by applying a low-level potential or a negative voltage to the back gate and shifting the threshold voltage to the positive side. The same applies to the transistor M2r.

The wiring VE and the wiring VEr each function as a wiring for supplying a constant voltage. In the case where the transistor M3, the transistor M3r, the transistor M4, or the transistor M4r is an n-channel transistor, the constant voltage can be Vss, GND, a low-level potential other than those, or the like.

The voltages supplied from the wiring VE and the wiring VEr may be different from each other or the same. In the case where the voltages supplied from the wirings are the same, the wirings can be shared.

Figure 11B:
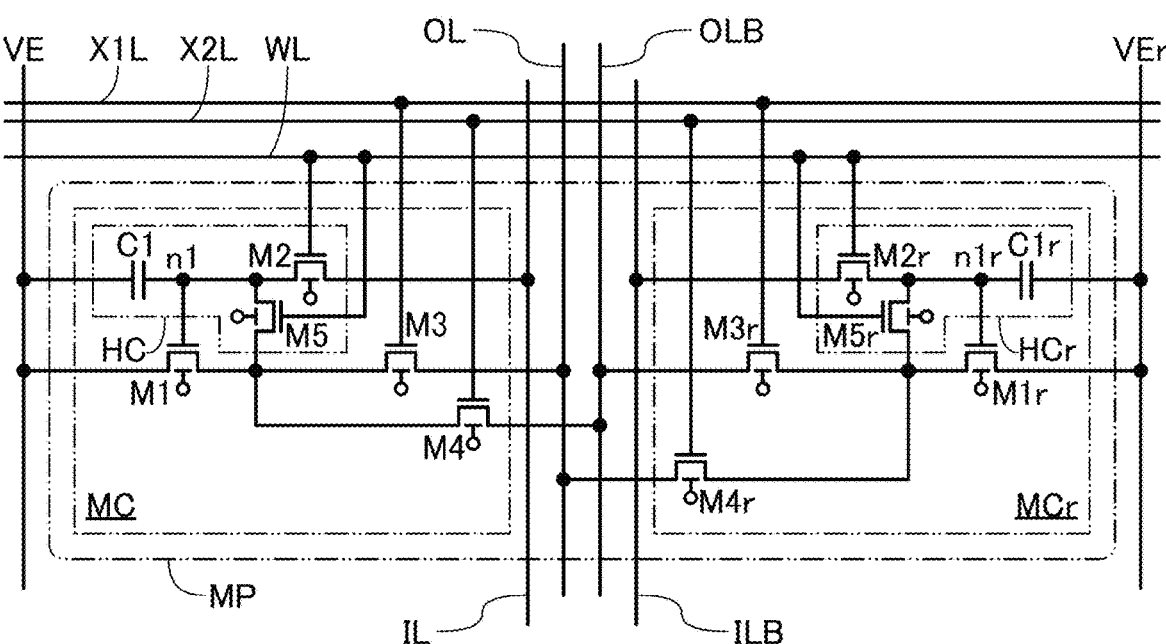

FIG. 11B illustrates a modification example of the circuit MP in FIG. 11A. In the circuit MP in FIG. 11B, the first terminal of the transistor M5 is electrically connected to the first terminal of the transistor M2, the gate of the transistor M1, and the first terminal of the capacitor C1. The circuit MP illustrated in FIG. 11B can operate in a manner similar to that of the circuit MP illustrated in FIG. 11A.

Note that an SRAM (Static Random Access Memory), a phase-change memory (PCM), a resistive random access memory (ReRAM), a magnetoresistive random access memory (MRAM), a ferroelectric random access memory (FeRAM), or the like may be used as each of the holding portion HC and the holding portion HCr holding the first data that is a weight coefficient.

Figure 12:
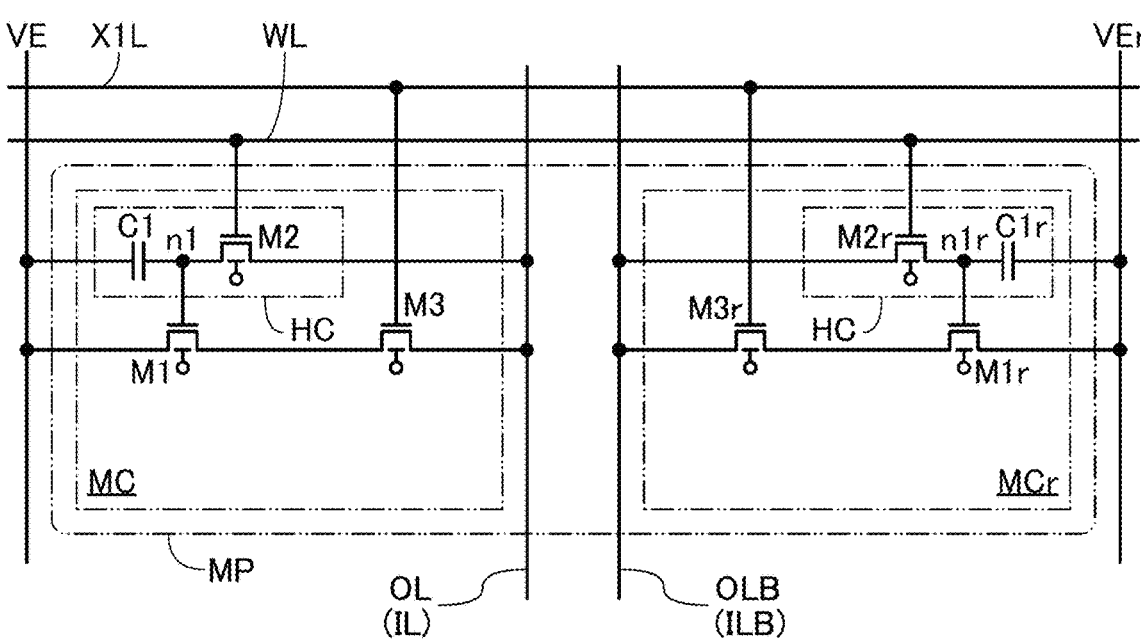
FIG. 12 is a diagram illustrating a semiconductor device.

FIG. 12 illustrates a modification example of the circuit MP illustrated in FIG. 11A. As illustrated in FIG. 12, one wiring may be used as the wiring OL or the wiring IL, and another one wiring may be used as the wiring OLB or the wiring ILB. In addition, a structure in which the wiring X2L, the transistor M4, the transistor M4r, the transistor M5, and the transistor M5r are not provided may be employed. In the circuit MP illustrated in FIG. 12, the second terminal of the transistor M2 and the second terminal of the transistor M3 are electrically connected to the wiring OL (wiring IL). Furthermore, a second terminal of the transistor M2r and the second terminal of the transistor M3r are electrically connected to the wiring OLB (wiring ILB).

This embodiment can be combined with the other embodiments described in this specification and the like as appropriate.

Embodiment 3

The product-sum operation result obtained by neurons is output through an activation function in many cases. As activation functions, a linear ramp function (ReLU function), a sigmoid function, a step function, and the like are known. The AD converter 100 of one embodiment of the present invention can achieve, in addition to an AD conversion function, a function of the ReLU function.

Figure 13:
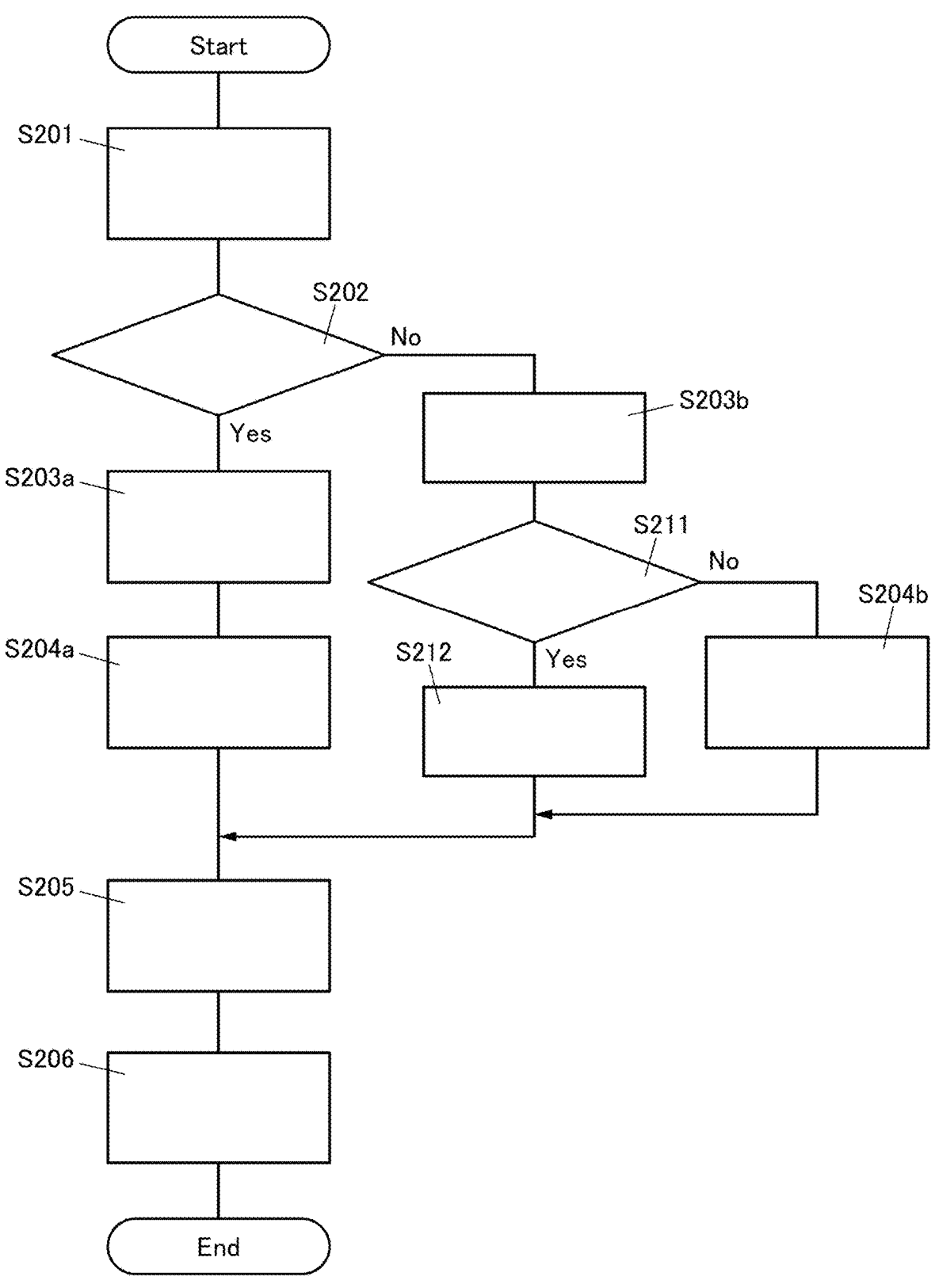
FIG. 13 is a flow chart showing an operation example of an AD converter.

FIG. 13 is a flow chart showing the operation of the AD converter 100 to which a function of the ReLU function is added. The operation of the AD converter 100 to which a function of the ReLU function is added is described with reference to FIG. 13. Since the operation example of the AD converter 100 has already been described in Embodiment 1, a point different from the operation example described in Embodiment 1 is described in this embodiment.
[Step S211]

After Step S203b, it is determined whether the AD converter 100 is made to function as a ReLU function (Yes) or not (No). In the case where the AD converter 100 is not made to function as a ReLU function, Step S205 is performed after Step S204b.
[Step S212]

In the case where the AD converter 100 is made to function as a ReLU function, $(00000000)_2$ is set as a digital signal. After that, Step S205 is performed.

In such a manner, when the differential current is negative (when a sign bit is 1), $(100000000)_2$ is output as a digital signal regardless of the value of the differential current. When the differential current is positive (when a sign bit is 0), successive approximation is performed in the DA conversion portion 130b, and a digital signal corresponding to the differential current is generated.

Figure 14A:
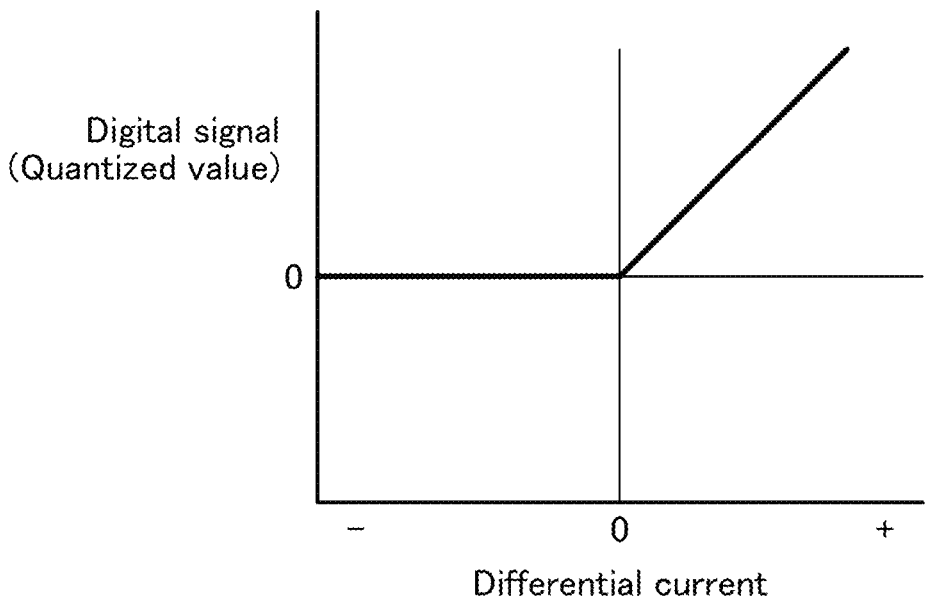
FIG. 14A and FIG. 14B are diagrams illustrating an operation example of an AD converter.

FIG. 14A is a graph showing change in the digital signal generated when the AD converter 100 is made to function as a ReLU function. The horizontal axis in FIG. 14A shows the differential current, and the vertical axis shows the output digital signal (quantized value). In FIG. 14A, when the differential current is negative, 0 is output as the digital signal, and when the differential current is positive, the digital signal corresponding to the value of the differential current is output.

Since the AD converter 100 can also function as a ReLU function, an additional ReLU function does not needed to be provided. Therefore, a semiconductor device including the AD converter 100 can reduce its power consumption. Furthermore, the semiconductor device including the AD converter 100 can reduce its occupation area.

Figure 14B:
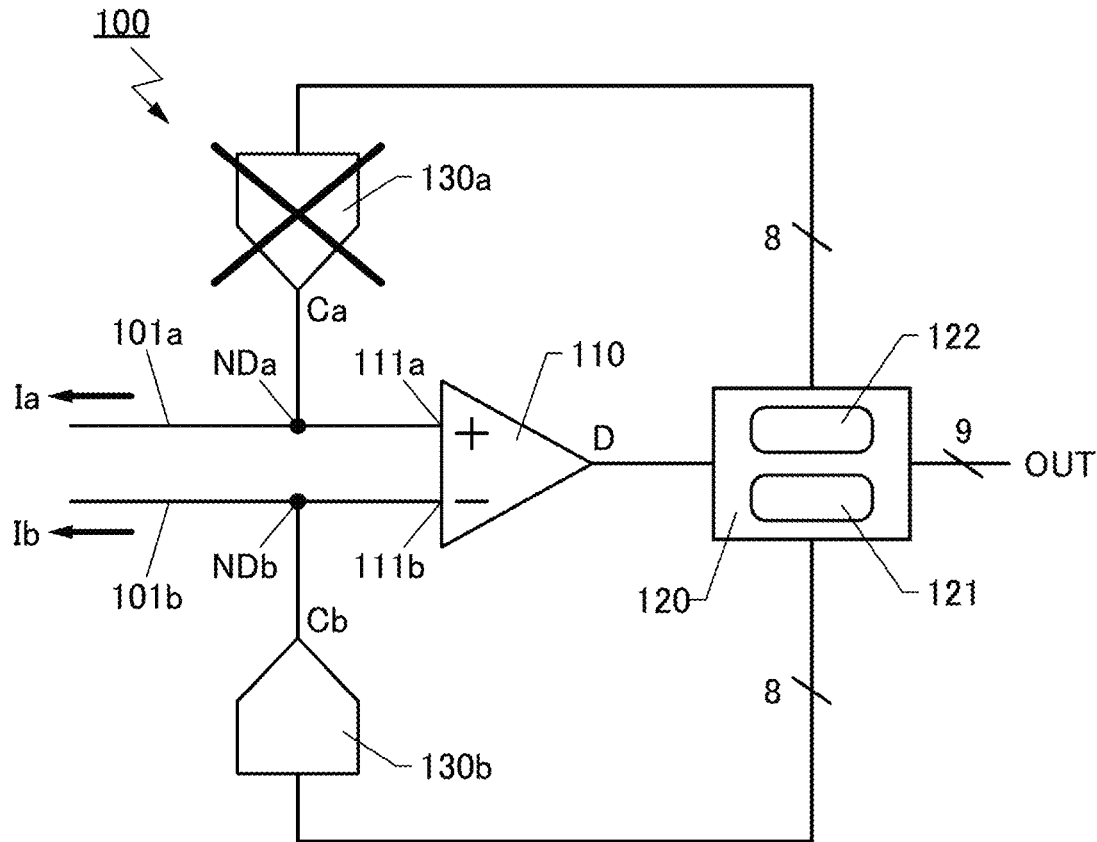

When a function of a ReLU function is added to the AD converter 100, the DA conversion portion 130a does not operate; thus, power supply to the DA conversion portion 130a may be stopped (see FIG. 14B). Stopping the power supply to the DA conversion portion 130a can further reduce power consumption.

This embodiment can be combined with the other embodiments described in this specification and the like as appropriate.

Embodiment 4

In this embodiment, a structure example of a display apparatus that can include the semiconductor device described in the above embodiment is described. As an example, a structure example in which the semiconductor device described in the above embodiment is used for an AD converter circuit of a display apparatus is described. The structure in which the semiconductor device of one embodiment of the present invention is used for an AD converter circuit of a display apparatus is effective in reduction of occupation area and power consumption.

Structure Example of Display Apparatus

Figure 15:
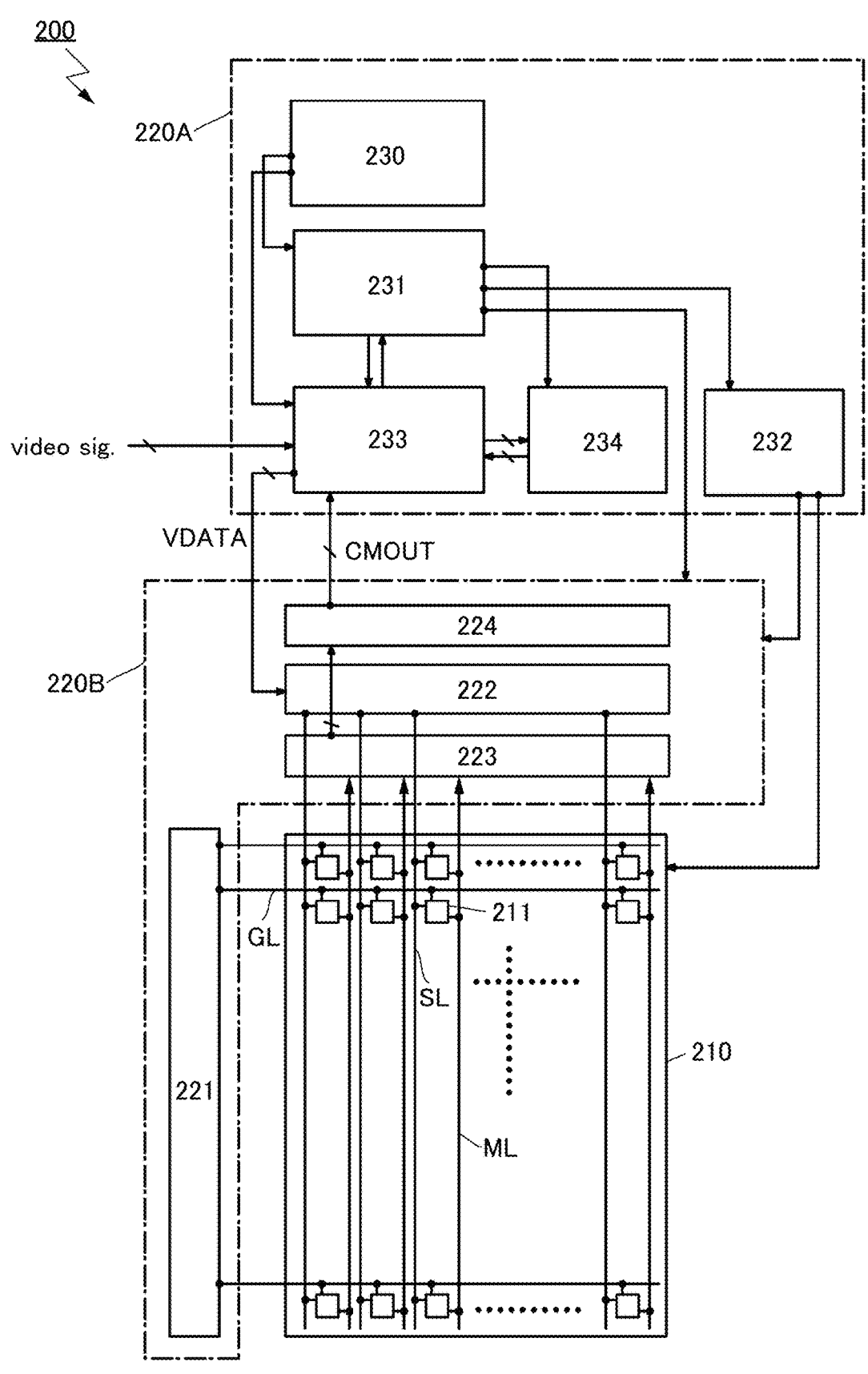
FIG. 15 is a diagram illustrating a structure example of a display apparatus.

FIG. 15 is a block diagram illustrating a structure example of a display apparatus. A display apparatus 200 includes a pixel portion 210, a function circuit 220A, and a peripheral circuit 220B.

The function circuit 220A includes a CPU 230, a control circuit 231, a power supply circuit 232, an image processing circuit 233, and a memory 234.

The CPU 230 is a circuit for executing an instruction and controlling the display apparatus 200 as a whole. The CPU 230 executes an instruction input from the outside and an instruction stored in an internal memory. The CPU 230 generates signals for controlling the control circuit 231 and the image processing circuit 233. On the basis of the control signal from the CPU 230, the control circuit 231 controls the operation of the display apparatus 200. The control circuit 231 controls the peripheral circuit 220B, the power supply circuit 232, the image processing circuit 233, and the memory 234 so that the process determined by the CPU 230 is executed. To the control circuit 231, for example, a variety of synchronization signals which determine timing of updating the screen are input. Examples of the synchronization signals include a horizontal synchronization signal, a vertical synchronization signal, and a reference clock signal. The control circuit 231 generates control signals of the peripheral circuit 220B from these signals. The power supply circuit 232 has a function of supplying a power supply voltage to the pixel portion 210 and the peripheral circuit 220B.

The pixel portion 210 includes a plurality of pixels 211, a plurality of wirings GL, a plurality of wirings SL, and a plurality of wirings ML. The plurality of pixels 211 are arranged in an array. The plurality of wirings GL, SL, and ML are provided in accordance with the arrangement of the plurality of pixels 211. The wirings GL are arranged in a vertical direction. The wirings SL and ML are arranged in a horizontal direction. The wiring GL is also referred to as a gate line, a scan line, a selection signal line, or the like. The wiring SL is also referred to as a source line, a data line, or the like. The wiring ML is provided to monitor the pixels 211, and can be referred to as a monitor wiring, for example.

The peripheral circuit 220B includes a gate driver circuit 221, a source driver circuit 222, a monitor circuit 223, and an AD conversion circuit 224.

The gate driver circuit 221 is a circuit for driving the wiring GL and has a function of generating a signal supplied to the wiring GL. The source driver circuit 222 is a circuit for driving the wiring SL and has a function of generating a signal supplied to the wiring SL. The monitor circuit 223 is capable of detecting an analog signal flowing in the wiring ML. The AD conversion circuit 224 is a circuit for converting an analog signal output from the monitor circuit 223 to a digital signal. The AD conversion circuit 224 outputs a signal CMOUT to the image processing circuit 233.

In the display apparatus 200, the AD converter 100 in Embodiment 1 is used for the AD converter circuit 224. Thus, the display apparatus 200 is a display apparatus with reduced occupation area and power consumption.

The image processing circuit 233 has a function of processing a video signal input from the outside and generating a data signal VDATA. The data signal VDATA is a digital signal that represents a gray scale. Furthermore, the image processing circuit 233 has a function of correcting the data signal VDATA using the signal CMOUT. The source driver circuit 222 has a function of processing the data signal VDATA and generating a data signal supplied to each wiring SL. The memory 234 is provided to store data needed for performing processing in the image processing circuit 233. The signal CMOUT, the data signal VDATA, or a video signal input from the outside is stored in the memory 234, for example.

Although the analog signal flowing in the wiring ML is a minute current of several nanoamperes to several hundreds of nanoamperes, with the use of the AD converter 100 in Embodiment 1 for the AD converter circuit 224, the display apparatus 200 can detect the analog signal with high accuracy and correct the data signal VDATA with high accuracy.

Figures 16A, 16B:
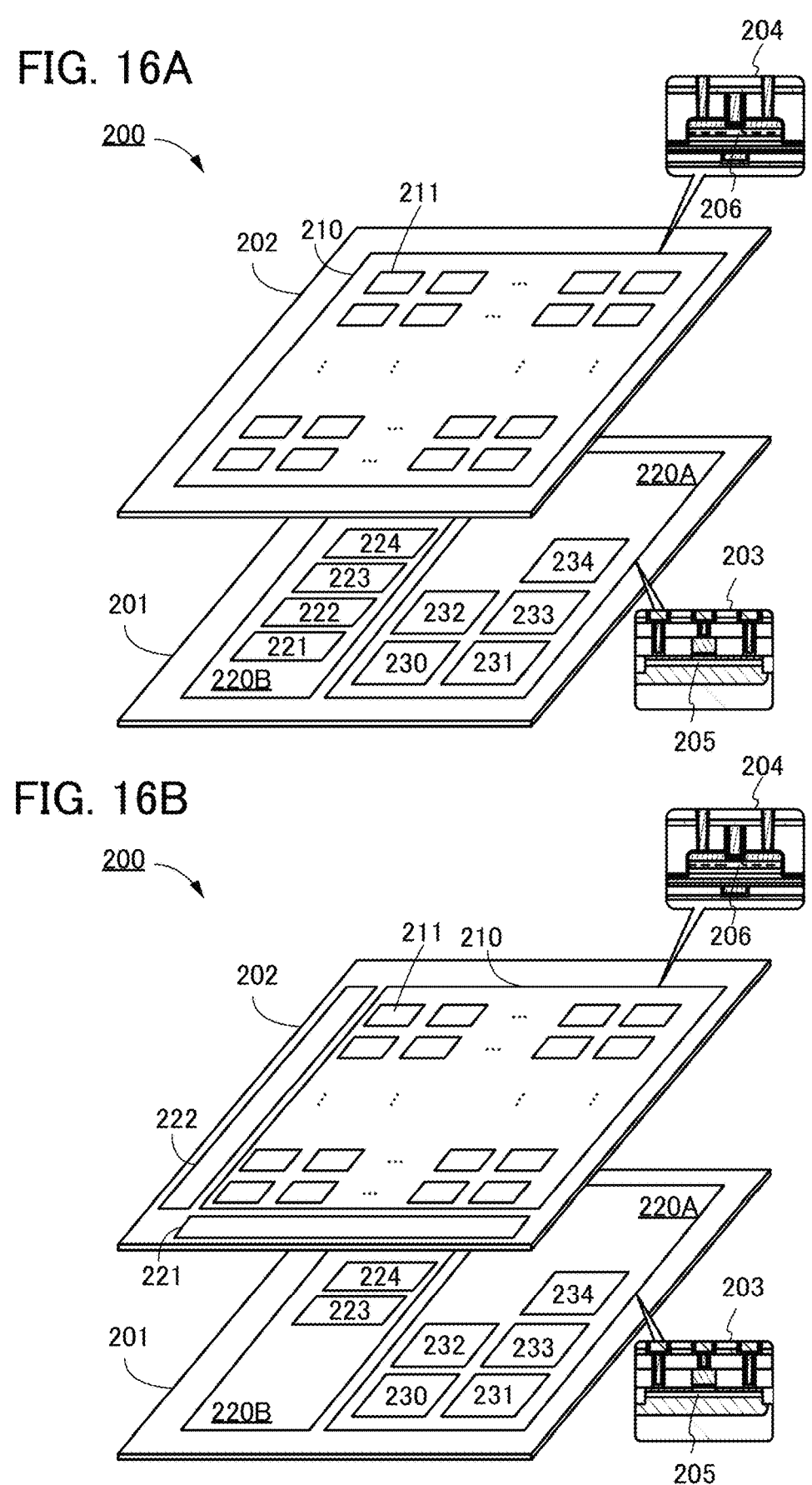
FIG. 16A and FIG. 16B are diagrams illustrating structure examples of a display apparatus.

FIG. 16A is a schematic view illustrating the arrangement of the pixel portion 210, the function circuit 220A, and the peripheral circuit 220B in the display apparatus 200. FIG. 16A illustrates, as an example, the display apparatus 200 in which components are provided over a layer 201 and a layer 202. In FIG. 16A, the layer 202 is provided to be stacked above the layer 201, for example. Note that an interlayer insulator or a conductor for electrical connection between different layers can be provided between the layer 201 and the layer 202.

For example, a transistor provided in the layer 201 can be a transistor including silicon in a channel formation region (also referred to as a Si transistor), such as a transistor including single crystal silicon in a channel formation region. In particular, the use of a transistor including single crystal silicon in a channel formation region as the transistor provided in the layer 201 can increase the on-state current of the transistor. This is preferable because the circuits included in the layer 201 can be driven at high speed. The Si transistor can be formed in microfabrication, e.g., a channel length of 3 nm to 10 nm; therefore, the display apparatus 200 can be provided with a function circuit such as a CPU, an accelerator such as a GPU, an application processor, or the like.

A transistor provided in the layer 202 can be an OS transistor, for example. In particular, a transistor including an oxide including at least one of indium, an element M (the element M is aluminum, gallium, yttrium, or tin), and zinc in a channel formation region is preferably used as the OS transistor. Such an OS transistor has a characteristic of an extremely low off-state current. Thus, it is particularly preferable to use the OS transistor as a transistor provided in a pixel circuit included in a display portion, in which case analog data written to the pixel circuit can be held for a long period.

The layer 201 is provided with the function circuit 220A and the peripheral circuit 220B. A transistor 203 in the layer 201 is a Si transistor including silicon in a channel formation region 205. The Si transistor can increase the on-state current of the transistor. Therefore, the CPU 230, the control circuit 231, the power supply circuit 232, the image processing circuit 233, and the memory 234 that are included in the function circuit 220A, and the gate driver circuit 221, the source driver circuit 222, the monitor circuit 223, and the AD converter circuit 224 that are included in the peripheral circuit 220B can be driven at high speed.

The pixel portion 210 provided with the plurality of pixels 211 is provided in the layer 202. A transistor 204 in the layer 202 is an OS transistor including an oxide functioning as a semiconductor (an oxide semiconductor) in a channel formation region 206. The OS transistor can hold data written to the pixel 211 for a long period. Note that the pixel 211 has a function of a subpixel controlling light emission of red, green, or blue.

FIG. 16B illustrates a schematic view of the case where some circuits included in the peripheral circuit 220B provided in the layer 201 are provided in the layer 202. FIG. 16B illustrates a structure in which the gate driver circuit 221 and the source driver circuit 222 are provided in the layer 202. Note that the source driver circuit 222 provided in the layer 202 can have a structure in which part of the function, e.g., a demultiplexer that distributes signals output from the source driver 222 to the wirings SL, is provided in the layer 202.

STRUCTURE EXAMPLE OF PIXEL

Figure 17A:
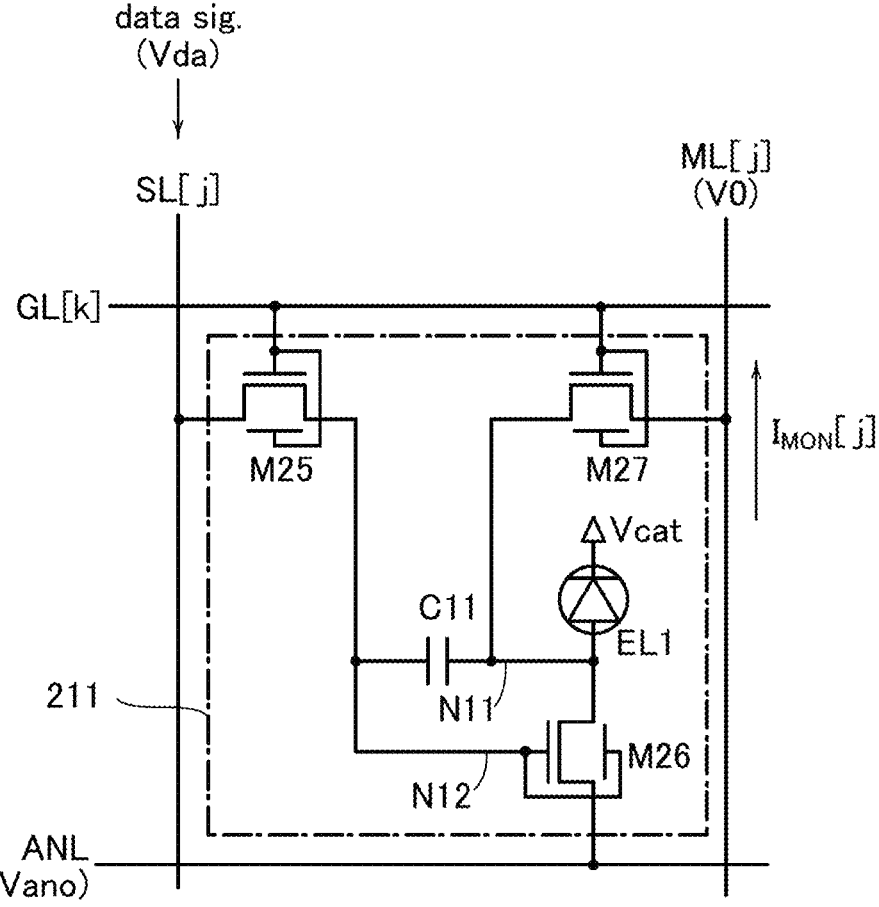
FIG. 17A and FIG. 17B are diagrams illustrating a structure example of a pixel.
Figure 17B:
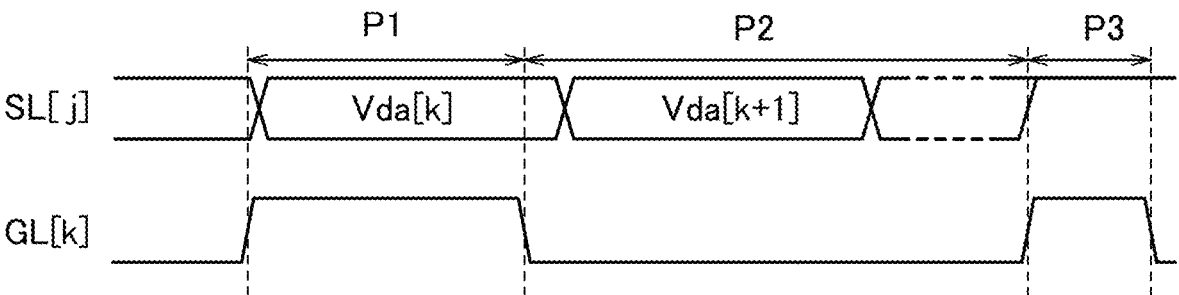

FIG. 17A is a circuit diagram illustrating an example of the pixel 211, and FIG. 17B is a timing chart showing an operation example of the pixel 211 illustrated in FIG. 17A.

FIG. 17A illustrates the pixel 211 arranged in the k-th row and the j-th column (k is an integer greater than or equal to 2 and less than or equal to m and j is an integer greater than or equal to 2 and less than or equal to n). The pixel 211 is electrically connected to wirings GL, SL, ML, and ANL. The pixel 211 includes transistors M25 to M27, a capacitor C11, and a light-emitting element EL1. In this specification and the like, the term "element" can be replaced with the term "device" in some cases. For example, a display element, a light-emitting element, and a liquid crystal element can be rephrased as a display device, a light-emitting device, and a liquid crystal device, respectively.

The light-emitting element EL1 includes a pair of terminals (an anode and a cathode). As the light-emitting element EL1, an element which can control the luminance with a current or a voltage can be used. Typical examples of the light-emitting element EL1 include an LED (Light Emitting Diode) and an OLED (Organic Light Emitting Diode). For example, in the case of an OLED, the light-emitting element EL1 includes an EL (electroluminescent) layer. The EL layer is formed using a single layer or a plurality of layers between the anode and the cathode. The EL layer at least includes a layer containing a light-emitting material (light-emitting layer). A light-emitting element in which the EL layer is used for light emission is referred to as an EL element in some cases. A display apparatus in which the EL element is used in the pixel is referred to as an EL display apparatus in some cases. In particular, a light-emitting element including an organic EL layer may be referred to as an organic EL element, and a display apparatus including an organic EL element may be referred to as an organic EL display apparatus. Needless to say, the light-emitting element EL1 can be an organic EL element.

The transistors M25 to M27 illustrated in FIG. 17A can be OS transistors. Some or all of the transistors M25 to M27 may be Si transistors. Although the transistors M25 to M27 are n-channel transistors in FIG. 17A, some or all of the transistors may be p-channel transistors. The transistors M25 to M27 each include a back gate electrically connected to a gate. With such a device structure, the current drive capability of the transistors M25 to M27 can be improved. Some or all of the transistors M25 to M27 may be transistors which do not include back gates.

The transistor M25 is a pass transistor which connects a gate of the transistor M26 (a node N12) and the wiring SL. The transistor M27 is a pass transistor which connects the wiring ML and an anode of the light-emitting element EL1 (a node N11). The transistor M26 is a driving transistor and functions as a source of a current supplied to the light-emitting element EL1. In accordance with the amount of drain current of the transistor M26, the luminance of the light-emitting element EL1 is adjusted. The capacitor C11 is a storage capacitor for holding the voltage between the node N11 and the node N12.

Next, an operation example of the pixel 211 is described. A voltage Vda that is a data signal is input to the wiring SL. The voltage Vda is a voltage corresponding to a gray scale of an image signal. In FIG. 17B, [k] and [k+1] represent the data signals Vda input to the k-th pixel 211 and the (k+1)-th pixel 211, respectively.

A period P1 is a writing operation period and the light-emitting element EL1 does not emit light during the period. Voltage Vano is applied to the wiring ANL and voltage Vcat is applied to the cathode of the light-emitting element EL1. The wiring ML is electrically connected to a power supply line supplying voltage V0. The wiring GL is set at a high level to turn on the transistors M25 and M26. The voltage Vda of the wiring SL is supplied to the node N12. A drain current of which the amount corresponds to that of the voltage Vda flows to the transistor M26.

Note that the voltage Vano, the voltage V0, and the voltage Vcat are preferably set so as to satisfy the following formulae (b1) to (b3). In the following formulae, a voltage $V_{thE}$ represents the threshold voltage of the light-emitting element EL1, and a voltage $V_{th2}$ represents the threshold voltage of the transistor M26.

$$V0 < Vcat + V_{thE} \qquad (b1)$$

$$Vano > V0 + V_{thE} \qquad (b2)$$

$$Vano > Vcat + V_{thE} + V_{th2} \qquad (b3)$$

When the formulae (b1) and (b2) are satisfied, even in the case where the transistor M27 is on in the period P1 (writing period), the drain current of the transistor M26 can be preferentially flown to the wiring ML, not in the light-emitting element EL1. When the formula (b3) is satisfied, a potential difference between the wiring ANL and the cathode of the light-emitting element EL1 is generated in a period P2 (light emission period); thus, the drain current of the transistor M26 is supplied to the light-emitting element EL1, and the light-emitting element EL1 can emit light. In the period P2, the transistors M25 and M27 are turned off.

A period P3 is a monitor period in which the drain current of the transistor M26 is obtained. The transistors M25 and M27 are turned on. Furthermore, an electrical connection between the wiring ML and the power supply line supplying the voltage V0 is broken. To the wiring SL, such a voltage that the voltage of the node N12 is higher than the voltage $V_{th2}$ is supplied. The voltage Vano is supplied to the wiring ANL, and the voltage Vcat is supplied to the cathode of the light-emitting element EL1. The wiring SL and the like are driven in this manner, whereby the drain current of the transistor M26 can be preferentially flown to the wiring ML, not in the light-emitting element EL1.

A signal $I_{MON}$ output from the pixel 211 to the wiring ML in the period P3 includes the drain current flowing to the transistor M26 in the light emission period. The signal $I_{MON}$ is analyzed and the voltage Vda of the data signal is corrected on the basis of the analyzation result, whereby deviation of the luminance of the pixel 211 can be corrected.

The monitor operation need not necessarily performed after the light-emitting operation. For example, in the pixel 211, the monitor operation can be performed after the cycle of the data writing operation and the light-emitting operation is repeated a plurality of times. Alternatively, after the monitor operation, the light-emitting element EL1 may be brought into a non-light-emitting state by writing a data signal corresponding to the lowest grayscale level 0 to the pixel 211.

The signal $I_{MON}$ is input to the monitor circuit 223 illustrated in FIG. 15. The monitor circuit 223 is capable of controlling the output of the signal $I_{MON}$ to the AD converter circuit 224.

<Method for Forming Light-Emitting Element>

A method for forming the light-emitting element EL1 provided in each of the pixels 211 included in the pixel portion 210 is described below.

Figure 18A:
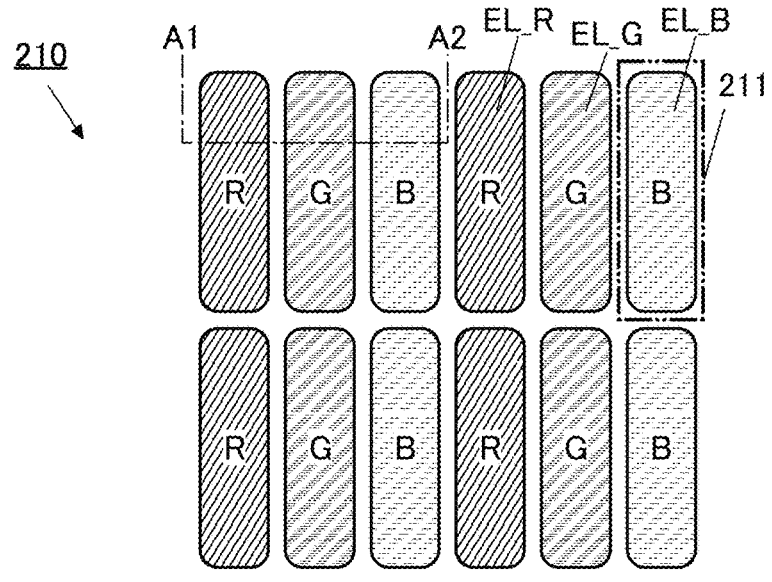
FIG. 18A to FIG. 18D are diagrams illustrating operation examples of a display element.

FIG. 18A illustrates a top surface schematic view of light-emitting elements EL_R, EL_G, and EL_B each of which can be used as the light-emitting element EL1. The light-emitting element EL_R is a light-emitting element that exhibits red, the light-emitting element EL_G is a light-emitting element that exhibits green, and the light-emitting element EL_B is a light-emitting element that exhibits blue. In FIG. 18A, light-emitting regions of the light-emitting elements are denoted by R, G, and B to easily differentiate the light-emitting elements. Note that the structure illustrated in FIG. 18A may be referred to as an SBS (Side By Side) structure. Although the structure illustrated in FIG. 18A has three colors of red (R), green (G), and blue (B), one embodiment of the present invention is not limited thereto. For example, the structure may have four or more colors.

The light-emitting elements EL_R, EL_G, and EL_B are arranged in a matrix. FIG. 18A illustrates what is called a stripe arrangement, in which the light-emitting elements of the same color are arranged in one direction. Note that the arrangement method of the light-emitting elements is not limited thereto; another arrangement method such as a delta arrangement, a zigzag arrangement, or a PenTile arrangement may also be used.

As the light-emitting elements EL_R, EL_G, and EL_B, an organic EL device such as an OLED (Organic Light Emitting Diode) or a QLED (Quantum-dot Light Emitting Diode) is preferably used. As a light-emitting substance included in the EL element, a substance which emits fluorescence (a fluorescent material), a substance which emits phosphorescence (a phosphorescent material), an inorganic compound (e.g., a quantum dot material), a substance which exhibits thermally activated delayed fluorescence (a thermally activated delayed fluorescent (TADF) material), and the like can be given.

Figure 18B:
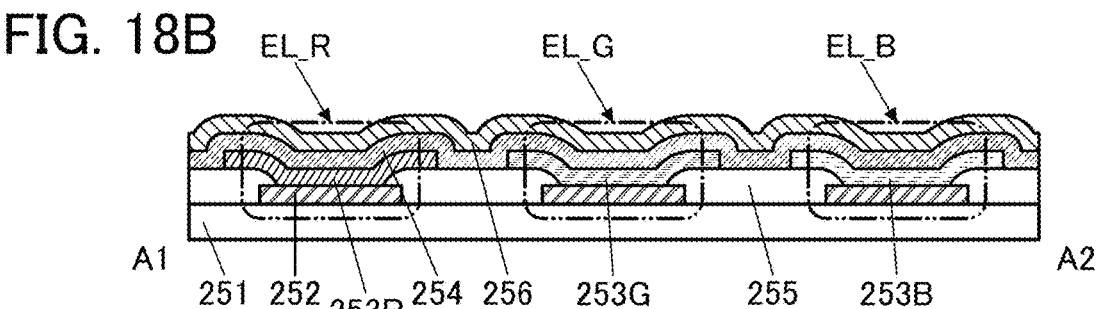

FIG. 18B is a cross-sectional schematic view taken along dashed-dotted line A1-A2 in FIG. 18A.

FIG. 18B illustrates cross sections of the light-emitting elements EL_R, EL_G, and EL_B. The light-emitting elements EL_R, EL_G, and EL_B are each provided over an insulating layer 251 and each include a conductor 252 functioning as a pixel electrode and a conductor 254 functioning as a common electrode.

The light-emitting element EL_R includes an EL layer 253R between the conductor 252 and the conductor 254. The EL layer 253R contains a light-emitting organic compound that emits light with intensity at least in a red wavelength range. An EL layer 253G included in the light-emitting element EL_G contains a light-emitting organic compound that emits light with intensity at least in a green wavelength range. An EL layer 253B included in the light-emitting element EL_B contains a light-emitting organic compound that emits light with intensity at least in a blue wavelength range.

The EL layer 253R, the EL layer 253G, and the EL layer 253B may each include one or more of an electron-injection layer, an electron-transport layer, a hole-injection layer, and a hole-transport layer in addition to the layer containing a light-emitting organic compound (the light-emitting layer).

The conductor 252 is provided for each of the light-emitting elements. The conductor 254 is provided as a common layer to the light-emitting elements. A conductive film that transmits visible light is used for either the conductor 252 or the conductor 254 serving as a common electrode, and a reflective conductive film is used for the other. The light-transmitting conductor 252 and the reflective conductor 254 offer a bottom-emission display apparatus whereas the reflective conductor 252 and the light-transmitting conductor 254 offer a top-emission display apparatus. Note that when both the conductor 252 and the conductor 254 transmit light, a dual-emission display apparatus can be obtained.

An insulating layer 255 is provided to cover end portions of the conductor 252. End portions of the insulating layer 255 are preferably tapered.

The EL layer 253R, the EL layer 253G, and the EL layer 253B each include a region in contact with a top surface of the conductor 252 and a region in contact with a surface of the insulating layer 255. End portions of the EL layer 253R, the EL layer 253G, and the EL layer 253B are positioned over the insulating layer 255.

As illustrated in FIG. 18B, there is a gap between the EL layers of two light-emitting elements with different colors. In this manner, the EL layer 253R, the EL layer 253G, and the EL layer 253B are preferably provided so as not to be in contact with each other. This suitably prevents unintentional light emission (also referred to as crosstalk) from being caused by a current flowing through two adjacent EL layers. As a result, the contrast can be increased to achieve a display apparatus with high display quality.

The EL layer 253R, the EL layer 253G, and the EL layer 253B can be formed separately by a vacuum evaporation method or the like using a shadow mask such as a metal mask. Alternatively, these layers may be formed separately by a photolithography method. The use of the photolithography method achieves a display apparatus with high resolution, which is difficult to obtain in the case of using a metal mask.

Furthermore, a protective layer 256 is provided over the conductor 254 to cover the light-emitting elements EL_R, EL_G, and EL_B. The protective layer 256 has a function of preventing diffusion of impurities such as water into the light-emitting elements from above.

The protective layer 256 can have, for example, a single-layer structure or a stacked-layer structure at least including an inorganic insulating film. Examples of the inorganic insulating film include an oxide film or a nitride film such as a silicon oxide film, a silicon oxynitride film, a silicon nitride oxide film, a silicon nitride film, an aluminum oxide film, an aluminum oxynitride film, or a hafnium oxide film. Alternatively, a semiconductor material such as indium gallium oxide or indium gallium zinc oxide may be used for the protective layer 256. The protective layer 256 may be formed by an ALD method, a CVD method, or a sputtering method. Although the protective layer 256 includes an inorganic insulating film in this example, one embodiment of the present invention is not limited thereto. For example, the protective layer 256 may have a stacked-layer structure of an inorganic insulating film and an organic insulating film.

Figure 18C:
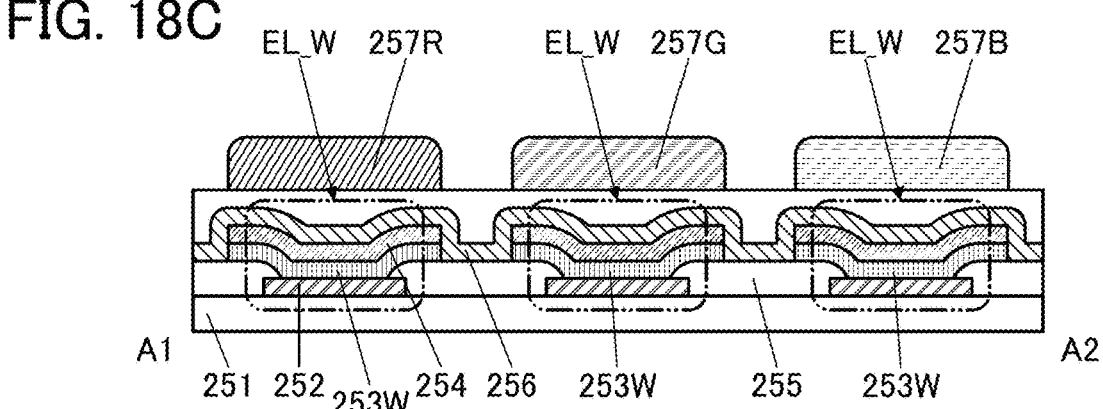

FIG. 18C illustrates an example different from the above.

In FIG. 18C, a light-emitting element EL_W emitting white light is provided. The light-emitting element EL_W includes an EL layer 253W emitting white light between the conductor 252 and the conductor 254.

The EL layer 253W can have, for example, a structure in which two or more light-emitting layers that are selected so as to emit light of complementary colors are stacked. It is also possible to use a stacked EL layer, i.e., an EL layer having what is called a tandem structure, in which a charge-generation layer is provided between light-emitting layers. The tandem structure enables a light-emitting element capable of high luminance light emission.

FIG. 18C illustrates three light-emitting elements EL_W side by side. A coloring layer 257R is provided above the left light-emitting element EL_W. The coloring layer 257R functions as a band path filter transmitting red light. Similarly, a coloring layer 257G transmitting green light is provided above the middle light-emitting element EL_W, and a coloring layer 257B transmitting blue light is provided above the right light-emitting element EL_W. Thus, the display apparatus can display an image with colors.

Here, the EL layer 253W and the conductor 254 are each separated between adjacent two light-emitting elements EL_W. This favorably prevents unintentional light emission from being caused by a current flowing through the EL layers 253W of adjacent two light-emitting elements EL_W. Particularly when the EL layer 253W is a stacked EL element in which a charge-generation layer is provided between two light-emitting layers, crosstalk is more significant as the resolution increases, i.e., as the distance between adjacent pixels decreases, leading to lower contrast. Thus, the above structure can achieve a display apparatus having both high resolution and high contrast.

The EL layer 253W and the conductor 254 are preferably separated by a photolithography method. This can reduce the distance between light-emitting elements, achieving a display apparatus with a higher aperture ratio than that formed using, for example, a shadow mask such as a metal mask.

Note that in the case of a bottom-emission light-emitting element, a coloring layer may be provided between the conductor 252 and the insulating layer 251.

Figure 18D:
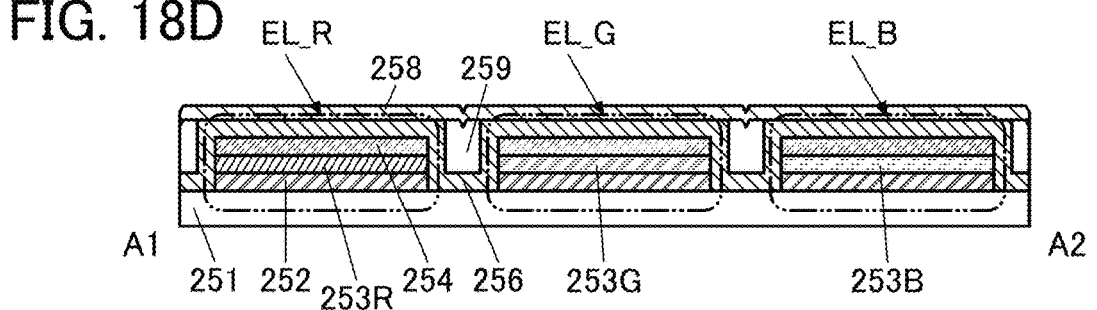

FIG. 18D illustrates an example different from the above. Specifically, in FIG. 18D, the insulating layers 255 are not provided between the light-emitting element EL_R, the light-emitting element EL_G, and the light-emitting element EL_B. With such a structure, the display apparatus can have a high aperture ratio. Furthermore, the protective layer 256 covers side surfaces of the light-emitting element EL_R, the light-emitting element EL_G, and the light-emitting element EL_B. With this structure, impurities (typically, water) can be inhibited from entering the light-emitting element EL_R, the light-emitting element EL_G, and the light-emitting element EL_B through their side surfaces. In the structure illustrated in FIG. 18D, the top shapes of the conductor 252, the EL layer 253R, and the conductor 254 agree or agree approximately with one another. This structure can be formed in such a manner that the conductor 252, the EL layer 253R, and the conductor 254 are formed and collectively processed using a resist mask or the like. In this process, the EL layer 253R and the conductor 252 are processed using the conductor 254 as a mask, and thus this process can be called self-alignment patterning. Note that although the light-emitting element EL_R is described here, the light-emitting element EL_G and the light-emitting element EL_B can have the same structure.

In FIG. 18D, a protective layer 258 is further provided over the protective layer 256. For example, the protective layer 256 can be formed with an apparatus that can deposit a film with excellent coverage (typically, an ALD apparatus), and the protective layer 258 can be formed with an apparatus that can deposit a film with coverage inferior to that of the protective layer 256 (typically, a sputtering apparatus), whereby a space 259 can be provided between the protective layer 256 and the protective layer 258. In other words, the space 259 is positioned between the light-emitting element EL_R and the light-emitting element EL_G, and between the light-emitting element EL_G and the light-emitting element EL_B.

Note that the space 259 includes, for example, one or more selected from air, nitrogen, oxygen, carbon dioxide, and Group 18 elements (typically, helium, neon, argon, xenon, and krypton). Furthermore, for example, a gas used during the deposition of the protective layer 258 is sometimes included in the space 259. For example, in the case where the protective layer 258 is deposited using a sputtering method, one or more of the above-described Group 18 elements is sometimes included in the space 259. In the case where a gas is included in the space 259, a gas can be identified with a gas chromatography method or the like. Alternatively, in the case where the protective layer 258 is deposited using a sputtering method, a gas used in the sputtering is sometimes contained in the protective layer 258. In this case, an element such as argon is sometimes detected when the protective layer 258 is analyzed by an energy dispersive X-ray analysis (EDX analysis) or the like.

In the case where the refractive index of the space 259 is lower than the refractive index of the protective layer 256, light emitted from the light-emitting element EL_R, the light-emitting element EL_G, or the light-emitting element EL_B is reflected in an interface between the protective layer 256 and the space 259. Thus, light emitted from the light-emitting element EL_R, the light-emitting element EL_G, or the light-emitting element EL_B can be inhibited from entering an adjacent pixel. With the structure, mixture of light of different colors can be inhibited, so that the image quality of the display apparatus can be improved.

In the case of the structure illustrated in FIG. 18D, a region between the light-emitting element EL_R and the light-emitting element EL_G or a region between the light-emitting element EL_G and the light-emitting element EL_B (hereinafter simply referred to as a distance between the light-emitting elements) can be shortened. Specifically, the distance between the light-emitting elements can be less than or equal to 1 μm, preferably less than or equal to 500 nm, further preferably less than or equal to 200 nm, less than or equal to 100 nm, less than or equal to 90 nm, less than or equal to 70 nm, less than or equal to 50 nm, less than or equal to 30 nm, less than or equal to 20 nm, less than or equal to 15 nm, or 10 nm. In other words, the display apparatus includes a region in which an interval between the side surface of the light-emitting element EL_R and the side surface of the light-emitting element EL_G or an interval between the side surface of the light-emitting element EL_G and the side surface of the light-emitting element EL_B is less than or equal to 1 μm, preferably less than or equal to 0.5 μm (500 nm), further preferably less than or equal to 100 nm.

In the case where the space 259 includes air, for example, the structure illustrated in FIG. 18D can be referred to as an air isolation structure. The air isolation structure allows the light-emitting elements to be isolated from each other and color mixing of light or crosstalk between the light-emitting elements can be inhibited.

Figure 19A:
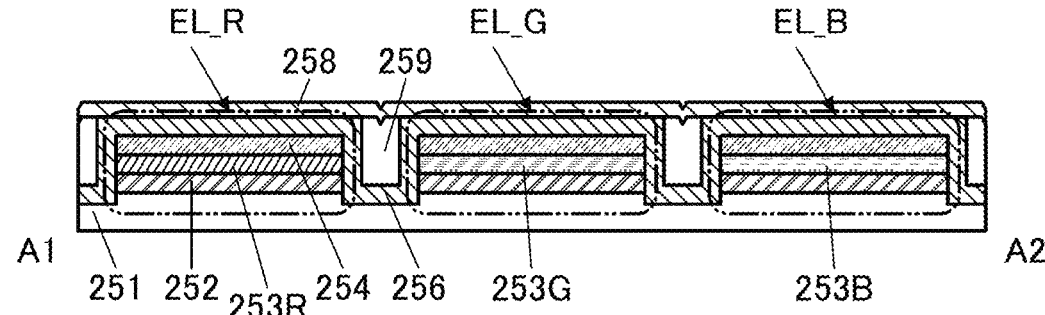
FIG. 19A and FIG. 19B are diagrams illustrating operation examples of a display element.

FIG. 19A illustrates an example different from the above. Specifically, the structure illustrated in FIG. 19A is different from the structure illustrated in FIG. 18D in the structure of the insulating layer 251. The insulating layer 251 has a depressed portion in its top surface that is formed by being partially etched when the light-emitting element EL_R, the light-emitting element EL_G, and the light-emitting element EL_B are processed. In addition, the protective layer 256 is formed in the depressed portion. In other words, in the cross-sectional view, a region is provided, in which the bottom surface of the protective layer 256 is positioned below the bottom surface of the conductor 252. With the region, impurities (typically, water or the like) can be suitably inhibited from entering the light-emitting element EL_R, the light-emitting element EL_G, and the light-emitting element EL_B from the bottom. It is likely that the depressed portion can be formed when impurities (also referred to as residue) that could be attached to the side surfaces of the light-emitting element EL_R, the light-emitting element EL_G, and the light-emitting element EL_B in processing of the light-emitting elements are removed by e.g., wet etching. After the residue is removed, the side surfaces of the light-emitting elements are covered with the protective layer 256, whereby a highly reliable display apparatus can be provided.

Figure 19B:
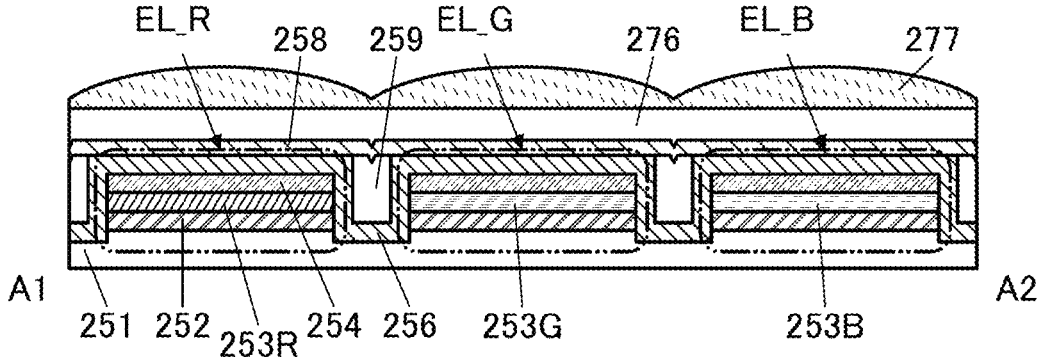

FIG. 19B illustrates an example different from the above. Specifically, the structure illustrated in FIG. 19B includes an insulating layer 276 and a microlens array 277 in addition to the structure illustrated in FIG. 19A. The insulating layer 276 functions as an adhesive layer. Note that when the refractive index of the insulating layer 276 is lower than that of the microlens array 277, the microlens array 277 can condense light emitted from the light-emitting element EL_R, the light-emitting element EL_G, and the light-emitting element EL_B. This can increase the light extraction efficiency of the display apparatus. In particular, this is suitable, because a user can see bright images when the user sees the display surface from the front of the display apparatus. As the insulating layer 276, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. Alternatively, a two-component resin may be used. An adhesive sheet or the like may be used.

Structure Example 1 of AD Converter Circuit Including AD Converter 100

Figure 20:
FIG. 20 is a diagram illustrating a structure example of an AD converter circuit.

FIG. 20 is a circuit diagram illustrating a structure example of the AD converter circuit 224 including the AD converter 100 that is described in Embodiment 1. The AD converter circuit 224 includes a plurality of transistors M1 (M1[1] to M1[N], N is a natural number greater than or equal to 1), a plurality of AD converters 100 (100[1] to 100[N]), a plurality of TRIBUFs (tri-state buffer circuits) 262, and a circuit SR (shift register).

Although the description below will be made regarding the transistors M1 as n-channel transistors, one embodiment of the present invention can be used in the case where the transistors M1 are p-channel transistors.

Signals $I_{MON}$ ($I_{MON}$[1] to $I_{MON}$[N]) illustrated in FIG. 20 each include the value of a current flowing to the pixel 211 of the display apparatus 200 (i.e., an analog signal) as information. The AD converter 100 has a function of converting these signals $I_{MON}$ into digital signals and outputting them as the signals CMOUT.

A signal $I_{TEST}$ in FIG. 20 includes the value of a current to be reference (an analog signal) as data. The AD converter 100 has a function of reading the difference between the signal $I_{MON}$ and the signal $I_{TEST}$, and outputting the difference as the signal CMOUT.

The signal $I_{TEST}$ is input to the AD converter 100 through the transistor M1. Furthermore, the signal $I_{MON}$ is input to the AD converter 100. Note that the signals $I_{MON}$ and $I_{TEST}$ can handle not only a current flowing into the AD converter 100 from an external pixel but also a current flowing into the external pixel from the AD converter 100.

The AD converter 100 has a function of converting input analog signals into signals OUT (signals OUT_1 to OUT_N) that are digital signals and outputting the signals OUT.

The circuit SR is a shift register, and has a function of selecting one signal from the signals OUT_1 to OUT_N. A signal SP and a signal SCLK illustrated in FIG. 20 represent a pulse signal and a clock signal input to the circuit SR, respectively.

The circuit SR outputs a plurality of signals SEL (SEL[1] to SEL[N]). One of the signals SEL[1] to SEL[N] is set at a high level (hereinafter, H level), and each of the other N−1 signals is set at a low level (L level). The signal SEL set at an H level turns on the transistor M1 and makes the TRIBUF 262 a conduction state. Meanwhile, the signals SEL set at L levels turn off the transistors M1 and make the TRIBUFs 262 have high impedance. Furthermore, the AD converter 100 can switch between a state capable of operation and a resting state in response to the signal SEL. In this manner, the signal $I_{TEST}$ selected by the circuit SR is input to the AD converter 100, and the signal OUT selected by the circuit SR is output to the outside as the signal CMOUT.

The case where the signal SEL[1] is set at an H level is considered, for example. At this time, an H level potential is supplied to a gate of the transistor M1[1], and the transistor M1[1] is turned on. In contrast, L level potentials are supplied to gates of the transistors M1[2] to M1[N], and the transistors M1[2] to M1[N] are turned off. Accordingly, only the transistor M1[1] is turned on, and the signal $I_{TEST}$ is input to the AD converter 100[1]. Furthermore, only the signal OUT_1 is output to the outside as the signal CMOUT. After that, the operation on the basis of the plurality of signals SEL is repeated, whereby the signals OUT in accordance with the signals $I_{MON}$ or the signal $I_{TEST}$ can be output as the signals CMOUT.

Although an example in which 8-bit data are handled is described in this embodiment, one embodiment of the present invention is not limited thereto and arbitrary k-bit (k is a natural number greater than or equal to 1) data can also be handled.

In the AD converter circuit 224, the transistor M1 is preferably an OS transistor with a low off-state current.

In a display apparatus with a small pixel size that includes a transistor and any of the light-emitting elements illustrated in FIG. 18A to FIG. 18C, a small current flows to the light-emitting element, and thus correction in the pixel is difficult. In the AD converter circuit including the semiconductor device of one embodiment of the present invention, a minute current can be detected with high accuracy. Therefore, a current flowing to a display element can be corrected with high accuracy.

Structure Example 2 of AD Converter Circuit Including AD Converter 100

Figure 21:
FIG. 21 is a diagram illustrating an operation example of an AD converter circuit.

FIG. 21 is a circuit diagram illustrating a structure example of the AD converter circuit 224 including the AD converter 100 that is described in Embodiment 1, which is different from the structure in FIG. 20. The AD converter circuit 224 includes the plurality of transistors M1 (M1[1] to M1[N], N is a natural number greater than or equal to 1), the AD converter 100, and the circuit SR (shift register).

In FIG. 21, the signal $I_{MON}$ is input to the AD converter 100 through the transistor M1. Furthermore, the signal $I_{TEST}$ is input to the AD converter 100.

The AD converter 100 has a function of outputting an input analog signal as the signal CMOUT that is a digital signal.

The circuit SR outputs the plurality of signals SEL (SEL[1] to SEL[N]). One of the signals SEL[1] to SEL[N] is set at a high level (hereinafter, H level), and each of the other N−1 signals is set at a low level (L level). The signal SEL set at an H level turns on the transistor M1. On the other hand, the signal SEL set at an L level turns off the transistor M1. Furthermore, the AD converter 100 can switch between a state capable of operation and a resting state in response to any one of the plurality of signals SEL. In this manner, the signal $I_{MON}$ selected by the circuit SR is input to the AD converter 100, and the signal CMOUT selected by the circuit SR is output to the outside.

The case where the signal SEL[1] is set at an H level is considered, for example. At this time, an H level potential is supplied to the gate of the transistor M1[1], and the transistor M1[1] is turned on. In contrast, L level potentials are supplied to the gates of the transistors M1[2] to M1[N], and the transistors M1[2] to M1[N] are turned off. As a result, only the transistor M1[1] is turned on, the signal $I_{MON}$ is input to the AD converter 100, and the signal CMOUT is output from the AD converter 100 to the outside. After that, the operation on the basis of the plurality of signals SEL is repeated, whereby the signals CMOUT in accordance with the signals $I_{MON}$ or the signal $I_{TEST}$ can be output.

With this structure, the display apparatus including the semiconductor device can be miniaturized or highly integrated.

This embodiment can be combined with the other embodiments described in this specification and the like as appropriate.

Embodiment 5

In this embodiment, structure examples of transistors that can be used in the semiconductor device described in the above embodiment are described. As an example, a structure in which transistors having different electrical characteristics are stacked is described. With the structure, the flexibility in design of the semiconductor device can be increased. Stacking transistors having different electrical characteristics can increase the degree of integration of the semiconductor device.

Figure 22:
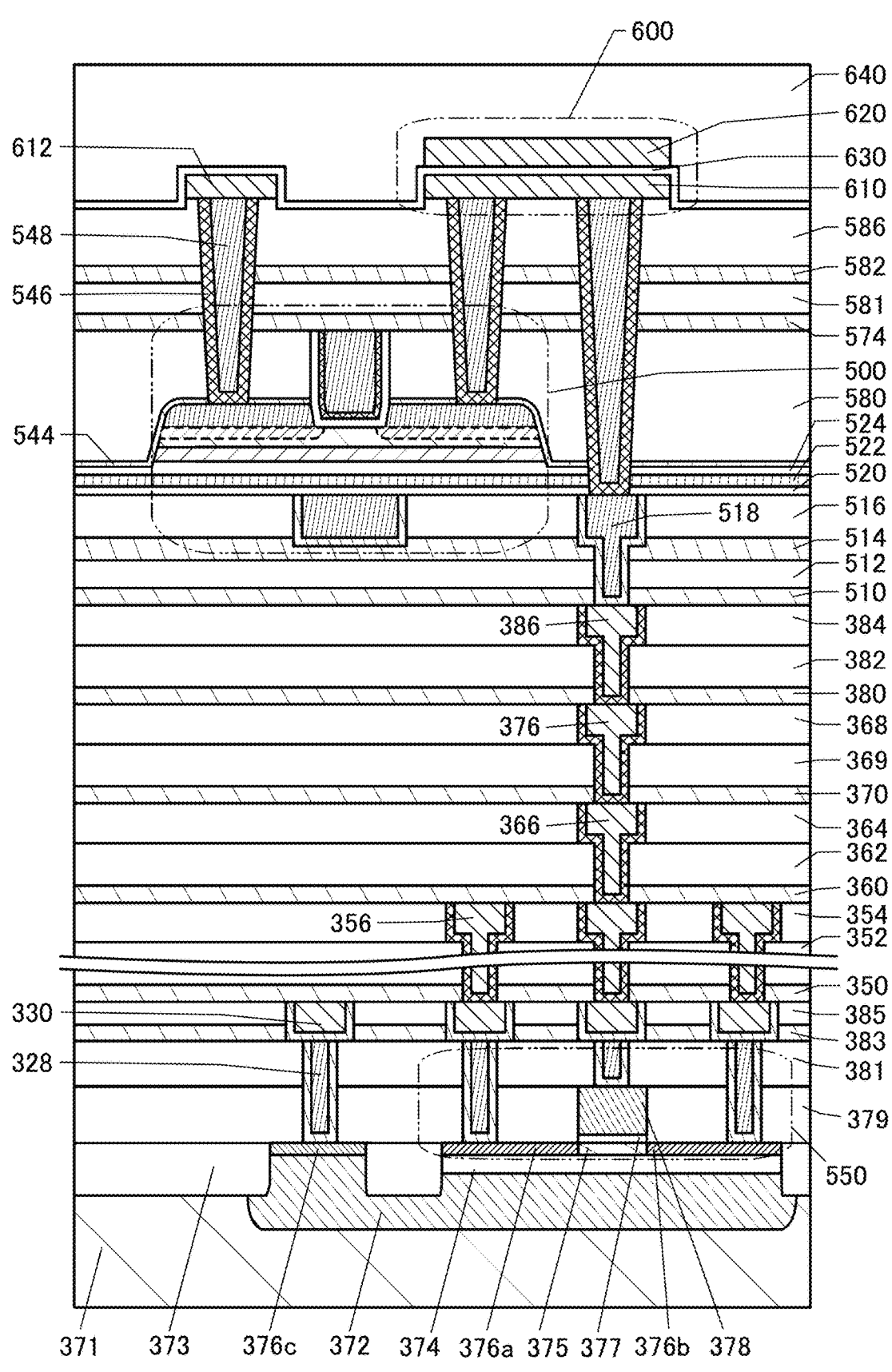
FIG. 22 is a diagram illustrating a semiconductor device.
Figure 23A:
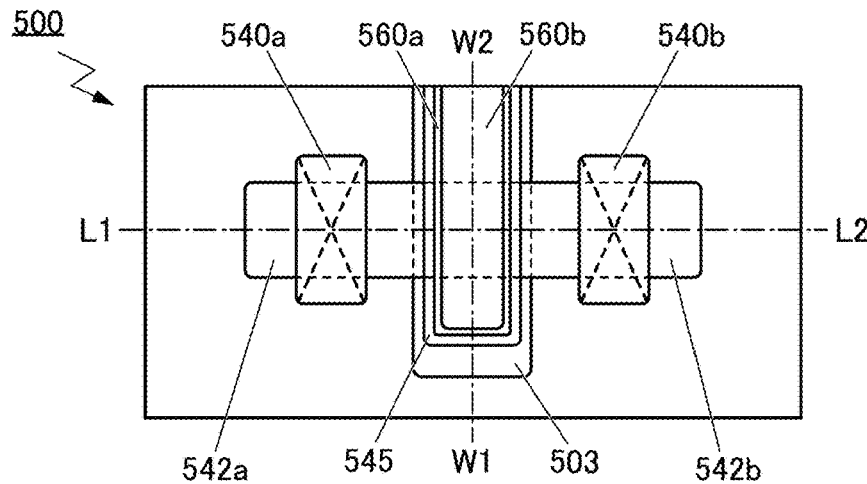
FIG. 23A to FIG. 23C are diagrams illustrating a structure example of a transistor.
Figure 23B:
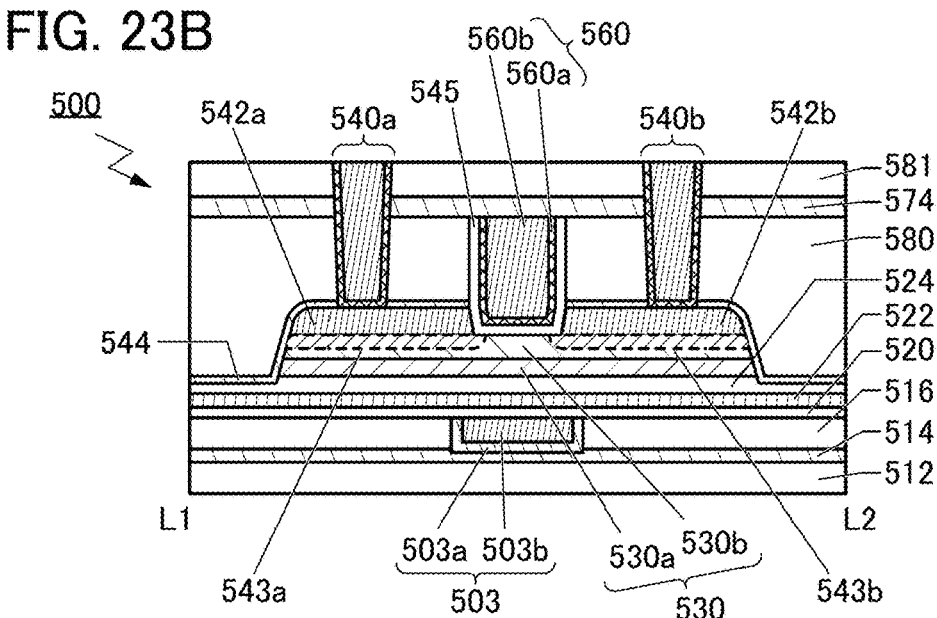
Figure 23C:
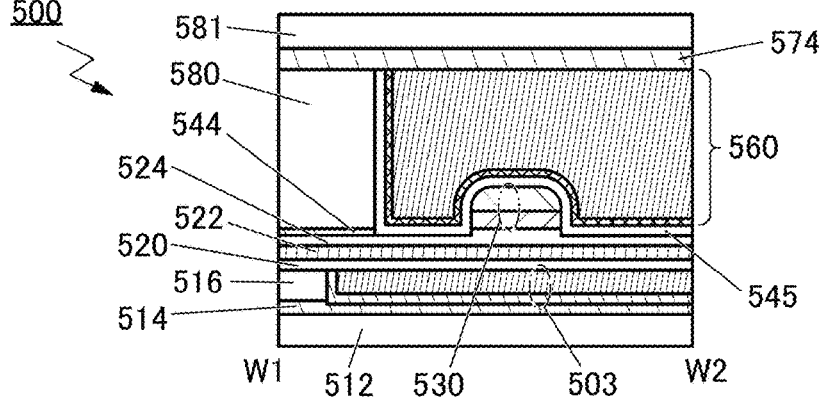

FIG. 22 illustrates part of a cross-sectional structure of a semiconductor device. The semiconductor device illustrated in FIG. 22 includes a transistor 500, a transistor 550, and a capacitor 600. Although the capacitor 600 is illustrated having a parallel-plate shape in FIG. 22, the shape of the capacitor 600 is not limited thereto. The capacitor 600 may have a cylinder shape. FIG. 23A is a top view of the transistor 500. FIG. 23B is a cross-sectional view of a portion indicated by a dashed-dotted line L1-L2 in FIG. 23A, and is a cross-sectional view in the channel length direction of the transistor 500. FIG. 23C is a cross-sectional view of a portion indicated by a dashed-dotted line W1-W2 in FIG. 23A, and is a cross-sectional view in the channel width direction of the transistor 500. For example, the transistor 500 corresponds to an OS transistor that can be used as the transistor described in the above embodiment, that is, a transistor including an oxide semiconductor in its channel formation region. The transistor 550 corresponds to a Si transistor that can be used as the transistor described in the above embodiment, that is, a transistor including silicon in its channel formation region.

The transistor 500 is an OS transistor. The off-state current of an OS transistor is extremely low. Accordingly, a data voltage or electric charge written to a memory node through the transistor 500 can be held for a long time. In other words, power consumption of the semiconductor device can be reduced because the memory node has a low frequency of refresh operation or requires no refresh operation.

In FIG. 22, the transistor 500 is provided above the transistor 550, and the capacitor 600 is provided above the transistor 550 and the transistor 500.

The transistor 550 is provided on a substrate 371. The substrate 371 is a p-type silicon substrate, for example. The substrate 371 may be an n-type silicon substrate. An oxide layer 374 is preferably an insulating layer formed with an oxide buried (Burried oxide) into the substrate 371 (the insulating layer is also referred to as a BOX layer), for example, is a silicon oxide. The transistor 550 is formed using a single crystal silicon provided over the substrate 371 with the oxide layer 374 therebetween; that is, the transistor 550 is provided on an SOI (Silicon On Insulator) substrate.

The substrate 371 included in the SOI substrate is provided with an insulator 373 serving as an element isolation layer. The substrate 371 includes a well region 372. The well region 372 is a region to which n-type or p-type conductivity is imparted in accordance with the conductivity of the transistor 550. The single-crystal silicon in the SOI substrate is provided with a semiconductor region 375 and a low-resistance region 376a and a low-resistance region 376b each of which function as a source region or a drain region. A low-resistance region 376c is provided over the well region 372.

The transistor 550 can be provided so as to overlap with the well region 372 to which an impurity element imparting conductivity is added. The well region 372 can function as a bottom-gate electrode of the transistor 550 by independently changing the potential of the low-resistance region 376c. Moreover, the threshold voltage of the transistor 550 can be controlled. In particular, when a negative potential is applied to the well region 372, the threshold voltage of the transistor 550 can be further increased, and the off-state current can be reduced. Thus, a negative potential is applied to the well region 372, so that a drain current when a potential applied to a gate electrode of the Si transistor is 0 V can be reduced. As a result, power consumption due to a shoot-through current or the like in an arithmetic circuit including the transistor 550 can be reduced, and the arithmetic efficiency can be improved.

The transistor 550 preferably has a structure in which the top surface and the side surface in the channel width direction of the semiconductor layer are covered with a conductor 378 with an insulator 377 therebetween, that is, a Fin-type structure. Such a Fin-type transistor 550 can have an increased effective channel width, and thus have improved on-state characteristics. In addition, since contribution of an electric field of a gate electrode can be increased, the off-state characteristics of the transistor 550 can be improved.

Note that the transistor 550 can be either a p-channel transistor or an n-channel transistor.

The conductor 378 sometimes functions as a first gate (also referred to as a top gate) electrode. In addition, the well region 372 sometimes functions as a second gate (also referred to as a back gate or a bottom gate) electrode. In that case, a potential applied to the well region 372 can be controlled through the low-resistance region 376c.

A region of the semiconductor region 375 where a channel is formed, a region in the vicinity thereof, the low-resistance region 376a and the low-resistance region 376b each functioning as a source region or a drain region, low-resistance region 376c connected to an electrode controlling the potential of the well region 372, and the like preferably contain a semiconductor such as a silicon-based semiconductor, and preferably contain single crystal silicon. Alternatively, the regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and changing the lattice spacing is used. Alternatively, the transistor 550 may be a HEMT with the use of GaAs and GaAlAs, or the like.

The well region 372, the low-resistance region 376a, the low-resistance region 376b, and the low-resistance region 376c contain an element which imparts n-type conductivity, such as arsenic or phosphorus, or an element which imparts p-type conductivity, such as boron, in addition to the semiconductor material used for the semiconductor region 375.

For the conductor 378 functioning as a gate electrode, a semiconductor material such as silicon containing the element which imparts n-type conductivity, such as arsenic or phosphorus, or the element which imparts p-type conductivity, such as boron, or a conductive material such as a metal material, an alloy material, or a metal oxide material can be used. Alternatively, silicide such as nickel silicide may be used for the conductor 378.

Note that since the work function of a conductor depends on the material of the conductor, the threshold voltage of the transistor can be adjusted by selecting the material of the conductor. Specifically, it is preferable to use a material such as titanium nitride and/or tantalum nitride for the conductor. Moreover, in order to ensure both conductivity and embeddability, it is preferable to use stacked layers of metal materials such as tungsten and/or aluminum for the conductor, and it is particularly preferable to use tungsten in terms of heat resistance.

To form each of the low-resistance region 376a, the low-resistance region 376b, and the low-resistance region 376c, another conductor, for example, silicide such as nickel silicide may be stacked. With this structure, the conductivity of the region functioning as an electrode can be increased. At this time, an insulator functioning as a sidewall spacer (also referred to as a sidewall insulating layer) may be provided at the side surface of the conductor 378 functioning as a gate electrode and the side surface of the insulator functioning as a gate insulating film. This structure can prevent the conductor 378 and the low-resistance region 376a and the low-resistance region 376b from being brought into a conduction state.

An insulator 379, an insulator 381, an insulator 383, and an insulator 385 are stacked in this order to cover the transistor 550.

For the insulator 379, the insulator 381, the insulator 383, and the insulator 385, silicon oxide, silicon oxynitride, silicon nitride oxide, silicon nitride, aluminum oxide, aluminum oxynitride, aluminum nitride oxide, aluminum nitride, or the like is used, for example.

Note that in this specification and the like, "oxynitride" refers to a material that contains oxygen at a higher proportion than nitrogen in its composition, and "nitride oxide" refers to a material that contains nitrogen at a higher proportion than oxygen in its composition. For example, in this specification and the like, silicon oxynitride refers to a material that contains oxygen at a higher proportion than nitrogen in its composition, and silicon nitride oxide refers to a material that contains nitrogen at a higher proportion than oxygen in its composition.

The insulator 381 may have a function of a planarization film for eliminating a level difference caused by the transistor 550 or the like provided below the insulator 381. For example, a top surface of the insulator 381 may be planarized by planarization treatment using a chemical mechanical polishing (CMP) method or the like to improve planarity.

In addition, for the insulator 383, it is preferable to use a film having a barrier property that prevents diffusion of hydrogen or impurities from the substrate 371, the transistor 550, or the like into a region where the transistor 500 is provided.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably provided between the transistor 500 and the transistor 550. The film that inhibits hydrogen diffusion is specifically a film from which a small amount of hydrogen is released.

The amount of released hydrogen can be analyzed by thermal desorption spectroscopy (TDS) or the like, for example. The amount of hydrogen released from the insulator 383 that is converted into hydrogen atoms per area of the insulator 383 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the permittivity of the insulator 385 is preferably lower than that of the insulator 383. For example, the dielectric constant of the insulator 385 is preferably lower than 4, further preferably lower than 3. The dielectric constant of the insulator 385 is, for example, preferably 0.7 times or less, further preferably 0.6 times or less the dielectric constant of the insulator 383. When a material with a low permittivity is used for an interlayer film, parasitic capacitance generated between wirings can be reduced.

A conductor 328, a conductor 330, and the like that are connected to the capacitor 600 or the transistor 500 are embedded in the insulator 379, the insulator 381, the insulator 383, and the insulator 385. Note that the conductor 328 and the conductor 330 each have a function of a plug or a wiring. Furthermore, a plurality of conductors functioning as plugs or wirings are collectively denoted by the same reference numeral in some cases. Moreover, in this specification and the like, a wiring and a plug connected to the wiring may be a single component. That is, part of a conductor functions as a wiring in some cases and part of a conductor functions as a plug in other cases.

As a material for each of the plugs and wirings (the conductor 328, the conductor 330, and the like), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, it is preferable to use a low-resistance conductive material such as aluminum or copper. The use of a low-resistance conductive material can reduce wiring resistance.

A wiring layer may be provided over the insulator 385 and the conductor 330. For example, in FIG. 22, an insulator 350, an insulator 352, and an insulator 354 are provided to be stacked in this order. Furthermore, a conductor 356 is formed in the insulator 350, the insulator 352, and the insulator 354. The conductor 356 has a function of a plug or a wiring that is connected to the transistor 550. Note that the conductor 356 can be provided using a material similar to those for the conductor 328 and the conductor 330.

Note that for example, like the insulator 383, the insulator 350 is preferably formed using an insulator having a barrier property against hydrogen. Furthermore, the conductor 356 preferably contains a conductor having a barrier property against hydrogen. In particular, the conductor having a barrier property against hydrogen is formed in an opening portion of the insulator 350 having a barrier property against hydrogen. With this structure, the transistor 550 and the transistor 500 can be separated by a barrier layer, so that diffusion of hydrogen from the transistor 550 into the transistor 500 can be inhibited.

Note that for the conductor having a barrier property against hydrogen, tantalum nitride is preferably used, for example. In addition, by stacking tantalum nitride and tungsten, which has high conductivity, the diffusion of hydrogen from the transistor 550 can be inhibited while the conductivity as a wiring is kept. In that case, a structure in which a tantalum nitride layer having a barrier property against hydrogen is in contact with the insulator 350 having a barrier property against hydrogen is preferable.

A wiring layer may be provided over the insulator 354 and the conductor 356. For example, in FIG. 22, an insulator 360, an insulator 362, and an insulator 364 are provided to be stacked in this order. Furthermore, a conductor 366 is formed in the insulator 360, the insulator 362, and the insulator 364. The conductor 366 has a function of a plug or a wiring. Note that the conductor 366 can be provided using a material similar to those for the conductor 328 and the conductor 330.

Note that for example, like the insulator 383, the insulator 360 is preferably formed using an insulator having a barrier property against hydrogen. Furthermore, the conductor 366 preferably contains a conductor having a barrier property against hydrogen. In particular, the conductor having a barrier property against hydrogen is formed in an opening portion of the insulator 360 having a barrier property against hydrogen. With this structure, the transistor 550 and the transistor 500 can be separated by a barrier layer, so that diffusion of hydrogen from the transistor 550 into the transistor 500 can be inhibited.

A wiring layer may be provided over the insulator 364 and the conductor 366. For example, in FIG. 22, an insulator 370, an insulator 369, and an insulator 368 are provided to be stacked in this order. Furthermore, a conductor 376 is formed in the insulator 370, the insulator 369, and the insulator 368. The conductor 376 has a function of a plug or a wiring. Note that the conductor 376 can be provided using a material similar to those for the conductor 328 and the conductor 330.

Note that for example, like the insulator 383, the insulator 370 is preferably formed using an insulator having a barrier property against hydrogen. Furthermore, the conductor 376 preferably contains a conductor having a barrier property against hydrogen. In particular, the conductor having a barrier property against hydrogen is formed in an opening portion of the insulator 370 having a barrier property against hydrogen. With this structure, the transistor 550 and the transistor 500 can be separated by a barrier layer, so that diffusion of hydrogen from the transistor 550 into the transistor 500 can be inhibited.

A wiring layer may be provided over the insulator 368 and the conductor 376. For example, in FIG. 22, an insulator 380, an insulator 382, and an insulator 384 are provided to be stacked in this order. Furthermore, a conductor 386 is formed in the insulator 380, the insulator 382, and the insulator 384. The conductor 386 has a function of a plug or a wiring. Note that the conductor 386 can be provided using a material similar to those for the conductor 328 and the conductor 330.

Note that for example, like the insulator 383, the insulator 380 is preferably formed using an insulator having a barrier property against hydrogen. Furthermore, the conductor 386 preferably contains a conductor having a barrier property against hydrogen. In particular, the conductor having a barrier property against hydrogen is formed in an opening portion of the insulator 380 having a barrier property against hydrogen. With this structure, the transistor 550 and the transistor 500 can be separated by a barrier layer, so that diffusion of hydrogen from the transistor 550 into the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto.

Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are provided to be stacked in this order over the insulator 384. A substance having a barrier property against oxygen and hydrogen is preferably used for any of the insulator 510, the insulator 512, the insulator 514, and the insulator 516.

For example, for the insulator 510 and the insulator 514, it is preferable to use a film having a barrier property against hydrogen and impurities diffused from the substrate 371, a region where the transistor 550 is provided, or the like into the region where the transistor 500 is provided. Therefore, a material similar to that for the insulator 383 can be used.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably provided between the transistor 500 and the transistor 550.

In addition, for the film having a barrier property against hydrogen, a metal oxide such as aluminum oxide, hafnium oxide, or tantalum oxide is preferably used for the insulator 510 and the insulator 514, for example.

In particular, aluminum oxide has an excellent blocking effect that prevents the passage of both oxygen and impurities such as hydrogen and moisture which are factors of change in electrical characteristics of the transistor. Accordingly, aluminum oxide can prevent mixing of impurities such as hydrogen and moisture into the transistor 500 in the manufacturing process and after the manufacturing of the transistor. In addition, release of oxygen from the oxide included in the transistor 500 can be inhibited. Therefore, aluminum oxide is suitably used for a protective film of the transistor 500.

In addition, for the insulator 512 and the insulator 516, a material similar to that for the insulator 379 can be used, for example. Furthermore, when a material with a relatively low permittivity is used for these insulators, parasitic capacitance generated between wirings can be reduced. A silicon oxide film, a silicon oxynitride film, or the like can be used for the insulator 512 and the insulator 516, for example.

Furthermore, a conductor 518, a conductor included in the transistor 500 (e.g., a conductor 503), and the like are embedded in the insulator 510, the insulator 512, the insulator 514, and the insulator 516. Note that the conductor 518 has a function of a plug or a wiring that is connected to the capacitor 600 or the transistor 550. The conductor 518 can be provided using a material similar to those for the conductor 328 and the conductor 330.

In particular, the conductor 518 in a region in contact with the insulator 510 and the insulator 514 is preferably a conductor having a barrier property against oxygen, hydrogen, and water. With this structure, the transistor 550 and the transistor 500 can be separated by a layer having a barrier property against oxygen, hydrogen, and water; thus, diffusion of hydrogen from the transistor 550 into the transistor 500 can be inhibited.

The transistor 500 is provided above the insulator 516.

As illustrated in FIG. 23A to FIG. 23C, the transistor 500 includes the conductor 503 positioned to be embedded in the insulator 514 and the insulator 516; an insulator 520 positioned over the insulator 516 and the conductor 503; an insulator 522 positioned over the insulator 520; an insulator 524 positioned over the insulator 522; an oxide 530*a* positioned over the insulator 524; an oxide 530*b* positioned over the oxide 530*a*; a conductor 542*a* and a conductor 542*b* positioned apart from each other over the oxide 530*b*; an insulator 580 that is positioned over the conductor 542*a* and the conductor 542*b* and is provided with an opening formed to overlap with a region between the conductor 542*a* and the conductor 542*b*; an insulator 545 positioned on a bottom surface and a side surface of the opening; and a conductor 560 positioned on a formation surface of the insulator 545.

In addition, as illustrated in FIG. 23B and FIG. 23C, an insulator 544 is preferably positioned between the insulator 580 and the oxide 530*a*, the oxide 530*b*, the conductor 542*a*, and the conductor 542*b*. Furthermore, as illustrated in FIG. 23A to FIG. 23C, the conductor 560 preferably includes a conductor 560*a* provided inside the insulator 545 and a conductor 560*b* provided to be embedded inside the conductor 560*a*. Moreover, as illustrated in FIG. 23B and FIG. 23C, an insulator 574 is preferably positioned over the insulator 580, the conductor 560, and the insulator 545.

Note that in this specification and the like, the oxide 530*a* and the oxide 530*b* are sometimes collectively referred to as an oxide 530.

Note that although a structure of the transistor 500 in which two layers of the oxide 530*a* and the oxide 530*b* are stacked in a region where a channel is formed and its vicinity is illustrated, the present invention is not limited thereto. For example, it is possible to employ a structure in which a single layer of the oxide 530*b* or a stacked-layer structure of three or more layers is provided.

Furthermore, although the conductor 560 is illustrated to have a stacked-layer structure of two layers in the transistor 500, the present invention is not limited thereto. For example, the conductor 560 may have a single-layer structure or a stacked-layer structure of three or more layers. Note that the transistor 500 illustrated in FIG. 22 and FIG. 23A to FIG. 23C is an example, and the structures are not limited thereto; an appropriate transistor can be used in accordance with a circuit structure, a driving method, or the like.

Here, the conductor 560 functions as a gate electrode of the transistor 500, and the conductor 542*a* and the conductor 542*b* each function as a source electrode or a drain electrode. As described above, the conductor 560 is formed to be embedded in the opening of the insulator 580 and the region between the conductor 542*a* and the conductor 542*b*. The positions of the conductor 560, the conductor 542*a*, and the conductor 542*b* with respect to the opening of the insulator 580 are selected in a self-aligned manner. That is, in the transistor 500, the gate electrode can be positioned between the source electrode and the drain electrode in a self-aligned manner. Therefore, the conductor 560 can be formed without an alignment margin, resulting in a reduction in the area occupied by the transistor 500. Accordingly, miniaturization and high integration of the semiconductor device can be achieved.

In addition, since the conductor 560 is formed in the region between the conductor 542*a* and the conductor 542*b* in a self-aligned manner, the conductor 560 does not have a region overlapping with the conductor 542*a* or the conductor 542*b*. Thus, parasitic capacitance formed between the conductor 560 and each of the conductor 542*a* and the conductor 542*b* can be reduced. As a result, the switching speed of the transistor 500 can be improved, and the transistor 500 can have high frequency characteristics.

The conductor 560 sometimes functions as a first gate (also referred to as a gate or a top gate) electrode. In addition, the conductor 503 sometimes functions as a second gate (also referred to as a back gate or a bottom gate) electrode. In that case, the threshold voltage of the transistor 500 can be controlled by changing a potential applied to the conductor 503 not in synchronization with but independently of a potential applied to the conductor 560. In particular, when a negative potential is applied to the conductor 503, the threshold voltage of the transistor 500 can be further increased, and the off-state current can be reduced. Thus, a drain current at the time when a potential applied to the conductor 560 is 0 V can be lower in the case where a negative potential is applied to the conductor 503 than in the case where a negative potential is not applied to the conductor 503.

The conductor 503 is positioned to overlap with the oxide 530 and the conductor 560. Thus, in the case where potentials are applied to the conductor 560 and the conductor 503, an electric field generated from the conductor 560 and an electric field generated from the conductor 503 are connected, so that a channel formation region formed in the oxide 530 can be covered.

In this specification and the like, a transistor structure in which a channel formation region is electrically surrounded by electric fields of a pair of gate electrodes (a first gate electrode and a second gate electrode) is referred to as a surrounded channel (S-channel) structure. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

In addition, the conductor 503 has a structure similar to that of the conductor 518; a conductor 503*a* is formed in contact with an inner wall of an opening in the insulator 514 and the insulator 516, and a conductor 503*b* is formed on the inner side. Note that although the transistor 500 having a structure in which the conductor 503*a* and the conductor 503*b* are stacked is illustrated, the present invention is not limited thereto. For example, the conductor 503 may be provided as a single layer or to have a stacked-layer structure of three or more layers.

Here, for the conductor 503*a*, a conductive material having a function of preventing diffusion of impurities such as a hydrogen atom, a hydrogen molecule, a water molecule, and a copper atom (through which the impurities are less likely to pass) is preferably used. Alternatively, it is preferable to use a conductive material that has a function of inhibiting diffusion of oxygen (e.g., at least one of an oxygen atom, an oxygen molecule, and the like) (through which oxygen is less likely to pass). Note that in this specification, the function of inhibiting diffusion of impurities or oxygen means a function of inhibiting diffusion of any one or all of the impurities and oxygen.

For example, when the conductor 503*a* has a function of inhibiting diffusion of oxygen, a reduction in conductivity of the conductor 503*b* due to oxidation can be inhibited.

In addition, in the case where the conductor 503 also functions as a wiring, a conductive material with high conductivity that contains tungsten, copper, or aluminum as its main component is preferably used for the conductor 503*b*. Note that although the conductor 503 is illustrated to have a stacked layer of the conductor 503*a* and the conductor 503*b* in this embodiment, the conductor 503 may have a single-layer structure.

The insulator 520, the insulator 522 and the insulator 524 have a function of a second gate insulating film.

Here, as the insulator 524 that is in contact with the oxide 530, an insulator that contains oxygen more than oxygen in the stoichiometric composition is preferably used. Such oxygen is easily released from the film by heating. In this specification and the like, oxygen released by heating is sometimes referred to as "excess oxygen". That is, a region containing excess oxygen (also referred to as an "excess-oxygen region") is preferably formed in the insulator 524. When such an insulator containing excess oxygen is provided in contact with the oxide 530, oxygen vacancies ($V_O$) in the oxide 530 can be reduced and the reliability of the transistor 500 can be improved. When hydrogen enters the oxygen vacancies in the oxide 530, such defects (hereinafter, referred to as $V_O H$ in some cases) serve as donors and generate electrons serving as carriers in some cases. In other cases, bonding of part of hydrogen to oxygen bonded to a metal atom generates electrons serving as carriers. Thus, a transistor including an oxide semiconductor that contains a large amount of hydrogen is likely to have normally-on characteristics. Moreover, hydrogen in an oxide semiconductor is easily transferred by a stress such as heat or an electric field; thus, a large amount of hydrogen contained in an oxide semiconductor might reduce the reliability of the transistor. In one embodiment of the present invention, $V_O H$ in the oxide 530 is preferably reduced as much as possible so that the oxide 530 becomes a highly purified intrinsic or substantially highly purified intrinsic oxide. It is important to remove impurities such as moisture and hydrogen in an oxide semiconductor (sometimes described as "dehydration" or "dehydrogenation treatment") and to compensate for oxygen vacancies by supplying oxygen to the oxide semiconductor (sometimes described as "oxygen adding treatment") in order to obtain an oxide semiconductor whose $V_O H$ is sufficiently reduced. When an oxide semiconductor with sufficiently reduced impurities such as $V_O H$ is used for a channel formation region of a transistor, stable electrical characteristics can be given.

As the insulator including an excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably within the range of 100° C. to 700° C., or 100° C. to 400° C.

One or more of heat treatment, microwave treatment, and RF treatment may be performed in a state in which the insulator including the excess-oxygen region and the oxide 530 are in contact with each other. By the treatment, water or hydrogen in the oxide 530 can be removed. For example, in the oxide 530, dehydrogenation can be performed when a reaction in which a bond of $V_O H$ is cut occurs, i.e., a reaction of "$V_O H \rightarrow V_O + H$" occurs. Part of hydrogen generated at this time is bonded to oxygen to be $H_2O$, and removed from the oxide 530 or an insulator in the vicinity of the oxide 530 in some cases. Some hydrogen may be gettered into the conductor 542$a$ and the conductor 542$b$ in some cases.

For the microwave treatment, for example, an apparatus including a power source that generates high-density plasma or an apparatus including a power source that applies RF to the substrate side is suitably used. For example, the use of an oxygen-containing gas and high-density plasma enables high-density oxygen radicals to be generated, and application of the RF to the substrate side allows the oxygen radicals generated by the high-density plasma to be efficiently introduced into the oxide 530 or an insulator in the vicinity of the oxide 530. The pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate ratio ($O_2/(O_2 + Ar)$) is lower than or equal to 50%, preferably higher than or equal to 10% and lower than or equal to 30%.

In a manufacturing process of the transistor 500, heat treatment is preferably performed with the surface of the oxide 530 exposed. The heat treatment is performed at higher than or equal to 100° C. and lower than or equal to 450° C., preferably higher than or equal to 350° C. and lower than or equal to 400° C., for example. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 530 to reduce oxygen vacancies ($V_O$). The heat treatment may be performed under reduced pressure. Alternatively, the heat treatment may be performed in such a manner that heat treatment is performed in a nitrogen gas or inert gas atmosphere and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas or inert gas atmosphere.

Note that the oxygen adding treatment performed on the oxide 530 can promote a reaction in which oxygen vacancies in the oxide 530 are filled with supplied oxygen, i.e., a reaction of "$V_O + O \rightarrow null$". Furthermore, hydrogen remaining in the oxide 530 reacts with supplied oxygen, so that the hydrogen can be removed as $H_2O$ (dehydration). This can inhibit recombination of hydrogen remaining in the oxide 530 with oxygen vacancies and formation of $V_O H$.

In addition, in the case where the insulator 524 includes an excess-oxygen region, it is preferable that the insulator 522 have a function of inhibiting diffusion of oxygen (e.g., an oxygen atom, an oxygen molecule, or the like) (through which oxygen is less likely to pass).

When the insulator 522 has a function of inhibiting diffusion of oxygen and impurities, oxygen contained in the oxide 530 is not diffused to the insulator 520 side, which is preferable. Furthermore, the conductor 503 can be inhibited from reacting with oxygen contained in the insulator 524 and the oxide 530.

For the insulator 522, a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or (Ba,Sr)TiO$_3$ (BST) are preferably used, for example. As miniaturization and high integration of transistors progress, a problem such as a leakage current might arise because of a thinner gate insulating film. When a high-k material is used for an insulator functioning as the gate insulating film, a gate potential during transistor operation can be reduced while the physical thickness is maintained.

It is particularly preferable to use an insulator containing an oxide of one or both of aluminum and hafnium, which is an insulating material having a function of inhibiting diffusion of impurities, oxygen, and the like (through which oxygen is less likely to pass). Aluminum oxide, hafnium oxide, an oxide containing aluminum and hafnium (hafnium aluminate), or the like is preferably used as the insulator containing an oxide of one or both of aluminum and hafnium. In the case where the insulator 522 is formed using such a material, the insulator 522 functions as a layer that inhibits release of oxygen from the oxide 530 and mixing of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. The insulator over which silicon oxide, silicon oxynitride, or silicon nitride is stacked may be used.

It is preferable that the insulator 520 be thermally stable. For example, silicon oxide and silicon oxynitride are suitable because they are thermally stable. Furthermore, the combination of an insulator that is a high-k material and silicon oxide or silicon oxynitride enables the insulator 520 to have a stacked-layer structure that has thermal stability and a high relative dielectric constant.

Note that in the transistor 500 in FIG. 23A to FIG. 23C, the insulator 520, the insulator 522, and the insulator 524 are illustrated as the second gate insulating film having a stacked-layer structure of three layers; however, the second gate insulating film may be a single layer or may have a stacked-layer structure of two layers or four or more layers. In such cases, without limitation to a stacked-layer structure formed of the same material, a stacked-layer structure formed of different materials may be employed.

In the transistor 500, a metal oxide functioning as an oxide semiconductor is preferably used as the oxide 530 including a channel formation region. For example, as the oxide 530, a metal oxide such as an In-M-Zn oxide (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used.

The metal oxide functioning as an oxide semiconductor may be formed by a sputtering method or an ALD (Atomic Layer Deposition) method. Note that the metal oxide functioning as an oxide semiconductor is described in detail in another embodiment.

The metal oxide functioning as the channel formation region in the oxide 530 has a band gap of preferably 2 eV or higher, further preferably 2.5 eV or higher. With the use of a metal oxide having such a wide band gap, the off-state current of the transistor can be reduced.

When the oxide 530 includes the oxide 530a under the oxide 530b, it is possible to inhibit diffusion of impurities into the oxide 530b from the components formed below the oxide 530a.

Note that the oxide 530 preferably has a stacked-layer structure of a plurality of oxide layers that differ in the atomic ratio of metal atoms. Specifically, the atomic ratio of the element M to the constituent elements in the metal oxide used as the oxide 530a is preferably higher than the atomic ratio of the element M to the constituent elements in the metal oxide used as the oxide 530b. In addition, the atomic ratio of the element M to In in the metal oxide used as the oxide 530a is preferably higher than the atomic ratio of the element M to In in the metal oxide used as the oxide 530b. Furthermore, the atomic ratio of In to the element M in the metal oxide used as the oxide 530b is preferably higher than the atomic ratio of In to the element M in the metal oxide used as the oxide 530a.

The energy of the conduction band minimum of the oxide 530a is preferably higher than the energy of the conduction band minimum of the oxide 530b. In other words, the electron affinity of the oxide 530a is preferably smaller than the electron affinity of the oxide 530b.

Here, the energy level of the conduction band minimum gently changes at a junction portion of the oxide 530a and the oxide 530b. In other words, the energy level of the conduction band minimum at the junction portion of the oxide 530a and the oxide 530b continuously changes or is continuously connected. This can be obtained by decreasing the density of defect states in a mixed layer formed at the interface between the oxide 530a and the oxide 530b.

Specifically, when the oxide 530a and the oxide 530b contain a common element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like is used as the oxide 530a.

At this time, the oxide 530b serves as a main carrier path. When the oxide 530a has the above-described structure, the density of defect states at the interface between the oxide 530a and the oxide 530b can be made low. Thus, the influence of interface scattering on carrier conduction is small, and the transistor 500 can have a high on-state current.

The conductor 542a and the conductor 542b functioning as the source electrode and the drain electrode are provided over the oxide 530b. For the conductor 542a and the conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are conductive materials that are not easily oxidized or materials that retain their conductivity even after absorbing oxygen. Furthermore, a metal nitride film of tantalum nitride or the like is preferable because it has a barrier property against hydrogen or oxygen.

In addition, although the conductor 542a and the conductor 542b each having a single-layer structure are illustrated in FIG. 23B, a stacked-layer structure of two or more layers may be employed. For example, it is preferable to stack a tantalum nitride film and a tungsten film. Alternatively, a titanium film and an aluminum film may be stacked. Alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed thereover; and a three-layer structure where a molybdenum film or a molybdenum nitride film is formed, an aluminum film or a copper film is stacked over the molybdenum film or the molybdenum nitride film, and a molybdenum film or a molybdenum nitride film is formed thereover. Note that a transparent conductive material containing indium oxide, tin oxide, or zinc oxide may be used.

In addition, as illustrated in FIG. 23B, a region 543a and a region 543b are sometimes formed as low-resistance regions at an interface between the oxide 530 and the conductor 542a (the conductor 542b) and in the vicinity of the interface. In that case, the region 543a functions as one of a source region and a drain region, and the region 543b functions as the other of the source region and the drain region. Furthermore, the channel formation region is formed in a region between the region 543a and the region 543b.

When the conductor 542a (the conductor 542b) is provided to be in contact with the oxide 530, the oxygen concentration in the region 543a (the region 543b) sometimes decreases. In addition, a metal compound layer that contains the metal contained in the conductor 542a (the conductor 542b) and the component of the oxide 530 is sometimes formed in the region 543a (the region 543b). In such a case, the carrier density of the region 543a (the region 543b) increases, and the region 543a (the region 543b) becomes a low-resistance region.

The insulator 544 is provided to cover the conductor 542a and the conductor 542b and inhibits oxidation of the conductor 542a and the conductor 542b. At this time, the insulator 544 may be provided to cover a side surface of the oxide 530 and to be in contact with the insulator 524.

A metal oxide containing one kind or two or more kinds selected from hafnium, aluminum, gallium, yttrium, zirconium, tungsten, titanium, tantalum, nickel, germanium, neodymium, lanthanum, magnesium, and the like can be used for the insulator 544. Alternatively, silicon nitride oxide, silicon nitride, or the like can be used for the insulator 544.

It is particularly preferable to use an insulator containing an oxide of one or both of aluminum and hafnium, such as aluminum oxide, hafnium oxide, or an oxide containing aluminum and hafnium (hafnium aluminate), as the insulator 544. In particular, hafnium aluminate has higher heat resistance than a hafnium oxide film. Therefore, hafnium aluminate is preferable because it is less likely to be crystallized by heat treatment in a later step. Note that the insulator 544 is not an essential component when the conductor 542a and the conductor 542b are oxidation-resistant materials or do not significantly lose their conductivity even after absorbing oxygen. Design is appropriately determined in consideration of required transistor characteristics.

The insulator 544 can inhibit a phenomenon of diffusion of impurities such as water and hydrogen contained in the insulator 580 into the oxide 530b. Furthermore, oxidation of a conductor 542 (the conductor 542a and the conductor 542b) due to excess oxygen contained in the insulator 580 can be inhibited.

The insulator 545 functions as a first gate insulating film. Like the insulator 524, the insulator 545 is preferably formed using an insulator that contains excess oxygen and releases oxygen by heating.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride are preferable because they are thermally stable.

When an insulator containing excess oxygen is provided as the insulator 545, oxygen can be effectively supplied from the insulator 545 to the channel formation region of the oxide 530b. Furthermore, as in the insulator 524, the concentration of impurities such as water or hydrogen in the insulator 545 is preferably reduced. The thickness of the insulator 545 is preferably greater than or equal to 1 nm and less than or equal to 20 nm. The above-described microwave treatment may be performed before and/or after the insulator 545 is formed.

Furthermore, to efficiently supply excess oxygen contained in the insulator 545 to the oxide 530, a metal oxide may be provided between the insulator 545 and the conductor 560. The metal oxide preferably inhibits diffusion of oxygen from the insulator 545 into the conductor 560. Providing the metal oxide that inhibits diffusion of oxygen inhibits diffusion of excess oxygen from the insulator 545 into the conductor 560. That is, a reduction in the amount of excess oxygen supplied to the oxide 530 can be inhibited. Moreover, oxidation of the conductor 560 due to excess oxygen can be inhibited. For the metal oxide, a material that can be used for the insulator 544 is used.

Note that the insulator 545 may have a stacked-layer structure like the second gate insulating film. As miniaturization and high integration of transistors progress, a problem such as a leakage current might arise because of a thinner gate insulating film. For that reason, when the insulator functioning as the gate insulating film has a stacked-layer structure of a high-k material and a thermally stable material, a gate potential during transistor operation can be reduced while the physical thickness is maintained. Furthermore, the stacked-layer structure can be thermally stable and have a high dielectric constant.

Although the conductor 560 that functions as the first gate electrode and has a two-layer structure is illustrated in FIG. 23B and FIG. 23C, a single-layer structure or a stacked-layer structure of three or more layers may be employed.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, and the like), and a copper atom. Alternatively, it is preferable to use a conductive material that has a function of inhibiting diffusion of oxygen (e.g., at least one of an oxygen atom, an oxygen molecule, and the like). When the conductor 560a has a function of inhibiting diffusion of oxygen, a reduction in conductivity of the conductor 560b due to oxidation caused by oxygen contained in the insulator 545 can be inhibited. As a conductive material having a function of inhibiting diffusion of oxygen, for example, tantalum, tantalum nitride, ruthenium, ruthenium oxide, or the like is preferably used. For the conductor 560a, the oxide semiconductor that can be used as the oxide 530 can be used. In that case, when the conductor 560*b* is deposited by a sputtering method, the conductor 560*a* can have a reduced electrical resistance value to be a conductor. Such a conductor can be referred to as an OC (Oxide Conductor) electrode.

In addition, a conductive material containing tungsten, copper, or aluminum as its main component is preferably used for the conductor 560*b*. Furthermore, the conductor 560*b* also functions as a wiring and thus a conductor having high conductivity is preferably used as the conductor 560*b*. For example, a conductive material containing tungsten, copper, or aluminum as its main component can be used. The conductor 560*b* may have a stacked-layer structure, for example, a stacked-layer structure of any of the above conductive materials and titanium or titanium nitride.

The insulator 580 is provided over the conductor 542*a* and the conductor 542*b* with the insulator 544 therebetween. The insulator 580 preferably includes an excess-oxygen region. For example, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, resin, or the like is preferably contained as the insulator 580. In particular, silicon oxide and silicon oxynitride are preferable because they are thermally stable. In particular, silicon oxide and porous silicon oxide are preferable because an excess-oxygen region can be easily formed in a later step.

The insulator 580 preferably includes an excess-oxygen region. When the insulator 580 that releases oxygen by heating is provided, oxygen in the insulator 580 can be efficiently supplied to the oxide 530. Note that the concentration of impurities such as water or hydrogen in the insulator 580 is preferably reduced.

The opening of the insulator 580 is formed to overlap with the region between the conductor 542*a* and the conductor 542*b*. Accordingly, the conductor 560 is formed to be embedded in the opening of the insulator 580 and the region between the conductor 542*a* and the conductor 542*b*.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening of the insulator 580; thus, even when the conductor 560 has a shape with a high aspect ratio, the conductor 560 can be formed without collapsing during the process.

The insulator 574 is preferably provided in contact with a top surface of the insulator 580, atop surface of the conductor 560, and atop surface of the insulator 545. When the insulator 574 is deposited using a sputtering method, excess-oxygen regions can be provided in the insulator 545 and the insulator 580. Accordingly, oxygen can be supplied from the excess-oxygen regions to the oxide 530.

For example, a metal oxide containing one kind or two or more kinds selected from hafnium, aluminum, gallium, yttrium, zirconium, tungsten, titanium, tantalum, nickel, germanium, magnesium, and the like can be used as the insulator 574.

In particular, aluminum oxide has a high barrier property, and even a thin aluminum oxide film having a thickness greater than or equal to 0.5 nm and less than or equal to 3.0 nm can inhibit diffusion of hydrogen and nitrogen. Accordingly, aluminum oxide deposited by a sputtering method serves as an oxygen supply source and can also have a function of a barrier film against impurities such as hydrogen.

In addition, an insulator 581 functioning as an interlayer film is preferably provided over the insulator 574. As in the insulator 524 or the like, the concentration of impurities such as water or hydrogen in the insulator 581 is preferably reduced.

Furthermore, a conductor 540*a* and a conductor 540*b* are positioned in openings formed in the insulator 581, the insulator 574, the insulator 580, and the insulator 544. The conductor 540*a* and the conductor 540*b* are provided to face each other with the conductor 560 therebetween. The structure of the conductor 540*a* and the conductor 540*b* are similar to a structure of a conductor 546 and a conductor 548 that will be described later.

An insulator 582 is provided over the insulator 581. A substance having a barrier property against oxygen and hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has an excellent blocking effect that prevents the passage of both oxygen and impurities such as hydrogen and moisture which are factors of change in electrical characteristics of the transistor. Accordingly, aluminum oxide can prevent mixing of impurities such as hydrogen and moisture into the transistor 500 in the manufacturing process and after the manufacturing of the transistor. In addition, release of oxygen from the oxide included in the transistor 500 can be inhibited. Therefore, aluminum oxide is suitably used for a protective film of the transistor 500.

In addition, an insulator 586 is provided over the insulator 582. For the insulator 586, a material similar to that for the insulator 379 can be used. Furthermore, when a material with a relatively low permittivity is used for these insulators, parasitic capacitance generated between wirings can be reduced. A silicon oxide film, a silicon oxynitride film, or the like can be used for the insulator 586, for example.

Furthermore, the conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the capacitor 600, the transistor 500, or the transistor 550. The conductor 546 and the conductor 548 can be provided using a material similar to those for the conductor 328 and the conductor 330.

After the transistor 500 is formed, an opening may be formed to surround the transistor 500 and an insulator having a high barrier property against hydrogen or water may be formed to cover the opening. Surrounding the transistor 500 with the insulator having a high barrier property can prevent entry of moisture and hydrogen from the outside. Alternatively, a plurality of transistors 500 may be collectively surrounded by the insulator having a high barrier property against hydrogen or water. When an opening is formed to surround the transistor 500, for example, the formation of an opening reaching the insulator 522 or the insulator 514 and the formation of the insulator having a high barrier property in contact with the insulator 522 or the insulator 514 are suitable because these formation steps can also serve as part of the manufacturing steps of the transistor 500. The insulator having a high barrier property against hydrogen or water is formed using a material similar to that for the insulator 522 or the insulator 514, for example.

Next, the capacitor 600 is provided above the transistor 500. The capacitor 600 includes a conductor 610, a conductor 620, and an insulator 630.

In addition, a conductor 612 may be provided over the conductor 546 and the conductor 548. The conductor 612 has a function of a plug or a wiring that is connected to the transistor 500. The conductor 610 has a function of an electrode of the capacitor 600. Note that the conductor 612 and the conductor 610 can be formed at the same time.

For the conductor 612 and the conductor 610, a metal film containing an element selected from molybdenum, titanium, tantalum, tungsten, aluminum, copper, chromium, neodymium, and scandium; a metal nitride film containing the above element as its component (a tantalum nitride film, a titanium nitride film, a molybdenum nitride film, or a tungsten nitride film); or the like can be used. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

Although the conductor 612 and the conductor 610 each having a single-layer structure are shown in this embodiment, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

The insulator 630 can be formed using a material similar to that for another insulator. Alternatively, a material having ferroelectricity may be used for the insulator 630. As a material having ferroelectricity, for example, a mixed crystal of hafnium oxide and zirconium oxide (also referred to as "HZO") or a material in which an element X (the element X is silicon (Si), aluminum (Al), gadolinium (Gd), yttrium (Y), lanthanum (La), strontium (Sr), or the like) is added to hafnium oxide can be used. Alternatively, a piezoelectric ceramic having a perovskite structure may be used for the insulator 630. For example, as a material having ferroelectricity, lead zirconate titanate (PZT), strontium bismuth tantalate (SBT), bismuth ferrite (BFO), or barium titanate may be used.

The conductor 620 is provided to overlap with the conductor 610 with the insulator 630 therebetween. Note that a conductive material such as a metal material, an alloy material, or a metal oxide material can be used for the conductor 620. It is preferable to use a high-melting-point material that has both heat resistance and conductivity, such as tungsten or molybdenum, and it is particularly preferable to use tungsten. In addition, in the case where the conductor 620 is formed concurrently with another component such as a conductor, Cu (copper), Al (aluminum), or the like, which is a low-resistance metal material, is used.

An insulator 640 is provided over the conductor 620 and the insulator 630. For the insulator 640, a material similar to that for the insulator 379 can be used. In addition, the insulator 640 may function as a planarization film that covers an uneven shape therebelow.

With the use of this structure, a semiconductor device using a transistor including an oxide semiconductor can be miniaturized or highly integrated.

This embodiment can be combined with the other embodiments described in this specification and the like as appropriate.

Embodiment 6

Described in this embodiment is a metal oxide (hereinafter also referred to as an oxide semiconductor) that can be used in an OS transistor described in the above embodiment.

The metal oxide preferably contains one of indium and zinc. In particular, indium and zinc are preferably contained. In addition to them, aluminum, gallium, yttrium, tin, or the like is preferably contained. Furthermore, one kind or two or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structures>

First, the classification of crystal structures of an oxide semiconductor is described with reference to FIG. 24A. FIG. 24A is a diagram showing classification of crystal structures of an oxide semiconductor, typically IGZO (a metal oxide containing In, Ga, and Zn).

As shown in FIG. 24A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (Cloud-Aligned Composite). Note that the term "Crystalline" excludes single crystal, poly crystal, and completely amorphous. The term "Crystal" includes single crystal and poly crystal.

Note that the structures in the thick frame in FIG. 24A are in an intermediate state between "Amorphous" and "Crystal", and belong to a new crystalline phase. That is, these structures are completely different from "Amorphous", which is energetically unstable, and "Crystal".

A crystal structure of a film or a substrate can be analyzed with an X-ray diffraction (XRD) spectrum. FIG. 24B shows an XRD spectrum, which is obtained using GIXD (Grazing-Incidence XRD) measurement, of a CAAC-IGZO film classified into "Crystalline". Note that a GIXD method is also referred to as a thin film method or a Seemann-Bohlin method. The XRD spectrum that is shown in FIG. 24B and obtained by GIXD measurement is hereinafter simply referred to as an XRD spectrum. The CAAC-IGZO film in FIG. 24B has a composition in the vicinity of In:Ga:Zn=4:2:3 [atomic ratio]. The CAAC-IGZO film in FIG. 24B has a thickness of 500 nm.

As shown in FIG. 24B, a clear peak indicating crystallinity is detected in the XRD spectrum of the CAAC-IGZO film. Specifically, a peak indicating c-axis alignment is detected at 2θ of around 31° in the XRD spectrum of the CAAC-IGZO film. As shown in FIG. 24B, the peak at 2θ of around 31° is asymmetric with respect to the axis of the angle at which the peak intensity is detected.

A crystal structure of a film or a substrate can also be evaluated with a diffraction pattern obtained by a nanobeam electron diffraction (NBED) method (such a pattern is also referred to as a nanobeam electron diffraction pattern). FIG. 24C shows a diffraction pattern of a CAAC-IGZO film. FIG. 24C shows a diffraction pattern obtained with the NBED method in which an electron beam is incident in the direction parallel to the substrate. The CAAC-IGZO film in FIG. 24C has a composition in the vicinity of In:Ga:Zn=4:2:3 [atomic ratio]. In the nanobeam electron diffraction method, electron diffraction is performed with a probe diameter of 1 nm.

As shown in FIG. 24C, a plurality of spots indicating c-axis alignment are observed in the diffraction pattern of the CAAC-IGZO film.

<<Structure of Oxide Semiconductor>>

Oxide semiconductors might be classified in a manner different from that in FIG. 24A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region with a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that the distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one kind or two or more kinds selected from aluminum, gallium, yttrium, tin, titanium, and the like), the CAAC-OS tends to have a layered crystal structure (also referred to as a layered structure) in which layers containing indium (In) and oxygen (hereinafter In layers) and layers containing the element M, zinc (Zn), and oxygen (hereinafter (M,Zn) layers) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear crystal grain boundary is observed is what is called polycrystal. It is highly probable that the crystal grain boundary becomes a recombination center and captures carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for an OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor with some analysis methods. For example, when an nc-OS film is subjected to structural analysis using out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., greater than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., greater than or equal to 1 nm and less than or equal to 30 nm).

[a-Like OS]

The a-like OS is an oxide semiconductor having a structure between those of the nc-OS and the amorphous oxide semiconductor. The a-like OS includes a void or a low-density region. That is, the a-like OS has lower crystallinity than the nc-OS and the CAAC-OS. Moreover, the a-like OS has a higher hydrogen concentration in the film than the nc-OS and the CAAC-OS.

<<Composition of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. As another example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, a high on-state current ($I_{on}$), high field-effect mobility ($\mu$), and an excellent switching operation can be achieved.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor with a low carrier concentration is preferably used for a transistor. For example, the carrier concentration of an oxide semiconductor is lower than or equal to $1 \times 10^{17}$ cm$^{-3}$, preferably lower than or equal to $1 \times 10^{15}$ cm$^{-3}$, further preferably lower than or equal to $1 \times 10^{13}$ cm$^{-3}$, still further preferably lower than or equal to $1 \times 10^{11}$ cm$^{-3}$, yet further preferably lower than $1 \times 10^{10}$ cm$^{-3}$, and higher than or equal to $1 \times 10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Electric charge trapped by the trap states in the oxide semiconductor takes a long time to disappear and might behave like fixed electric charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurities>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2 \times 10^{18}$ atoms/$cm^3$, preferably lower than or equal to $2 \times 10^{17}$ atoms/$cm^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained using SIMS, is set lower than or equal to $1 \times 10^{18}$ atoms/$cm^3$, preferably lower than or equal to $2 \times 10^{16}$ atoms/$cm^3$.

When the oxide semiconductor contains nitrogen, the oxide semiconductor easily becomes n-type because of generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained using SIMS, is set lower than $5 \times 10^{19}$ atoms/$cm^3$, preferably lower than or equal to $5 \times 10^{18}$ atoms/$cm^3$, further preferably lower than or equal to $1 \times 10^{18}$ atoms/$cm^3$, still further preferably lower than or equal to $5 \times 10^{17}$ atoms/$cm^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained using SIMS, is set lower than $1 \times 10^{20}$ atoms/$cm^3$, preferably lower than $1 \times 10^{19}$ atoms/$cm^3$, further preferably lower than $5 \times 10^{18}$ atoms/$cm^3$, still further preferably lower than $1 \times 10^{18}$ atoms/$cm^3$.

When an oxide semiconductor with sufficiently reduced impurities is used for the channel formation region of the transistor, stable electrical characteristics can be given.

This embodiment can be combined with the other embodiments described in this specification and the like as appropriate.

Embodiment 7

In this embodiment, an IC chip, an electronic component, electronic devices, and the like are described as examples of a semiconductor device.

Example of Method for Manufacturing Electronic Component

Figure 25A:
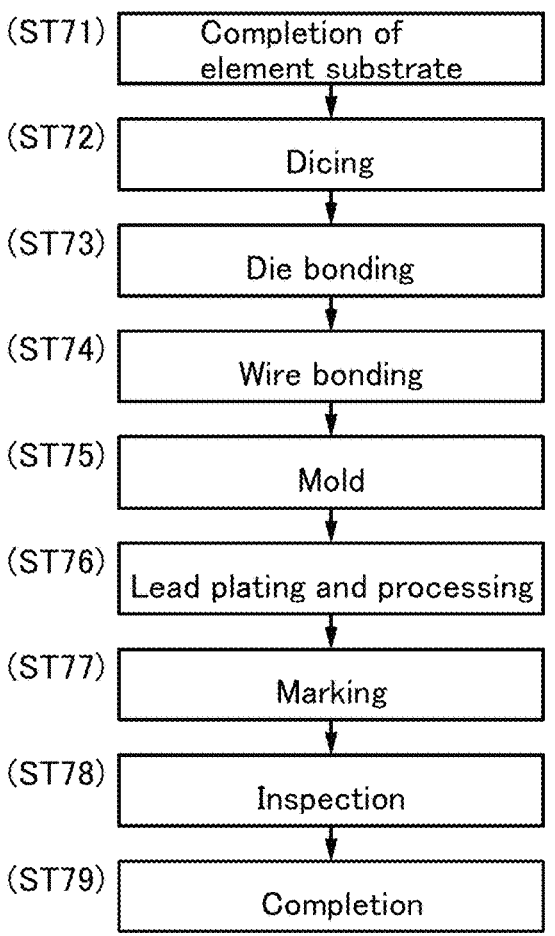
FIG. 25A is a flow chart showing an example of a method for manufacturing an electronic component.

FIG. 25A is a flow chart showing an example of a method for manufacturing an electronic component. Note that an electronic component is also referred to as a semiconductor package or an IC package. For the electronic component, there are a plurality of standards and names corresponding to a terminal extraction direction and a terminal shape. Thus, examples of the electronic component are described in this embodiment.

A semiconductor device composed of a transistor is completed by integrating a plurality of detachable components on a printed circuit board through an assembly process (post-process). The post-process can be completed through steps shown in FIG. 25A. Specifically, after an element substrate obtained in the pre-process is completed (Step ST71), a back surface of the substrate is ground. The substrate is thinned in this step to reduce warpage or the like of the substrate in the pre-process and to reduce the size of the component. Next, a dicing step is performed to divide the substrate into a plurality of chips (Step ST72).

Figure 25B:
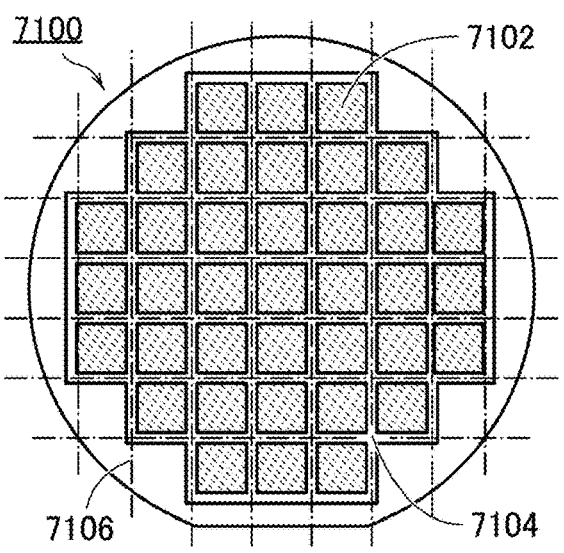
FIG. 25B is a top view of a semiconductor wafer.
Figure 25C:
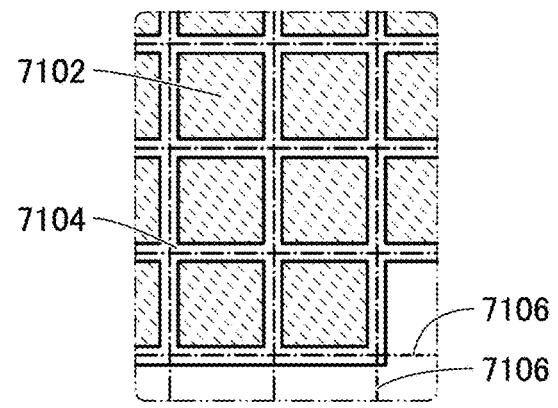
FIG. 25C is an enlarged view of part of the semiconductor wafer.

FIG. 25B is a top view of a semiconductor wafer 7100 before the dicing step is performed. FIG. 25C is a partial enlarged view of FIG. 25B. A plurality of circuit regions 7102 is provided on the semiconductor wafer 7100. The semiconductor device of an embodiment of the present invention (e.g., a holding circuit, a memory device, an imaging device, or an MCU) is provided in the circuit region 7102.

Figure 25D:
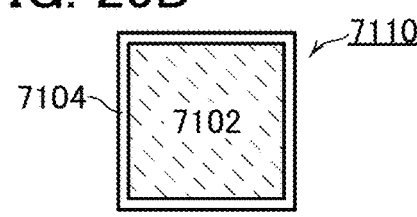
FIG. 25D is a schematic view of a chip.

Each of the plurality of circuit regions 7102 is surrounded by a separation region 7104. Separation lines (also referred to as "dicing lines") 7106 are set at a position overlapping with the separation regions 7104. In the dicing step (Step ST72), the semiconductor wafer 7100 is cut along the separation lines 7106, whereby chips 7110 including the circuit regions 7102 are cut out from the semiconductor wafer 7100. FIG. 25D illustrates an enlarged view of the chip 7110.

A conductive layer or a semiconductor layer may be provided in the separation regions 7104. When a conductive layer or a semiconductor layer is provided in the separation regions 7104, ESD that might be caused in a dicing step is relieved, so that a decrease in the yield due to the dicing step can be prevented. Furthermore, a dicing step is generally performed while pure water whose specific resistance is decreased by dissolution of a carbonic acid gas or the like is supplied to a cut portion, in order to cool down a substrate, remove swarf, and prevent electrification, for example. Providing a conductive layer or a semiconductor layer in the separation regions 7104 allows a reduction in the usage of the pure water. Therefore, the cost of manufacturing the semiconductor device can be reduced. Moreover, the productivity of the semiconductor device can be improved.

After Step ST72 is performed, a die bonding step in which the separated chips are separately picked out and mounted and bonded on a lead frame is performed (Step ST73). As a method for bonding the chip to the lead frame in the die bonding step, a method suitable for the product may be selected. The bonding may be performed, for example, with a resin or a tape. In the die bonding step, the chip may be mounted on an interposer and bonded thereto. In a wire bonding step, a lead of the lead frame and an electrode on the chip are electrically connected to each other with a metal fine line (wire) (Step ST74). A silver line or a gold line can be used as the metal fine line. The wire bonding may be either ball bonding or wedge bonding.

A wire-bonded chip is subjected to a molding step of sealing with epoxy resin or the like (Step ST75). The molding step is performed, whereby the inside of the electronic component is filled with a resin, so that damage to the circuit portion and the wire embedded in the electronic component caused by external mechanical force can be reduced, and in addition, deterioration of characteristics due to moisture and/or dust can be reduced. The lead of the lead frame is subjected to plating treatment. Then, the lead is cut and processed (Step ST76). By the plating treatment, corrosion of the lead can be prevented, and soldering for mounting the electronic component on a printed circuit board in a later step can be performed more surely. Printing treatment (marking) is performed on a surface of the package (Step ST77). Through an inspection step (Step ST78), the electronic component is completed (Step ST79). When the semiconductor device described in the above embodiment is incorporated, a low-power small electronic component can be provided.

Figure 25E:
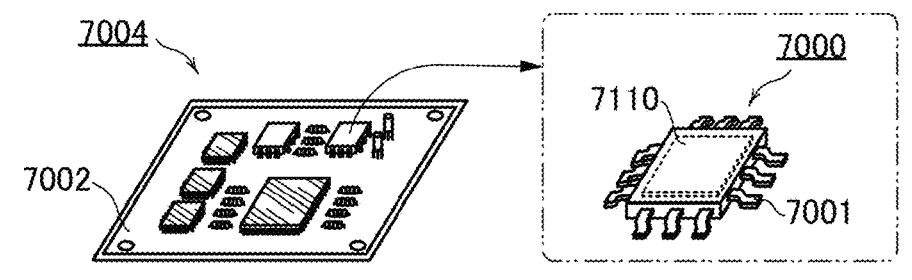
FIG. 25E is a schematic perspective view of a structure example of the electronic component.

FIG. 25E illustrates a schematic perspective view of the completed electronic component. FIG. 25E illustrates a schematic perspective view of a QFP (Quad Flat Package) as an example of the electronic component. As illustrated in FIG. 25E, an electronic component 7000 includes a lead 7001 and the chip 7110.

The electronic component 7000 is mounted on a printed circuit board 7002, for example. A plurality of electronic components 7000 described above which are combined and electrically connected to each other over the printed circuit board 7002 can be mounted on an electronic device. A completed circuit board 7004 is provided in an electronic device or the like. When an electronic device includes the electronic component 7000, the power consumption of the electronic device can be reduced. Alternatively, the electronic device can easily have a smaller size.

The electronic component 7000 can be used for electronic components (IC chips) of electronic devices in a wide variety of fields, such as digital signal processing, software-defined radio systems, avionics (electronic devices related to aircraft, such as communication systems, navigation systems, autopilot systems, and flight management systems), ASIC prototyping, medical image processing, voice recognition, encryption, bioinformatics (bioinformatics), emulators for mechanical systems, and radio telescopes in radio astronomy. Examples of such an electronic device include cameras (e.g., video cameras and digital still cameras), display apparatuses, personal computers (PC), cellular phones, game machines including portable game machines, portable information terminals (e.g., smartphones and tablet information terminals), e-book readers, wearable information terminals (e.g., watch-type information terminals, head-mounted information terminals, goggle-type information terminals, glasses-type information terminals, armband-type information terminals, bracelet-type information terminals, and necklace-type information terminals), navigation systems, audio reproducing devices (e.g., car audio players and digital audio players), copiers, facsimiles, printers, multi-function printers, automated teller machines (ATM), vending machines, and consumer electronics.

This embodiment can be combined with the other embodiments described in this specification and the like as appropriate.

Embodiment 8

In this embodiment, examples of electronic devices each including the semiconductor device of one embodiment of the present invention are described. FIG. 26A to FIG. 26J illustrate examples of electronic devices. FIG. 26A to FIG. 26J illustrate electronic devices each including the electronic component 7000 that includes the semiconductor device of one embodiment of the present invention.

In a variety of electronic devices, for example, AD conversion for converting a variety of analog information such as acoustic information, imaging information, illuminance information, and temperature information into digital information is performed in some cases. The use of the semiconductor device of one embodiment of the present invention for an electronic device enables AD conversion while inhibiting an increase in power consumption. That is, the use of the semiconductor device of one embodiment of the present invention for an electronic device can reduce power consumption. In addition, the use of the semiconductor device of one embodiment of the present invention enables AD conversion with high accuracy. Furthermore, the use of the semiconductor device of one embodiment of the present invention enables high-speed AD conversion.

[Cellular Phone]

Figure 26A:
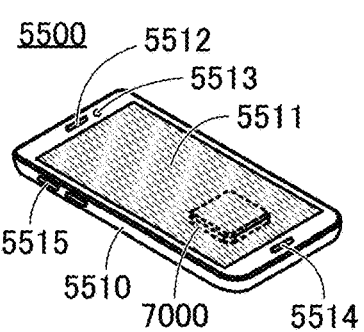
FIG. 26A to FIG. 26J are diagrams illustrating examples of electronic devices.

An information terminal 5500 illustrated in FIG. 26A is a cellular phone (a smartphone), which is a type of portable information terminal. The information terminal 5500 includes a housing 5510, a display portion 5511, a speaker 5512, a camera 5513, a microphone 5514, and the like, and as input interfaces, a touch panel is provided in the display portion 5511 and operation switches 5515 are provided in the housing 5510.

The information terminal 5500 can hold a temporary file generated at the time of executing an application (e.g., a web browser's cache). In the information terminal 5500, AD conversion for converting a variety of analog information such as acoustic information, imaging information, and illuminance information into digital information is performed, for example.

[Wearable Terminal]

Figure 26B:
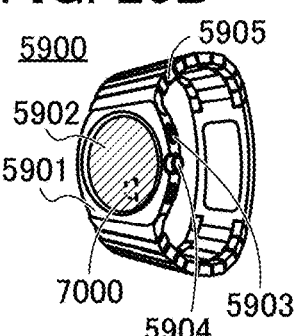

In addition, FIG. 26B illustrates an information terminal 5900 that is an example of a wearable terminal. The information terminal 5900 includes a housing 5901, a display portion 5902, an operation switch 5903, an operation switch 5904, a band 5905, and the like.

The information terminal 5900 includes various sensors such as a temperature sensor, a pressure sensor, and an illuminance sensor. In the information terminal 5900, AD conversion for converting analog information obtained by the various sensors into digital information is performed, for example.

[Information Terminal]

Figure 26C:
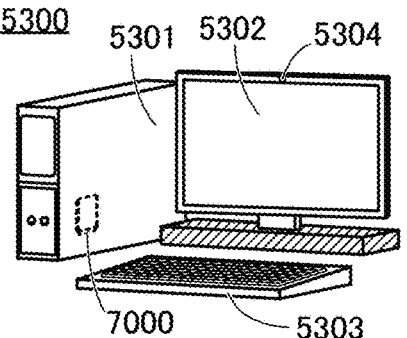

In addition, FIG. 26C illustrates a desktop information terminal 5300. The desktop information terminal 5300 includes a main body 5301 of the information terminal, a display portion 5302, a keyboard 5303, a camera 5304, and the like.

In the desktop information terminal 5300, AD conversion for converting a variety of analog information into digital information is performed, for example, as in the information terminal 5500 described above.

Note that although the smartphone, the wearable terminal, and the desktop information terminal are respectively illustrated in FIG. 26A to FIG. 26C as examples of the electronic device, one embodiment of the present invention can be applied to an information terminal other than a smartphone, a wearable terminal, and a desktop information terminal. Examples of information terminals other than a smartphone, a wearable terminal, and a desktop information terminal include a PDA (Personal Digital Assistant), a laptop information terminal, and a workstation.

[Household Appliance]

Figure 26D:
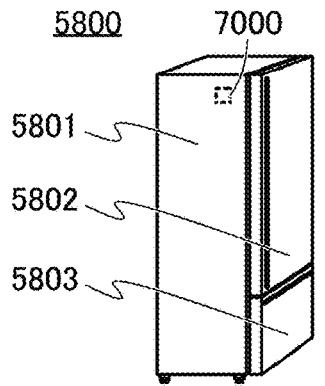

In addition, FIG. 26D illustrates an electric refrigerator-freezer 5800 as an example of a household appliance. The electric refrigerator-freezer 5800 includes a housing 5801, a refrigerator door 5802, a freezer door 5803, and the like. For example, the electric refrigerator-freezer 5800 is an electric refrigerator-freezer that is compatible with IoT (Internet of Things).

The semiconductor device of one embodiment of the present invention can be applied to the electric refrigerator-freezer 5800. The electric refrigerator-freezer 5800 can transmit and receive information on food stored in the electric refrigerator-freezer 5800 and food expiration dates, for example, to and from an information terminal and the like via the Internet. In the electric refrigerator-freezer 5800, AD conversion for converting a variety of analog information such as temperature in the electric refrigerator-freezer 5800 into digital information is performed, for example.

Although the electric refrigerator-freezer is described in this example as a household appliance, examples of other household appliances include a vacuum cleaner, a microwave oven, an electric oven, a rice cooker, a water heater, an IH cooker, a water server, a heating-cooling combination appliance such as an air conditioner, a washing machine, a drying machine, an audiovisual appliance, and the like.

[Game Machine]

Figure 26E:
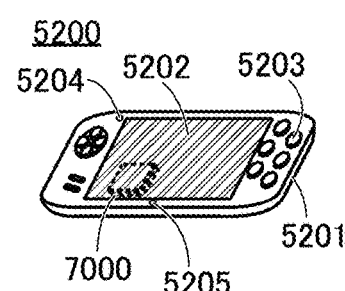

In addition, FIG. 26E illustrates a portable game machine 5200 as an example of a game machine. The portable game machine 5200 includes a housing 5201, a display portion 5202, operation switches 5203, an illuminance sensor 5204, a microphone 5205, and the like.

Figure 26F:
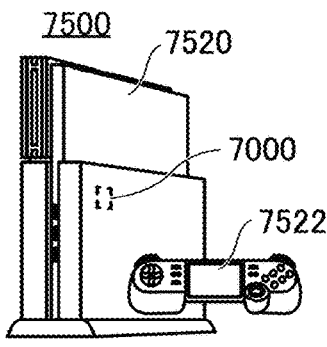

In addition, FIG. 26F illustrates a stationary game machine 7500 as another example of a game machine. The stationary game machine 7500 includes a main body 7520 and a controller 7522. Note that the controller 7522 can be connected to the main body 7520 with or without a wire. Furthermore, although not illustrated in FIG. 26F, the controller 7522 can include a display portion that displays a game image, and an input interface besides operation switches, such as a touch panel, a stick, a rotating knob, a sliding knob, or a microphone, for example. Moreover, the shape of the controller 7522 is not limited to that illustrated in FIG. 26F, and the shape of the controller 7522 may be changed in various ways in accordance with the genres of games. For example, for a shooting game such as an FPS (First Person Shooter) game, a gun-shaped controller having a trigger as an operation switch can be used. As another example, for a music game or the like, a controller having a shape of a musical instrument, audio equipment, or the like can be used. Furthermore, the stationary game machine may include a camera, a depth sensor, a microphone, and the like so that the game player can play a game using a gesture and/or a voice instead of a controller.

In addition, videos displayed on the game machine can be output with a display apparatus such as a television device, a personal computer display, a game display, or a head-mounted display.

In the portable game machine 5200, the stationary game machine 7500, or the like, AD conversion for converting a variety of analog information into digital information is performed, for example. The semiconductor device of one embodiment of the present invention is employed for the portable game machine 5200, the stationary game machine 7500, or the like, so that the portable game machine 5200 with low power consumption or the stationary game machine 7500 with low power consumption can be achieved. Moreover, heat generation from a circuit can be reduced owing to low power consumption; thus, the influence of heat generation on the circuit itself, a peripheral circuit, and a module can be reduced.

Although the portable game machine 5200 and the stationary game machine 7500 are each described as a game machine that is a type of an electronic device, examples of the electronic device of one embodiment of the present invention also include an arcade game machine installed in entertainment facilities (a game center, an amusement park, and the like), and a throwing machine for batting practice installed in sports facilities.

[Moving Vehicle]

The semiconductor device described in the above embodiment can be used for a motor vehicle, which is a moving vehicle, and around the driver's seat in a motor vehicle.

Figure 26G:
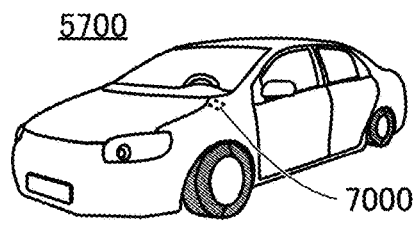

FIG. 26G illustrates an automobile 5700 as an example of a moving vehicle.

An instrument panel that provides various kinds of information by displaying a speedometer, a tachometer, a mileage, a fuel meter, a gearshift state, air-conditioning settings, and the like is provided around the driver's seat in the automobile 5700. In addition, a display apparatus showing the above information may be provided around the driver's seat.

In particular, the display apparatus can compensate for the view obstructed by the pillar or the like, the blind areas for the driver's seat, and the like using an image taken by an imaging device (not illustrated) provided on the exterior of the automobile 5700, which improves safety.

In the automobile 5700, AD conversion for converting a variety of analog information into digital information is performed. The digital information obtained by the AD conversion are used in a system performing automatic driving, navigation, risk prediction, or the like. The semiconductor device of one embodiment of the present invention can perform AD conversion with high accuracy. Alternatively, the semiconductor device of one embodiment of the present invention can perform AD conversion at high speed. The use of the semiconductor device of one embodiment of the present invention can improve the accuracy of arithmetic processing for automatic driving, navigation, risk prediction, or the like. The use of the semiconductor device of one embodiment of the present invention can improve the speed of arithmetic processing for automatic driving, navigation, risk prediction, or the like.

Note that although an automobile is described above as an example of a moving vehicle, the moving vehicle is not limited to an automobile. Examples of moving vehicles include a train, a monorail train, a ship, a flying object (a helicopter, an unmanned aircraft (a drone), an airplane, and a rocket), and the like.

[Camera]

The semiconductor device of one embodiment of the present invention can be used for a camera.

Figure 26H:
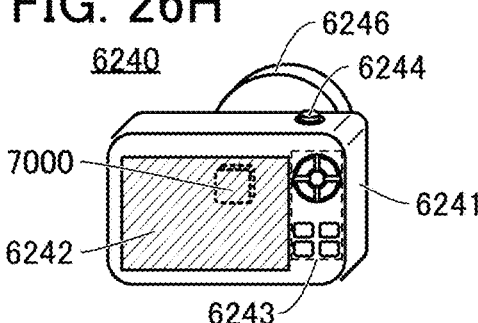

FIG. 26H illustrates a digital camera 6240 as an example of an imaging device. The digital camera 6240 includes a housing 6241, a display portion 6242, operation switches 6243, a shutter button 6244, and the like, and a detachable lens 6246 is attached to the digital camera 6240. Note that here, although the camera 6240 is configured such that the lens 6246 is detachable from the housing 6241 for replacement, the lens 6246 may be integrated with the housing 6241. In addition, the digital camera 6240 can be additionally equipped with a stroboscope, a viewfinder, or the like.

The use of the semiconductor device of one embodiment of the present invention for the digital camera 6240 enables high-speed AD conversion. Moreover, power consumption can be reduced; thus, heat generation from a circuit can be reduced and the influence of heat generation on the circuit itself, a peripheral circuit, and a module can be reduced.

[Video Camera]

The semiconductor device described in the above embodiment can be used for a video camera.

Figure 26I:
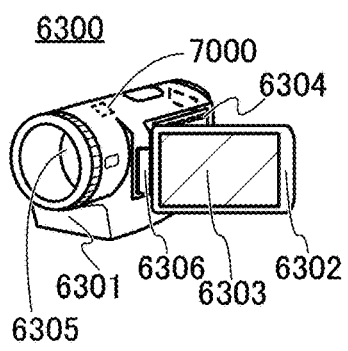

FIG. 26I illustrates a video camera 6300 as an example of an imaging device. The video camera 6300 includes a first housing 6301, a second housing 6302, a display portion 6303, operation switches 6304, a lens 6305, a joint 6306, and the like. The operation switches 6304 and the lens 6305 are provided in the first housing 6301, and the display portion 6303 is provided in the second housing 6302. The first housing 6301 and the second housing 6302 are connected to each other with the joint 6306, and an angle between the first housing 6301 and the second housing 6302 can be changed with the joint 6306. Images displayed on the display portion 6303 may be changed in accordance with the angle at the joint 6306 between the first housing 6301 and the second housing 6302.

Using the semiconductor device of one embodiment of the present invention for the video camera 6300 enables high-speed AD conversion. Moreover, power consumption can be reduced; thus, heat generation from a circuit can be reduced and the influence of heat generation on the circuit itself, a peripheral circuit, and a module can be reduced.

[ICD]

The semiconductor device described in the above embodiment can be employed for an implantable cardioverter-defibrillator (ICD).

Figure 26J:
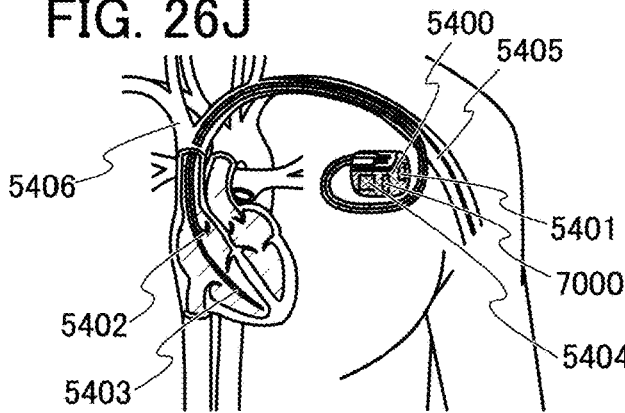

FIG. 26J is a schematic cross-sectional view illustrating an example of an ICD. An ICD main unit 5400 includes at least a battery 5401, the electronic component 7000, a regulator, a control circuit, an antenna 5404, a wire 5402 reaching a right atrium, and a wire 5403 reaching a right ventricle.

The ICD main unit 5400 is implanted in the body by surgery, and the two wires pass through a subclavian vein 5405 and a superior vena cava 5406 of the human body, with an end of one of the wires placed in the right ventricle and an end of the other wire placed in the right atrium.

The ICD main unit 5400 functions as a pacemaker and paces the heart when the heart rate is not within a predetermined range. In addition, when the heart rate is not recovered by pacing (e.g., when ventricular tachycardia or ventricular fibrillation occurs), treatment with an electrical shock is performed.

The ICD main unit 5400 needs to monitor the heart rate all the time in order to perform pacing and deliver electrical shocks as appropriate. For that reason, the ICD main unit 5400 includes a sensor for measuring the heart rate. In addition, in the ICD main unit 5400, data on the heart rate obtained by the sensor or the like, the number of times the treatment with pacing is performed, and the time taken for the treatment, for example, can be stored in the electronic component 7000.

In addition, the antenna 5404 can receive power, and the battery 5401 is charged with the power. Furthermore, when the ICD main unit 5400 includes a plurality of batteries, safety can be increased. Specifically, even when one of the batteries in the ICD main unit 5400 is dead, the other batteries can function properly; thus, the batteries also function as an auxiliary power source.

In addition to the antenna 5404 capable of receiving power, an antenna that can transmit physiological signals may be included to construct, for example, a system that monitors cardiac activity by checking physiological signals such as a pulse, a respiratory rate, a heart rate, and body temperature with an external monitoring device.

Using the semiconductor device of one embodiment of the present invention for the ICD main unit 5400 enables high-speed AD conversion. Moreover, power consumption can be reduced; thus, heat generation from a circuit can be reduced and the influence of heat generation on the circuit itself, a peripheral circuit, and a module can be reduced. Thus, the reliability of the ICD main unit 5400 can be improved.

[Computer]

Figure 27A:
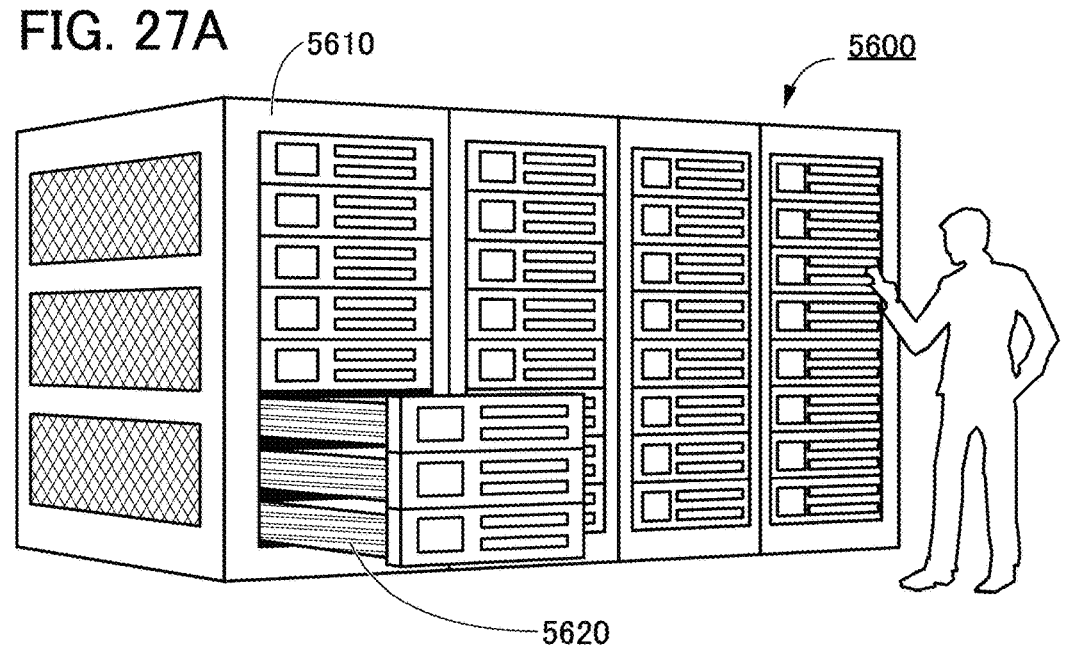
FIG. 27A to FIG. 27C are diagrams illustrating examples of electronic devices.

A computer 5600 illustrated in FIG. 27A is an example of a large computer. In the computer 5600, a plurality of rack mount computers 5620 are stored in a rack 5610.

Figure 27B:
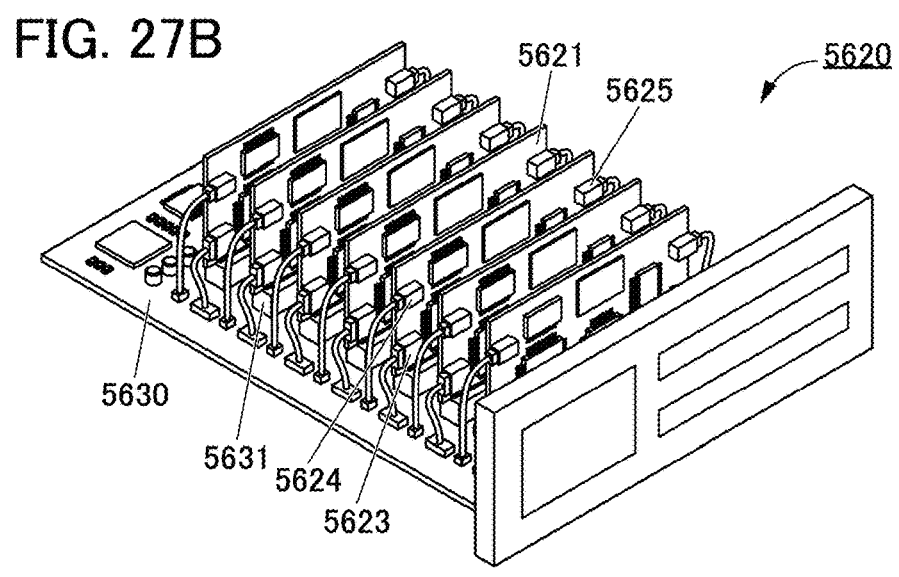

The computer 5620 can have a structure in a perspective view illustrated in FIG. 27B, for example. In FIG. 27B, the computer 5620 includes a motherboard 5630, and the motherboard 5630 includes a plurality of slots 5631 and a plurality of connection terminals. A PC card 5621 is inserted in the slot 5631. In addition, the PC card 5621 includes a connection terminal 5623, a connection terminal 5624, and a connection terminal 5625, each of which is connected to the motherboard 5630.

Figure 27C:
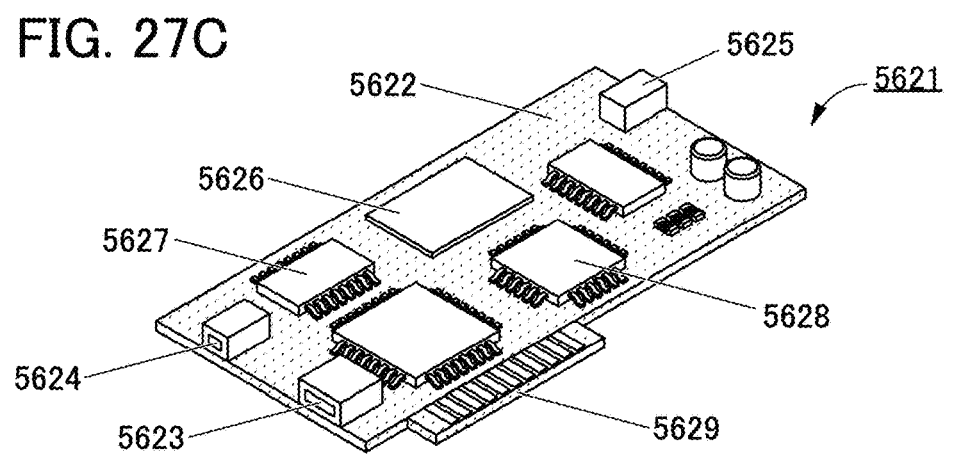

The PC card 5621 illustrated in FIG. 27C is an example of a processing board provided with a CPU, a GPU, a semiconductor device, and the like. The PC card 5621 includes a board 5622. In addition, the board 5622 includes a connection terminal 5623, a connection terminal 5624, a connection terminal 5625, a semiconductor device 5626, a semiconductor device 5627, a semiconductor device 5628, and a connection terminal 5629. Note that FIG. 27C also illustrates semiconductor devices other than the semiconductor device 5626, the semiconductor device 5627, and the semiconductor device 5628, the following description of the semiconductor device 5626, the semiconductor device 5627, and the semiconductor device 5628 is referred to for these semiconductor devices.

The connection terminal 5629 has a shape with which the connection terminal 5629 can be inserted in the slot 5631 of the motherboard 5630, and the connection terminal 5629 functions as an interface for connecting the PC card 5621 and the motherboard 5630. An example of the standard for the connection terminal 5629 is PCIe or the like.

The connection terminal 5623, the connection terminal 5624, and the connection terminal 5625 can serve as, for example, an interface for performing power supply, signal input, or the like to the PC card 5621. As another example, they can serve as an interface for outputting a signal calculated by the PC card 5621. Examples of the standard for each of the connection terminal 5623, the connection terminal 5624, and the connection terminal 5625 include USB (Universal Serial Bus), SATA (Serial ATA), SCSI (Small Computer System Interface), and the like. In the case where video signals are output from the connection terminal 5623, the connection terminal 5624, and the connection terminal 5625, an example of the standard therefor is HDMI (registered trademark) or the like.

The semiconductor device 5626 includes a terminal (not illustrated) for inputting and outputting signals, and when the terminal is inserted in a socket (not illustrated) of the board 5622, the semiconductor device 5626 and the board 5622 can be electrically connected to each other.

The semiconductor device 5627 includes a plurality of terminals, and when the terminals are reflow-soldered, for example, to wirings of the board 5622, the semiconductor device 5627 and the board 5622 can be electrically connected to each other. Examples of the semiconductor device 5627 include an FPGA (Field Programmable Gate Array), a GPU, a CPU, and the like. As the semiconductor device 5627, the electronic component 7000 can be used, for example.

The semiconductor device 5628 includes a plurality of terminals, and when the terminals are reflow-soldered, for example, to wirings of the board 5622, the semiconductor device 5628 and the board 5622 can be electrically connected to each other. An example of the semiconductor device 5628 is a semiconductor device or the like. As the semiconductor device 5628, the electronic component 7000 can be used, for example.

The computer 5600 can also function as a parallel computer. When the computer 5600 is used as a parallel computer, large-scale computation necessary for artificial intelligence learning and inference can be performed, for example.

The semiconductor device of one embodiment of the present invention is used in a variety of electronic devices or the like described above, so that a reduction in size, an increase in speed, or a reduction in power consumption of the electronic device can be achieved. In addition, since the semiconductor device of one embodiment of the present invention has low power consumption, heat generation from a circuit can be reduced. Accordingly, it is possible to reduce adverse effects of the heat generation on the circuit itself, a peripheral circuit, and a module. Thus, the reliability of the electronic devices can be increased.

This embodiment can be combined with the other embodiments described in this specification and the like as appropriate.

EXAMPLE

Figure 28:
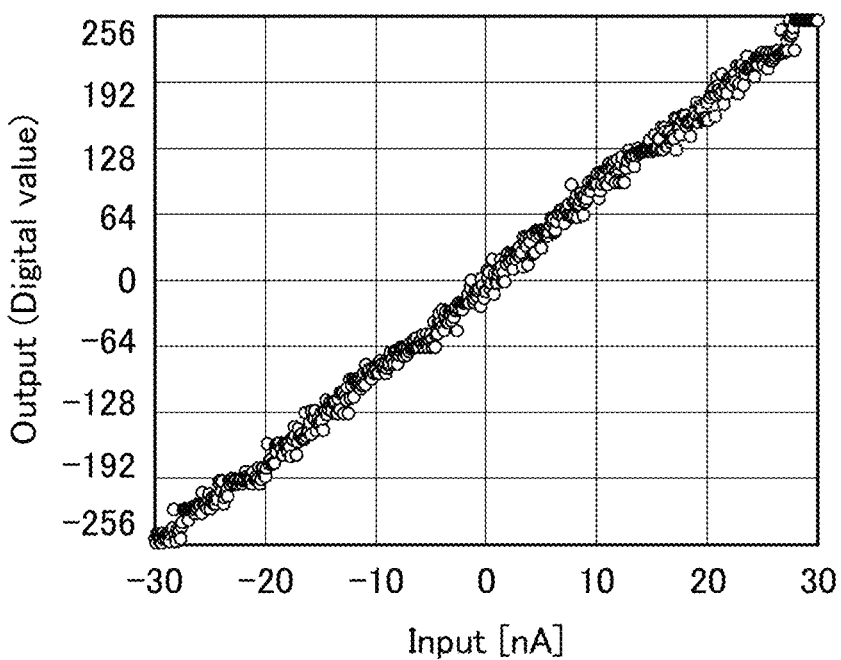
FIG. 28 is a measurement result of the input/output characteristics of an AD converter.

The AD converter 100 disclosed in the above embodiment was prototyped, and the input/output characteristics were measured. FIG. 28 shows the measurement results of the input/output characteristics. In FIG. 28, the horizontal axis represents a current input to the AD converter 100 (the differential current between the current Ia and the current Ib), and the vertical axis represents an output corresponding to the input current (digital value).

It is found from FIG. 28 that the current values from −30 nA to 30 nA are converted into digital values from −256 to 256 in a linear manner. It was found from FIG. 28 that the AD converter 100 of one embodiment of the present invention was capable of converting a minute current into 8-bit digital data to which a sign bit was added.

REFERENCE NUMERALS

100: AD converter, 110: comparison portion, 112: terminal, 113: terminal, 114: terminal, 115: terminal, 116: terminal, 117: terminal, 120: control portion, 121: sign generation portion, 122: digital signal generation portion, 130: DA conversion portion, 190: AD converter, 195: arithmetic portion This application is based on Japanese Patent Application Serial No. 2020-131717 filed on Aug. 3, 2020, Japanese Patent Application Serial No. 2020-219739 filed on Dec. 29, 2020, Japanese Patent Application Serial No. 2021-017033 filed on Feb. 5, 2021, and Japanese Patent Application Serial No. 2021-095086 filed on Jun. 7, 2021, the entire contents of each are hereby incorporated herein by reference.

The invention claimed is:

1. A semiconductor device comprising:
a current comparator having a first input terminal, a second input terminal, and an output terminal;

a first DA converter (Digital to Analog converter) having an output terminal electrically connected to the first input terminal of the current comparator;
a second DA converter having an output terminal electrically connected to the second input terminal of the current comparator; and
a control portion electrically connected to the output terminal of the current comparator, the first DA converter, and the second DA converter,
wherein the current comparator is configured to compare a value of a first current flowing to the first input terminal with a value of a second current flowing to the second input terminal and supply one of a first potential and a second potential as an output signal to the output terminal of the current comparator,
wherein the control portion is configured to generate a digital signal and a sign bit in accordance with the output signal, supply the digital signal to the first DA converter and the second DA converter, and generate a signed digital signal by adding the sign bit and the digital signal,
wherein the first DA converter is configured to flow a third current in accordance with the digital signal to the first input terminal of the current comparator, and
wherein the second DA converter is configured to flow a fourth current in accordance with the digital signal to the second input terminal of the current comparator.

2. The semiconductor device according to claim 1, wherein when the value of the first current is larger than the value of the second current, the sign bit is one of "0" and "1", and
wherein when the value of the first current is less than or equal to the value of the second current, the sign bit is the other of "0" and "1".

3. The semiconductor device according to claim 1, wherein the sign bit is a 1-bit digital value.

4. The semiconductor device according to claim 1, wherein the digital signal is determined in accordance with a difference between the value of the first current and the value of the second current.

5. The semiconductor device according to claim 1, wherein the digital signal has a digital value greater than or equal to 8 bits and less than or equal to 16 bits.

6. The semiconductor device according to claim 1, wherein the control portion is configured to be a successive approximation AD register.

7. The semiconductor device according to claim 1, wherein the semiconductor device is configured to use a linear ramp function (ReLu function).

8. A display apparatus comprising a pixel portion and a peripheral circuit,
wherein the pixel portion comprises a plurality of pixels,
wherein the peripheral circuit comprises at least a gate driver circuit and an AD converter circuit, and
wherein the AD converter circuit comprises the semiconductor device according to claim 1.

9. A semiconductor device comprising:
a current comparator having a first input terminal, a second input terminal, and an output terminal;
a first DA converter (Digital to Analog converter) having an output terminal electrically connected to the first input terminal of the current comparator;
a second DA converter having an output terminal electrically connected to the second input terminal of the current comparator; and a control portion electrically connected to the output terminal of the current comparator, the first DA converter, and the second DA converter, wherein the current comparator is configured to compare a value of a first current flowing to the first input terminal with a value of a second current flowing to the second input terminal and supply one of a first potential and a second potential as an output signal to the output terminal of the current comparator, wherein the control portion is configured to generate a digital signal and a sign bit in accordance with the output signal, supply the digital signal to the first DA converter and the second DA converter, generate a signed digital signal by combining the digital signal and the sign bit, and output the signed digital signal, wherein the first DA converter is configured to flow a third current in accordance with the digital signal to the first input terminal of the current comparator, and wherein the second DA converter is configure to flow a fourth current in accordance with the digital signal to the second input terminal of the current comparator.

10. The semiconductor device according to claim 9, wherein when the value of the first current is larger than the value of the second current, the sign bit is one of "0" and "1", and wherein when the value of the first current is less than or equal to the value of the second current, the sign bit is the other of "0" and "1".

11. The semiconductor device according to claim 9, wherein the sign bit is a 1-bit digital value.

12. The semiconductor device according to claim 9, wherein the digital signal is determined in accordance with a difference between the value of the first current and the value of the second current.

13. The semiconductor device according to claim 9, wherein the digital signal has a digital value greater than or equal to 8 bits and less than or equal to 16 bits.

14. The semiconductor device according to claim 9, wherein the control portion is configured to be a successive approximation AD register.

15. The semiconductor device according to claim 9, wherein the semiconductor device is configured to use a linear ramp function (ReLu function).

16. A display apparatus comprising a pixel portion and a peripheral circuit, wherein the pixel portion comprises a plurality of pixels, wherein the peripheral circuit comprises at least a gate driver circuit and an AD converter circuit, and wherein the AD converter circuit comprises the semiconductor device according to claim 9.

* * * * *